United States Patent
Kawai et al.

(10) Patent No.: US 7,869,717 B2
(45) Date of Patent: Jan. 11, 2011

(54) OPTICAL COMMUNICATION LIGHT SOURCE UNIT AND WAVELENGTH MONITORING CONTROL METHOD

(75) Inventors: Shingo Kawai, Chiba (JP); Kiyoshi Matsumoto, Chiba (JP); Hideo Kawata, Tokyo (JP); Naoto Yoshimoto, Chiba (JP); Katsumi Iwatsuki, Kanagawa (JP)

(73) Assignee: Nippon Telegraph and Telephone Corporation, Tokyo (JP)

( * ) Notice: Subject to any disclaimer, the term of this patent is extended or adjusted under 35 U.S.C. 154(b) by 1030 days.

(21) Appl. No.: 11/568,109

(22) PCT Filed: Feb. 2, 2006

(86) PCT No.: PCT/JP2006/301803
§ 371 (c)(1),
(2), (4) Date: Oct. 19, 2006

(87) PCT Pub. No.: WO2006/098094
PCT Pub. Date: Sep. 21, 2006

(65) Prior Publication Data
US 2009/0161708 A1 Jun. 25, 2009

(30) Foreign Application Priority Data
Mar. 16, 2005 (JP) .............................. 2005-075245
Aug. 17, 2005 (JP) .............................. 2005-236375

(51) Int. Cl.
*H04B 10/04* (2006.01)
*H01S 3/13* (2006.01)
(52) U.S. Cl. .................. 398/182; 398/192; 398/196; 398/197; 398/201; 372/29.01; 372/29.02; 372/34
(58) Field of Classification Search ......... 398/182–201; 372/20–36, 50

See application file for complete search history.

(56) References Cited

U.S. PATENT DOCUMENTS

| 5,077,748 A | 12/1991 | Kozlovsky et al. ............ 372/22 |
| 5,982,794 A | 11/1999 | Tamura |
| 6,393,041 B1 | 5/2002 | Sato |
| 6,580,531 B1 * | 6/2003 | Swanson et al. ............... 398/5 |
| 6,590,686 B1 | 7/2003 | Sekiya et al. |
| 6,885,685 B2 | 4/2005 | Hidaka et al. |
| 6,947,457 B2 | 9/2005 | Iida |
| 7,061,950 B2 | 6/2006 | Hongo et al. |
| 7,460,572 B2 | 12/2008 | Kawai et al. |
| 7,564,881 B2 | 7/2009 | Chang |
| 2001/0036211 A1 | 11/2001 | Iida |
| 2002/0150131 A1 * | 10/2002 | Tsukiji et al. ................. 372/34 |
| 2002/0190666 A1 | 12/2002 | Sakamoto et al. |
| 2002/0196595 A1 | 12/2002 | Ciancio |
| 2003/0012244 A1 * | 1/2003 | Krasulick et al. ............. 372/50 |
| 2003/0174746 A1 | 9/2003 | Lano et al. |
| 2004/0008995 A1 * | 1/2004 | Ono et al. .................... 398/182 |
| 2004/0028099 A1 | 2/2004 | Hongo et al. |
| 2004/0032889 A1 | 2/2004 | Hidaka et al. |
| 2004/0264518 A1 | 12/2004 | Chang |
| 2006/0145051 A1 * | 7/2006 | Kawai et al. ............. 250/201.1 |

FOREIGN PATENT DOCUMENTS

| EP | 0 920 095 A2 | 6/1999 |
| EP | 1345296 A1 | 9/2003 |
| EP | 1624543 A1 | 2/2006 |
| JP | 04-324688 | 11/1992 |
| JP | 10-178240 | 6/1998 |
| JP | 2001-230489 | 8/2001 |
| JP | 2003-086889 | 3/2003 |
| JP | 2003-124885 | 4/2003 |
| JP | 2003-224326 | * 8/2003 |
| JP | 2004-061556 | 2/2004 |
| WO | 2004-102754 A1 | 11/2004 |
| WO | WO 2004/102754 | * 11/2004 |

OTHER PUBLICATIONS

"Power Source™ Tunable High Power CW Laser Module with Integrated Wavelength Monitoring" [online], Avanex, Inc. (searched on Jul. 23, 2004).

Takagi et al., 25GHz-spacing interval wavelength monitor integrated DBF laser moduel: Proceeding of the 2002 IEICE General Conference No. C-4-44 p. 349 (2002).

Ave Zadok et al., Spectral shift and broadening of DFB laser under direct modulation, IEEE photon, Technol. Lett., vol. 10, No. 12 pp. 1709-1711, 1998.

ITU-T recommendation, G959.1, (Feb. 2001).

Japanese Publication No. 04-324688 corresponds to U.S. Patent Application No. 5,077,748.

European Search Report for corresponding European application 08018484.9-2222 lists the references above.

European Search Report for corresponding European application 06712946.0-2222 lists the references above.

Canadian office action for corresponding Canadian application No. 2560143 lists the references above.

European search report for corresponding European application 09014056.7 lists the references above.

* cited by examiner

*Primary Examiner*—Li Liu
(74) *Attorney, Agent, or Firm*—DLA Piper LLP (US)

(57) ABSTRACT

In the present invention, the extremely complicated setting and control and an extremely expensive optical component (wavelength locker) are not required, and optical output wavelength and optical output power can simply be set and controlled at a moderate price. At least one value for determining a dependence of the optical output wavelength on drive current and device temperature and at least one value for determining a dependence of the optical output power on drive current and device temperature in a light emitting device constituting first means 1 for emitting light are stored in fourth means 4. Fifth means 5 determines drive current or optical output power c and device temperature d, at which both the optical output wavelength and optical output power of the light emitting device are separately specified value b, from a relationship among the drive current, device temperature, and optical output wavelength of the light emitting device, the relationship being determined by the at least one value, and a relationship among the drive current, device temperature, and optical output power, the relationship being determined by the at least one value, and the fifth means 5 gives the drive current or optical output power c and device temperature d as target values to second means 2 and third means 3.

60 Claims, 27 Drawing Sheets

(a)

(b)

(c)

OPTICAL COMMUNICATION LIGHT SOURCE UNIT AND WAVELENGTH MONITORING CONTROL METHOD

TECHNICAL FIELD

The present invention relates to an optical communication light source unit which can set and control both optical output wavelength and optical output power at specified values, a method of controlling the optical communication light source unit, a method of selecting measuring points of optical output wavelength characteristics and optical output power characteristics of a light emitting device, the optical output wavelength characteristics and optical output power characteristics being used in setting and controlling the optical output wavelength and optical output power in the optical communication light source unit, a direct modulation type optical communication light source unit which sets and controls the optical output wavelength, optical output power, and RF amplitude at a specified value, and a method of selecting the measuring points of the optical output wavelength characteristics, optical output power characteristics, and RF amplitude characteristics of the light emitting device, the optical output wavelength characteristics, optical output power characteristics, and RF amplitude characteristics being used insetting and controlling the optical output wavelength, optical output power, and RF amplitude in the direct modulation type optical communication light source unit.

BACKGROUND ART

Recently, a broadband internet connection environment progresses rapidly. Along with this progress, it is necessary to further increase transmission capacity of a network in the whole area from a core system to an access system or metropolitan area system. Therefore, a large-capacity network in which optical communication technology is utilized is actively developed.

In the optical communication light source unit, the light emitting device such as a laser diode (LD) is used to convert an electric signal into an optical signal. At this point, in order to secure the normal optical communication, it is necessary that the optical output wavelength and optical output power of each light emitting device constituting a light source unit should be set at values determined according to determined optical wavelength arrangement and optical transmission path loss while controlled so as to be maintained at the values. The optical output wavelength and optical output power of each light emitting device depend on the drive current and device temperature, and are uniquely determined in a normal operating range.

In the conventional technique, the setting and control of the optical output wavelength and optical output power at the determined values are realized by the use of a combination of means for automatically controlling the device temperature, means for automatically controlling the optical output power, and means (wavelength locker) for automatically controlling the optical output wavelength.

However, the wavelength locker is extremely expensive, and the extremely complicated setting and control are required, which becomes large barriers to application to the access system or metropolitan area system in which low cost and simplification are required.

Non-Patent Document 1 describes an example of the conventional method of setting the optical output wavelength and optical output power of the light emitting device such as LD. The outline of Non-Patent Document 1 will be described below.

FIG. 1 shows a configuration example of the conventional optical communication light source unit.

The optical communication light source unit includes a light emitting device 11, means 12 for automatically controlling the optical output power of light g from light emitting device 11 such that the optical output power is maintained at a given target value, means 13 for automatically controlling the device temperature of the light emitting device 11 such that the device temperature is maintained at a given target value, means 14 for branching the light from the light emitting device 11, and means (wavelength locker) 15 for automatically controlling the optical output wavelength of the branched light h such that the optical output wavelength is maintained at a given target value. In the light source unit, the setting and control of the optical output wavelength and optical output power of the light emitting device 11 are performed as follows.

In the wavelength locker 15, as shown in FIG. 2(b), photocurrent Im generated by detecting the light is periodically changed for the optical output wavelength λ. In the conventional technique, the setting and control of the optical output wavelength are performed by utilizing the characteristics of the photocurrent Im.

Specifically, the device temperature is coarsely adjusted using the means 13 for automatically controlling the device temperature such that the device temperature is maintained at a given target value as shown in FIG. 2(a), and thereby the optical output wavelength λ is put in a pull-in range 25 shown in FIG. 2(b) corresponding to optical output separately specified wavelength λs of the wavelength locker 15. Then, the means 12 for automatically controlling the optical output power such that the optical output power is maintained at a given target value is simultaneously operated to set and control the optical output power at the separately specified value while the optical output wavelength is maintained in the pull-in range 25. Finally, the wavelength locker 15 and the means 13 for automatically controlling the device temperature such that the device temperature is maintained at a given target value are simultaneously operated while the control target value of the means 12 for automatically controlling the optical output power such that the optical output power is maintained at a given target value is fixed to the specified value.

At this point, the optical output wavelength λ is precisely adjusted to the specified value by finely adjusting the photocurrent generated in the wavelength locker 15 to the value corresponding to the separately specified optical output wavelength λs.

Thus, in the conventional technique, because the setting and control of the optical output wavelength and optical output power of the light emitting device 11 are performed while divided in plural steps, the setting and control become extremely complicated, and the extremely expensive wavelength locker 15 is required.

Even if the optical output wavelength is precisely adjusted to the specified value, the optical output power is fluctuated due to aged deterioration and the like when the light emitting device is continuously used for a long time. Means for automatically controlling the optical output power (Automatic Power Control Circuit: APC) is activated in association with the fluctuation in optical output power. As a result, the drive current of each light emitting device is also fluctuated such that the optical output power is maintained at the determined value. This causes the optical output wavelength of each light emitting device to be fluctuated outside an allowable range of the determined optical wavelength arrangement.

In the conventional optical communication light source unit shown in FIG. 1, the following control is performed against the aged deterioration of the light emitting device. That is, in the wavelength locker 15, the photocurrent Im generated by the detection of the light is periodically changed for the optical output wavelength λ as shown in FIG. 2(b), so that the optical output wavelength is controlled by utilizing the characteristics of the photocurrent Im. Non-Patent Document 2 describes an example of the conventional method of controlling the optical output wavelength and optical output power of the light emitting device such as LD.

Specifically, the wavelength locker 15 and the means 13 for automatically controlling the device temperature such that the device temperature is maintained at a given target value are simultaneously operated while the control target value of the means 12 for automatically controlling the optical output power such that the optical output power is maintained at a given target value is fixed to the specified value. Therefore, when the optical output power of the light emitting device 11 is fluctuated, the means 12 for automatically controlling the optical output power such that the optical output power is maintained at a given target value is operated to change the drive current of the light emitting device 11 such that the optical output power becomes the control target value. The change in drive current changes the optical output wavelength and device temperature of the light emitting device 11. As a result, the wavelength locker 15 and the means 13 for automatically controlling the device temperature such that the device temperature is maintained at a given target value are operated to return the optical output wavelength to the specified value, and control the device temperature such that the device temperature is maintained according to the drive current in the optical output power fluctuation.

Non-Patent Document 1: "Power Source™ Tunable High Power CW Laser Module with Integrated Wavelength Monitoring", [online], Avanex, Inc., [search on Jul. 23, 2004], the Internet TLI.APP.pdf>

Non-Patent Document 2: Proceedings of the 2002 Institute of Electronics, Information, and Communication Engineers General Conference No. C-4-44, Takagi, et al. "25 GHz-spacing interval wavelength monitor integrated DFB laser module" P. 349 (2002)

Non-Patent Document 3: A. Zadok, et al. "Spectral shift and broadening of DFB lasers under direct modulation", IEEE Photon. Technol. Lett., Vol. 10, No. 12, pp. 1709-1711, 1998

Non-Patent Document 4: ITU-T recommendation, G959. 1, 2001

SUMMARY OF THE INVENTION

Disclosure of the Invention

As described above, in the conventional technique, because the setting and control of the optical output wavelength and optical output power of the light emitting device are performed while divided in plural steps, the setting and control become extremely complicated, and the extremely expensive wavelength locker is indispensable. However, there is a problem that the extremely expensive wavelength locker and the extremely complicated setting and control become large barriers to the application to the access system or metropolitan area system in which low cost and simplification are required.

Therefore, in order to solve the problem, a first object of the invention is to provide an optical communication light source unit in which the extremely complicated setting and control and the extremely expensive optical component (wavelength locker) are not required and both the optical output wavelength and optical output power are simply set and controlled at a moderate price, and a method of controlling the optical output wavelength and optical output power thereof.

A second object of the invention is to provide an optical communication light source unit in which the extremely complicated control and the extremely expensive optical component (wavelength locker) are not required and both the optical output wavelength and optical output power are simply controlled at a moderate price, and a method of controlling the optical output wavelength and optical output power thereof.

In the case where the application of the optical communication light source unit to the access system or metropolitan area system is considered, a direct modulation type optical communication light source unit is required due to the miniaturization and price reduction by decreasing the number of components. In the direct modulation type optical communication light source unit, a direct modulating RF signal is superposed onto the drive current and applied to the light emitting device. In the signal light directly modulated by the RF signal, the optical output wavelength is shifted and signal light spectrum is spread when compared with CW (continuous light) (see Non-Patent Document 3). Therefore, in setting and controlling the optical output wavelength and optical output power of the direct modulation type optical communication light source unit, it is necessary to store the relationship among the drive current, device temperature, and optical output wavelength during the direct modulation and the relationship among the modulation drive current, device temperature, and optical output power during the direct modulation.

For the signal light generated by the optical communication light source unit, requirements for the extinction ratio and the eye mask are provided to secure the normal communication. Non-Patent Document 4 describes the requirement (at least 8.2 dB) for the extinction ratio and the eye mask requirement defined by the transmission rate and format. The extinction ratio and eye mask of the signal light are determined by the relationship among the drive current, RF amplitude, and device temperature which are applied to the light emitting device. Accordingly, in the optical communication light source unit, in order to satisfy the above requirement, the RF amplitude is controlled at a constant value by an automatic bias control circuit (ABC) such that the extinction ratio and eye mask of the desired signal light are obtained for the drive current and device temperature.

However, the drive current is fluctuated by the aged deterioration of the light emitting device, or the target values of the drive current and device temperature become different by the setting value of the optical output wavelength. Therefore, the extinction ratio and eye mask of the signal light are not always satisfied only when the RF amplitude is controlled at a constant value.

FIG. 25 shows a measurement example of eye patterns when the DFB-LD butterfly module is directly modulated at 2.5 Gbps. The RF amplitude and the device temperature are kept constant during the measurement. When the drive current becomes lower than a proper value (FIG. 25(b)), the RF amplitude becomes excessively large for the drive current, the signal light waveform is disturbed, and there is a fear that the light emitting device is broken (FIG. 25(a)). On the other hand, when the drive current becomes larger than the proper value, the modulation is not sufficiently performed by RF, so that the sufficient eye opening satisfying the desired extinction ratio and eye mask requirement is not obtained (FIG. 25(c)). In the case where a ratio of the RF amplitude to the drive current is controlled at a constant value, the attitude in the case of the excessively small RF amplitude is similar although the device breakage by the excessive RF is not generated.

There has been studied no direct modulation type optical communication light source unit which can set and control the optical output wavelength and optical output power and satisfy the predetermined extinction ratio and eye mask requirement in the operating ranges of the specified drive current and device temperature of the light emitting device.

In order to solve the problem, a third object of the invention is to provide a direct modulation type optical communication light source unit which sets and controls the optical output wavelength and optical output power and satisfies the predetermined extinction ratio and eye mask requirement in the operating ranges of the specified drive current and device temperature of the light emitting device, and a method of selecting the measuring point such that the estimated errors of the optical output wavelength, optical output power, and RF amplitude are decreased in the direct modulation type optical communication light source unit.

Means for Solving Problem

First optical communication light source unit for achieving the first object and a method of controlling the optical output wavelength and optical output power thereof will be described below.

The first aspect of the invention utilizes the following characteristics concerning the optical output wavelength and optical output power of the light emitting device such as LD.

As shown in FIG. 3(a), dependence of the optical output wavelength $\lambda$ on drive current i and dependence of the optical output wavelength $\lambda$ on device temperature T are monotonously decreased for both the drive current i and the device temperature T in the normal operating range. As shown in FIG. 3(b), in the normal operating range, dependence of the optical output power Pw on the drive current i and dependence of the optical output power Pw on the device temperature T are monotonously increased for the drive current i, and are monotonously decreased for the device temperature T.

Accordingly, when the optical output wavelength operated in the normal operating range is specified, orthogonal projection of an optical output wavelength contour line 35 satisfying the operating condition to a (drive current-device temperature) coordinate surface becomes one open curved which is declined rightward (monotonous decrease) in the range as shown by a bold solid line in FIG. 3(a).

Similarly, when the optical output power operated in the normal operating range is specified, the orthogonal projection of an optical output power contour line 37 satisfying the operating condition to a (drive current-device temperature) coordinate surface becomes one open curved which is increased rightward (monotonous increase) in the range as shown by a bold broken line in FIG. 3(b).

Therefore, as shown in FIG. 3(c), the two open curves intersect at one point in the normal operating range. Accordingly, a coordinate value (drive current and device temperature) of the intersection point is uniquely determined, and the coordinate value is the drive current and device temperature at which both the optical output wavelength and the optical output power become specified values.

Thus, in the present invention, the intersection point of the isoplethic curves (two open curves) concerning the optical output wavelength characteristics and optical output power characteristics of each light emitting device is determined directly and uniquely by utilizing the "monotonous" optical output wavelength characteristics and optical output power characteristics. The intersection point is used as a target values (target value "it" for the drive current in automatic control and target value Tt for the device temperature in the automatic control) in automatically controlling the operating conditions (the drive current or optical output power and the device temperature) of each light emitting device. The first aspect of the invention also relates to a configuration and an operating procedure for realizing the determination of the intersection point and the use of the intersection point as the target value.

Specifically, means in which at least one value of the optical output wavelength for the drive current and device temperature, at least one value concerning these three, or at least one parameter for determining a relationship among these three as information necessary to determine the dependence of the optical output wavelength on the drive current and device temperature and at least one value of the optical output power for the drive current and device temperature, at least one value concerning these three, or at least one parameter for determining a relationship among these three as information necessary to determine the dependence of the optical output power on the drive current and device temperature are stored is provided in the optical communication light source unit.

Furthermore, means for determining the drive current or optical output power and the device temperature at which both the optical output wavelength and the optical output power of the light emitting device become the specified values is provided in the optical communication light source unit. The means determines the parameter value for determining the dependence of the optical output wavelength on the drive current and device temperature using at least one value previously stored in the optical communication light source unit. Similarly, the parameter value for determining the dependence of the optical output power on the drive current and device temperature is determined using at least one value previously stored in the optical communication light source unit. The coordinate value (drive current and device temperature) of the intersection point is computed using the parameter values. The drive current or optical output power and the device temperature, at which both the optical output wavelength and the optical output power of the light emitting device become the specified values, are determined from the coordinate value (drive current and device temperature).

The drive current or optical output power and the device temperature determined in the above-described manner are given as the target values to the means for automatically controlling the drive current or optical output power and the means for automatically controlling the device temperature.

When compared with the conventional technique, the optical output wavelength and optical output power are set and controlled in the above-described manner, which allows the complicated setting procedure to be eliminated to significantly simplify the setting and control. The extremely expensive optical components such as the wavelength locker are also not required, so that, for example, the optical communication light source unit can be composed of an extremely inexpensive microprocessor a price of which is hundreds yen or a dedicated small-size LSI in which unit cost becomes reasonable in mass production. Therefore, according to the first aspect of the invention, the miniaturization and the cost reduction can simultaneously be realized.

The first optical communication light source unit can provide the optical communication light source unit, in which the complicated setting and control and the extremely expensive optical components (wavelength locker) are not required and both the optical output wavelength and the optical output power are simply set and controlled at moderate price. The first optical communication light source unit can sufficiently be applied to the access system or metropolitan area system in which the low cost and the simplification are required.

Then, second optical communication light source unit for achieving the second object and a method of controlling the optical output wavelength and optical output power thereof will be described.

The characteristics concerning the optical output wavelength and optical output power of the light emitting device such as LD as described in the first optical communication light source unit and the method of controlling the optical output wavelength and optical output power thereof are utilized as the light emitting device characteristics before optical output power fluctuation. In the description of the second optical communication light source unit, FIGS. 3(a), 3(b), and 3(c) used in the description of the first optical communication light source unit correspond to FIGS. 10(a), 10(b), and 10(c).

Then, the light emitting device characteristics in the optical output power fluctuation will be described.

FIGS. 11(a) and 11(b) show the dependence of the optical output wavelength on the drive current and device temperature and the dependence of the optical output power on the drive current and device temperature at that time. Similarly to the characteristics before optical output power fluctuation, the characteristics in the optical output power fluctuation are monotonous. However, the characteristics in the optical output power fluctuation differ from the characteristics before optical output power fluctuation only in that the dependence of the optical output power on the drive current and device temperature is moved in parallel according to the increase and decrease in drive current.

As a result, as shown in FIG. 11(c), the orthogonal projection of an optical output power contour line 237 which becomes the specified optical output power to the (drive current-device temperature) coordinate surface is also moved in parallel according to the increase and decrease in drive current, and the coordinate surface moved in parallel intersects with an optical output wavelength contour line 235 at one point in the normal operating range. Accordingly, similarly to the characteristics before optical output power fluctuation, the drive current and device temperature at which both the optical output wavelength and the optical output power become the specified value are uniquely determined.

FIG. 12 shows an example of the target values of the drive current and device temperature in both the case where the drive current is increased and the case where the drive current is decreased.

Thus, in the present invention, the intersection point of the isoplethic curves (two open curves) in the optical output power fluctuation is determined directly and uniquely by utilizing the followings: (1) both the light emitting device characteristics concerning the optical output wavelength and optical output power before the optical output power fluctuation and that at the time of the optical output power fluctuation are "monotonous" and (2) the light emitting device characteristics concerning the optical output power before the optical output power fluctuation is well expressed when the light emitting device before the optical output power fluctuation is moved in parallel according to the increase and decrease in the drive current. And the intersection point is used as the new target values in automatically adjusting and controlling the operating conditions (the drive current or optical output power and the device temperature) of the light emitting device. The second aspect of the invention relates to a configuration and an operating procedure for realizing the determination of the intersection point and the use of the intersection point as the target value.

Specifically, means in which at least one value of the optical output wavelength for the drive current and device temperature, at least one value concerning these three, or at least one parameter for determining a relationship among these three as information necessary to determine the dependence of the optical output wavelength on the drive current and device temperature, and at least one value of the optical output power for the drive current and device temperature, at least one value concerning these three, or at least one parameter for determining a relationship among these three as information necessary to determine the dependence of the optical output power on the drive current and device temperature are stored is provided in the optical communication light source unit.

Then, means for monitoring the drive current of the light emitting device is monitored to make comparison determination whether or not the drive current is located in a specific allowable fluctuation range, the means predicting the dependence of the optical output power on the drive current and device temperature in the drive current fluctuation of the light emitting device based on the comparison determination result, is provided in the optical communication light source unit.

Furthermore, means for determining the drive current and device temperature at which both the optical output wavelength and the optical output power in the drive current fluctuation of the light emitting device become the specified values is provided in the optical communication light source unit. The means determines the parameter value for determining the dependence of the optical output wavelength on the drive current and device temperature using at least one value previously stored in the optical communication light source unit. The coordinate value (drive current and device temperature) of the intersection point is computed in the drive current fluctuation using this parameter value and the parameter value for determining the dependence of the optical output power on the drive current and device temperature in the drive current fluctuation, which is computed by the above prediction means. The new target values of the drive current and device temperature, at which both the optical output wavelength and the optical output power of the light emitting device become the specified values, are determined from the coordinate value (drive current and device temperature).

The drive current and device temperature determined in the above-described manner are given as the target values to the means for automatically controlling the drive current and the means for automatically controlling the device temperature, which are provided in the optical communication light source unit. Therefore, the optical output wavelength and optical output power of the light emitting device are adjusted and controlled so as to be maintained at the specified values.

When compared with the conventional technique, the optical output wavelength and optical output power are adjusted and controlled in the above-described manner, which allows the complicated controlling procedure to be eliminated to significantly simplify the control. The extremely expensive optical components such as the wavelength locker are also not required, so that for example, the optical communication light source unit can be composed of an extremely inexpensive microprocessor a price of which is hundreds yen or a dedicated small-size LSI in which the unit cost becomes reasonable in mass production. Therefore, according to the second aspect of the invention, the miniaturization and the cost reduction can simultaneously be realized.

According to the second optical communication light source unit, the complicated adjustment and control and the extremely expensive optical components (the wavelength locker) are not required, and the automatic adjustment and control can simply be performed automatically at a moderate price such that both the optical output wavelength and the optical output power become the specified values. The second optical communication light source unit can sufficiently be applied to the access system or metropolitan area system in which the low cost and the simplification are required. Particularly, the communication light source unit according to the second aspect of the invention is suitable to a light source unit applied to dense wavelength division multiplexing (DWDM) communication in which high stabilization is required to the optical output wavelength for a long term.

As described above, both the configurations of the first optical communication light source unit and the second optical communication light source unit are characterized in that the "monotonous" characteristics are estimated concerning the optical output wavelength and optical output power of each light emitting device using the rule stored in the "means in which at least one value of the optical output wavelength for the drive current and device temperature, at least one value concerning these three, or at least one parameter for determining a relationship among the optical output wavelength, drive current, and device temperature, and at least one value of the optical output power for the drive current and device temperature, at least one value concerning these three, or at least one parameter for determining a relationship among these three as information necessary to determine the dependence of the optical output power on the drive current and device temperature are stored" (hereinafter referred to as storage means).

In the first optical communication light source unit and the second optical communication light source unit, estimated errors of the optical output wavelength and optical output power depends on selecting measuring points (drive current and device temperature) of the optical output wavelength characteristics and optical output power characteristics of the light emitting device, which are stored in the storage means. The optical output wavelength characteristics and optical output power characteristics differ from one another in each light emitting device, so that the operating ranges of the drive current and device temperature differ from one another in each light emitting device.

Therefore, in the operating ranges of the specified drive current and device temperature of the light emitting device, preferably the first optical communication light source unit or the second optical communication light source unit has a selection circuit which selects the measuring points so as to decrease the estimated errors of the optical output wavelength and optical output power.

The method of selecting the measuring points of the optical output wavelength and optical output power stored in the optical communication light source unit will be described below in the selection circuit.

In the invention, when the optical output wavelength characteristics of the light emitting device such as LD are considered, the optical output wavelength characteristics are considered up to a second-order term for the drive current and device temperature in a three-dimensional space having coordinate axes of the drive current, device temperature, and optical output wavelength (the optical output wavelength characteristics are expressed by the quadratic function of the drive current and device temperature). Similarly, when the optical output power characteristics of the light emitting device are considered, the optical output power characteristics are considered up to a second-order term for the drive current and device temperature in a three-dimensional space having coordinate axes of the drive current, device temperature, and optical output power (the optical output power characteristics are expressed by the quadratic function of the drive current and device temperature).

In actually setting and controlling the optical output wavelength and optical output power, the optical output wavelength characteristics of the light emitting device are approximated by a plane (linear function of the drive current and device temperature), and the optical output power characteristics of the light emitting device are also approximated by a plane (linear function of the drive current and device temperature). In approximating the optical output wavelength characteristics of the light emitting device by the plane, when the three measuring points exist for each light emitting device, a coefficient of the linear function expressing the optical output wavelength characteristics can be computed.

Accordingly, the measuring point selection method according to the invention can come down to a question in which each two of the drive current and device temperature are selected such that the difference between the actual optical output wavelength characteristics and the optical output wavelength characteristics approximated by the plane is decreased in the operating range on the (drive current-device temperature) coordinate surface. The same holds for the optical output power characteristics of the light emitting device.

The selection of the measuring point in consideration of the optical output wavelength characteristics of the light emitting device will be described with reference to FIG. 19. At this point, when the drive current and device temperature are selected, the question will be discussed while one of them is fixed.

FIG. 19(a) shows the dependence of the optical output wavelength characteristics on the drive current when the device temperature is fixed to a value located in the operating range. The reference numerals $i_1$ and $i_2$ designate a minimum value and a maximum value of the drive current i in the operating range respectively. The actual optical output wavelength characteristics are expressed by a drive current quadratic function, and the approximate line is expressed by a drive current linear function. As described above, the optical output wavelength is monotonously decreased for the drive current.

The operating range ($i_1 \leq i \leq i_2$) of the drive current i is internally divided by p:1-p and 1-p:p to determine drive currents $i_{s1}$ and $i_{s2}$ at the internally dividing points using an arbitrary value p (p is a specific coordinate of an internally dividing point in the drive current operating range, and p is a real number satisfying 0<p<1). When the approximate error of the optical output wavelength is expressed by $\delta\lambda_0$, as can be seen from FIG. 19, $\delta\lambda_0$ becomes the maximum at $i=(i_1+i_2)/2$, and $\delta\lambda_0$ becomes the minimum at $i=i_1$ or $i=i_2$. FIG. 20 shows an approximate error ratio $|\delta\lambda_0|_{i=i1\ or\ i2}/|\delta\lambda_0|_{i=(i1+i2)/2}$ (solid line) and the reciprocal (broken line) thereof while the approximate error ratio and the reciprocal are plotted as a function of the value p.

The approximate error becomes large in the operating range, because either $|\delta\lambda_0|_{i=i1\ or\ i2}$ or $|\delta\lambda_0|_{i=(i1+i2)/2}$ is rapidly increased except for the value p in which the approximate error ratio becomes 1 (namely, absolute values of the maximum value and minimum value of the approximate error become equal to each other). Accordingly, it is thought that the absolute values of the maximum value and minimum value of the approximate error become equal to each other to decrease the approximate error in the operating range by determining the value p so as to obtain $|\delta\lambda_0|_{i=i1 \text{ or } i2}=|\delta\lambda_0|_{i=(i1+i2)/2}$.

The internally dividing point at which the value p is obtained can be set at the measuring point and the drive currents $i_{s1}$ and $i_{s2}$ can be set at the drive current at the measuring points. At this point, when the approximate error ratio of the optical output wavelength to the device temperature is computed, the approximate error ratio depends only on a specific coordinate of the internally dividing point in the drive current operating range while the approximate error ratio does not depend on the drive current quadratic function expressing the actual optical output wavelength characteristics and the coefficient of the approximated drive current linear function, so that actually the above computation result can be used in the following computation described later.

FIG. 19(b) shows the dependence of the optical output wavelength on the device temperature when the drive current is fixed to a value located in the operating range. The reference numeral $T_1$ and $T_2$ designate a minimum value and a maximum value of device temperature T in the operating range. The actual optical output wavelength characteristics are expressed by a device temperature quadratic function, and the approximate line is expressed by a device temperature linear function. As described above, the optical output wavelength is monotonously decreased for the device temperature.

The operating range ($T_1 \leq T \leq T_2$) of the device temperature T is internally divided by q:1-q and 1-q:q to determine device temperatures $T_{s1}$ and $T_{s2}$ at the internally dividing points using an arbitrary value q (q is a specific coordinate of an internally dividing point in the drive current operating range, and q is a real number satisfying 0<q<1), and thereby the value q in which the absolute values of the maximum value and minimum value of the approximate error become equal to each other (become $|\delta\lambda_0|_{T=T1 \text{ or } T2}=|\delta\lambda_0|_{T=(T1+T2)/2}$) is determined. The internally dividing point at which the value q is obtained is set at the measuring point, and the device temperatures $T_{s1}$ and $T_{s2}$ thereof is set at the device temperature in the measuring point. As described above, because the same result is obtained, actually the value equal to the value p can be used as the value q.

FIG. 21(a) shows the dependence of the optical output power on the drive current when the device temperature is fixed to a value located in the operating range, and FIG. 21(b) shows the dependence of the optical output power on the device temperature when the drive current is fixed to a value located in the operating range.

As described above, the optical output power is monotonously increased for the drive current, and is monotonously decreased for the device temperature. Similarly, for the optical output power, the device temperature in the internally dividing point at which the absolute values of the maximum value and minimum value of the approximate error become equal to each other can be determined in the drive current and device temperature operating ranges in the internally dividing point at which the absolute values of the maximum value and minimum value of the approximate error $\delta P0$ of the optical output power become equal to each other in the drive current operating range.

As described above, when the approximate error ratio of the optical output power is computed, the approximate error ratio also depends only on the specific coordinate of the internally dividing point in the drive current or device temperature operating range while the approximate error ratio does not depend on the drive current or device temperature quadratic function expressing the actual optical output power characteristics and the coefficient of the approximated drive current or device temperature linear function, so that actually the above computation result can also be used.

As a result, as shown in FIG. 22, four points of a measuring point 361 ($i_{s1}$,$T_{s1}$), a measuring point 362 ($i_{s1}$,$T_{s2}$), a measuring point 363 ($i_{s2}$, $T_{s1}$), and a measuring point 364 ($i_{s2}$, $T_{s2}$) can be determined as the measuring points for determining the dependence of the optical output wavelength of the light emitting device on the drive current and device temperature and the dependence of the optical output power of the light emitting device on the drive current and device temperature. Actually three points in the above four points can be selected as the measuring point to determine the coefficient of the linear function in the three-dimensional space.

Thus, the measuring points for determining the dependence of the optical output wavelength of the light emitting device on the drive current and device temperature and the dependence of the optical output power of the light emitting device on the drive current and device temperature can be selected to decrease the estimated errors of the optical output wavelength and optical output power in the simple, small-scale, inexpensive optical communication light source unit in which the optical output wavelength and optical output power are set and controlled without the complicated setting procedure and the expensive optical components such as the wavelength locker when compared with the conventional technique.

In the first optical communication light source unit and the second optical communication light source unit, the estimated errors of the optical output wavelength and optical output power can be decreased by including the selection circuit. The first optical communication light source unit or the second optical communication light source unit in which the selection circuit is included, can sufficiently be applied to the access system or metropolitan area system in which the low cost and the simplification are required.

Then, a direct modulation type third optical communication light source unit which sets and controls the optical output wavelength and the optical output power and satisfies a predetermined extinction ratio and eye mask requirement and a method of selecting the measuring points of the optical output wavelength, optical output power, and RF amplitude stored in the direct modulation type third optical communication light source unit will be described. In this case, it is characterized that the "monotonous" characteristics shown in FIG. 26 are estimated concerning the RF amplitude during the direct modulation satisfying the predetermined extinction ratio and eye mask requirement in addition to the optical output wavelength and optical output power of each light emitting device.

The direct modulation type third optical communication light source unit (hereinafter "direct modulation type third optical communication light source unit" is abbreviated to "direct modulation type optical communication light source unit") which sets the optical output wavelength and the optical output power and satisfies the predetermined extinction ratio and eye mask requirement will be described below.

Means in which at least one value of the optical output wavelength for the drive current and device temperature during the direct modulation satisfying the predetermined extinction ratio and eye mask requirement, at least one value concerning these three, or at least one parameter for determining a relationship among these three as information necessary to determine the dependence of the optical output wavelength on the drive current and device temperature, at least one value of the optical output power for the drive current and device temperature during the direct modulation satisfying the predetermined extinction ratio and eye mask requirement, at least one value concerning these three, or at least one parameter for determining a relationship among these three as information necessary to determine the dependence of the optical output power on the drive current and device temperature, and at least one value of the RF amplitude for the drive current and device temperature, the RF amplitude giving the optical output wavelength and the optical output power, at least one value concerning these three, or at least one parameter for determining a relationship among these three are previously stored is provided in the direct modulation type optical communication light source unit.

Means for determining the drive current or optical output power, device temperature and RF amplitude at which both the optical output wavelength and optical output power of the light emitting device become the separately specified values is provided in the direct modulation type optical communication light source unit. The means determines the parameter value for determining the dependence of the optical output wavelength on the drive current and device temperature during the direct modulation satisfying the predetermined extinction ratio and eye mask requirement using at least one value previously stored in the optical communication light source unit. Similarly, the parameter value for determining the dependence of the optical output power on the drive current and device temperature during the direct modulation satisfying the predetermined extinction ratio and eye mask requirement is determined using the at least one value. The coordinate value (drive current and device temperature) of the intersection point is computed using the parameter values.

The parameter value for determining the dependence of the RF amplitude, which gives the optical output wavelength and optical output power as shown in FIG. 26(a), on the drive current and device temperature during the direct modulation satisfying the predetermined extinction ratio and eye mask requirement is determined using the at least one value. The drive current or optical output power, device temperature, and RF amplitude at which both the optical output wavelength and optical output power of the light emitting device become the separately specified values are determined from the computed coordinate value (drive current and device temperature) and the RF amplitude in the coordinate value.

The drive current or optical output power, device temperature, and RF amplitude determined in the above-described manner are given to the means for automatically controlling the drive current or optical output power, the means for automatically controlling the device temperature, and the means for automatically controlling the RF amplitude, which are provided in the direct modulation type optical communication light source unit, as the target value respectively.

Then, the direct modulation type optical communication light source unit which adjusts and controls the optical output wavelength and the optical output power and satisfies the predetermined extinction ratio and eye mask requirement will be described.

The means in which at least one value of the optical output wavelength for the drive current and device temperature during the direct modulation satisfying the predetermined extinction ratio and eye mask requirement, at least one value concerning these three, or at least one parameter for determining a relationship among these three as information necessary to determine the dependence of the optical output wavelength on the drive current and device temperature, at least one value of the optical output power for the drive current and device temperature during the direct modulation satisfying the predetermined extinction ratio and eye mask requirement, at least one value concerning these three, or at least one parameter for determining a relationship among these three as information necessary to determine the dependence of the optical output power on the drive current and device temperature, and at least one value of the RF amplitude for the drive current and device temperature, the RF amplitude giving the optical output wavelength and the optical output power, at least one value concerning these three, or at least one parameter for determining a relationship among these three are stored is provided in the direct modulation type optical communication light source unit.

The means for monitoring the drive current of the light emitting device to make the comparison determination whether or not the drive current is located in the separately specified allowable fluctuation range is provided in the direct modulation type optical communication light source unit, predicting the dependence of the optical output power on the drive current and device temperature and the dependence of the RF amplitude on the drive current and device temperature during the direct modulation satisfying the predetermined extinction ratio and eye mask requirement in the drive current fluctuation of the light emitting device based on the comparison determination result. As shown in FIG. 26(b), the dependence of the RF amplitude on the drive current and device temperature is also predicted by utilizing the "monotonous" characteristics to perform the parallel movement according to the increase and decrease in drive current.

The means for determining the drive current and device temperature at which both the optical output wavelength and optical output power during the direct modulation satisfying the predetermined extinction ratio and eye mask requirement in the drive current fluctuation of the light emitting device become the separately specified values is provided in the direct modulation type optical communication light source unit. The means determines the parameter value for determining the dependence of the optical output wavelength on the drive current and device temperature during the direct modulation satisfying the predetermined extinction ratio and eye mask requirement using at least one value previously stored in the optical communication light source unit.

The coordinate value (drive current and device temperature) of the intersection point is computed in the drive current fluctuation using this parameter value and the parameter value for determining the dependence of the optical output power on the drive current and device temperature, computed by the prediction means, during the direct modulation satisfying the predetermined extinction ratio and eye mask requirement in the drive current fluctuation. The new target values of the drive current, device temperature, and RF amplitude at which both the optical output wavelength and optical output power of the light emitting device become the separately specified values from the parameter value for determining the dependence of the RF amplitude on the drive current and device temperature, computed by the prediction means, during the direct modulation satisfying the predetermined extinction ratio and eye mask requirement in the drive current fluctuation and from the RF amplitude computed using the computed coordinate value (drive current and device temperature).

The optical output wavelength and optical output power of the light emitting device are adjusted and controlled so as to be maintained at the specified values by giving the drive current, device temperature, and RF amplitude determined in the above-described manner to the means for automatically controlling the optical output power, device temperature, and RF amplitude, which is provided in the direct modulation type optical communication light source unit, as the new target value.

Finally the method of selecting the measuring points of the optical output wavelength, optical output power, and RF amplitude, stored in the direct modulation type optical communication light source unit, will be described.

When the optical output wavelength characteristics during the direct modulation satisfying the predetermined extinction ratio and eye mask requirement of the light emitting device such as LD are considered, the optical output wavelength characteristics are considered up to the second-order term for the drive current and device temperature in the three-dimensional space having coordinate axes of the drive current, device temperature, and optical output wavelength (the optical output wavelength characteristics are expressed by the quadratic function of the drive current and device temperature). When the optical output power characteristics during the direct modulation satisfying the predetermined extinction ratio and eye mask requirement of the light emitting device are considered, the optical output power characteristics are considered up to the second-order term for the drive current and device temperature in the three-dimensional space having coordinate axes of the drive current, device temperature, and optical output power (the optical output power characteristics are expressed by the quadratic function of the drive current and device temperature). Similarly, when the RF amplitude during the direct modulation satisfying the predetermined extinction ratio and eye mask requirement of the light emitting device is considered, the RF amplitude is considered up to the second-order term for the drive current and device temperature in the three-dimensional space having coordinate axes of the drive current, device temperature, and RF amplitude (the RF amplitude characteristics are expressed by the quadratic function of the drive current and device temperature).

In actually setting and controlling the optical output wavelength, optical output power, and RF amplitude during the direct modulation satisfying the predetermined extinction ratio and eye mask requirement, the optical output wavelength characteristics of the light emitting device are approximated by the plane (linear function of the drive current and device temperature), the optical output power characteristics of the light emitting device are approximated by the plane (linear function of the drive current and device temperature), and the RF amplitude of the light emitting device is approximated by the plane (linear function of the drive current and device temperature).

In the case of approximating the optical output wavelength characteristics of the light emitting device by the plane, when the three measuring points exist for each light emitting device, the coefficient of the linear function expressing the optical output wavelength characteristics can be computed. Accordingly, the measuring point selection method can come down to the question in which each two values of the drive current and device temperature are selected such that the difference between the actual optical output wavelength characteristics and the optical output wavelength characteristics approximated by the plane is decreased in the operating range on the (drive current-device temperature) coordinate surface. The same holds for the optical output power characteristics and RF amplitude characteristics of the light emitting device.

The selection of the measuring point in consideration of the optical output wavelength characteristics of the light emitting device will first be described.

The actual optical output wavelength characteristics during the direct modulation satisfying the predetermined extinction ratio and eye mask requirement are expressed by the quadratic function of the drive current i, and the approximate line is expressed by the linear function of the drive current i. As shown in FIG. 27(a), the operating range ($i_1 \leq i \leq i_2$) of the drive current i is internally divided by p:1-p and 1-p:p (p is a specific coordinate of an internally dividing point the operating range of the drive current, and p is a real number satisfying 0<p<1). When the approximate error of the optical output wavelength during the direct modulation satisfying the predetermined extinction ratio and eye mask requirement is expressed by $\delta\lambda_0$, it is thought that the absolute values of the maximum value and minimum value of the approximate error become equal to each other to decrease the approximate error in the operating range by determining the value p so as to obtain $|\delta\lambda_0|_{i=i1 \text{ or } i2} = |\delta\lambda_0|_{i=(i1+i2)/2}$. The drive currents $i_{s1}$ and $i_{s2}$ in which the operating range is internally divided by p:1-p and 1-p:p can be set at the drive current in the measuring points using the value p.

Similarly, the actual optical output wavelength characteristics during the direct modulation satisfying the predetermined extinction ratio and eye mask requirement are expressed by the quadratic function of the device temperature T, and the approximate line is expressed by the linear function of the device temperature T. As shown in FIG. 27(b), the operating range ($T_1 \leq T \leq T_2$) of the device temperature T is internally divided by q:1-q and 1-q:q (q is a specific coordinate of an internally dividing point in the operating range of the device temperature, and q is a real number satisfying 0<q<1) to determine the value q in which the absolute values of the maximum value and minimum value of the approximate error become equal to each other (become $|\delta\lambda_0|_{T=T1 \text{ or } T2} = |\delta\lambda_0|_{T=(T1+T2)/2}$). The device temperatures $T_{s1}$ and $T_{s2}$ in which the operating range is internally divided by q:1-q and 1-q:q are set at the device temperature in the measuring point using the value q. As described above, actually the value equal to the above computed value p can be used as the value q. The same holds for the optical output power characteristics (approximate error $\delta P_0$) and the RF amplitude characteristics (approximate error $\delta i_{RFO}$) (FIGS. 28(a) and 28(b)).

As a result, the four points ($i_{s1}, T_{s1}$), ($i_{s1}, T_{s2}$), ($i_{s2}, T_{s2}$), and ($i_{s2}, T_{s2}$) can be determined as the measuring points for determining the dependence of the optical output wavelength of the light emitting device on the drive current and device temperature and the dependence of the optical output power on the drive current and device temperature during the direct modulation satisfying the predetermined extinction ratio and eye mask requirement (FIG. 29). Actually any three points in the above four points can be selected as the measuring point to determine the coefficient of the linear function in the three-dimensional space.

Thus, the direct modulation type optical communication light source unit which sets and controls the optical output wavelength and optical output power and satisfies the predetermined extinction ratio and eye mask requirement in the operation ranges of the specified drive current and device temperature of the light emitting device can be realized by setting, adjusting, and controlling the optical output wavelength and optical output power. The estimated errors of the optical output wavelength and optical output power in the direct modulation type optical communication light source unit can be decreased by selecting the measuring points for determining the dependence of the optical output wavelength of the light emitting device on the drive current and device temperature and the dependence of the optical output power of the light emitting device on the drive current and device temperature.

In the direct modulation type optical communication light source unit, the extremely complicated setting and control and the extremely expensive optical component (wavelength locker) are not required, both the optical output wavelength and the optical output power can simply be set and controlled at a moderate price while the predetermined extinction ratio and eye mask requirement is satisfied, and the estimated errors of the optical output wavelength and optical output power can be decreased. The direct modulation type optical communication light source unit can sufficiently be applied to the access system or metropolitan area system in which the low cost and the simplification are required.

EFFECT OF THE INVENTION

As described above, the invention can provide the optical communication light source unit in which the extremely complicated setting and control and the extremely expensive optical component (wavelength locker) are not required and both the optical output wavelength and the optical output power are simply set and controlled at a moderate price. The optical communication light source unit according to the invention can sufficiently be applied to the access system or metropolitan area system in which the low cost and the simplification are required.

BRIEF DESCRIPTION OF THE DRAWINGS

FIG. 2(a) shows a relationship between an optical output wavelength λ and a device temperature T in coarse adjustment of the device temperature adjustment, and FIG. 2(b) shows a relationship between the optical output wavelength λ and optical current Id generated by detecting optical output in fine adjustment with a wavelength locker;

FIG. 3(a) shows optical output wavelength characteristics (dependence on drive current and device temperature), FIG. 3(b) shows optical output power characteristics (dependence on drive current and device temperature), and FIG. 3(c) is a view showing a relationship between an optical output wavelength contour line and an optical output power contour line;

FIG. 10(a) shows the optical output wavelength characteristics (dependence on drive current and device temperature), FIG. 10(b) shows the optical output power characteristics (dependence on drive current and device temperature), and FIG. 10(c) is a view showing the relationship between the optical output wavelength contour line and the optical output power contour line;

FIG. 11(a) shows the optical output wavelength characteristics (dependence on drive current and device temperature), FIG. 11(b) shows the optical output power characteristics (dependence on drive current and device temperature) when the drive current is increased, and FIG. 11(c) is a view showing the relationship between the optical output wavelength contour line and the optical output power contour line;

FIG. 19(a) shows the approximate error for the dependence on the drive current, and FIG. 19(b) shows the approximate error for the dependence on the device temperature;

FIG. 21(a) shows the approximate error for the dependence on the drive current and FIG. 21(b) shows the approximate error for the dependence on the device temperature;

FIG. 25(a) shows a case in which RF amplitude is excessively large for the drive current, FIG. 25(b) shows a case in which the RF amplitude is proper for the drive current, FIG. 25(c) shows a case in which the RF amplitude is excessively small for the drive current, FIG. 25(a) shows the case under measurement conditions of a transmission rate of 2.5 Gbps, the drive current of 50 mA, the RF amplitude of 39 mA, the device temperature of 25° C., and an extinction ratio of 14.3 dB, FIG. 25(b) shows the case under measurement conditions of the transmission rate of 2.5 Gbps, the drive current of 60 mA, the RF amplitude of 39 mA, the device temperature of 25° C., and an extinction ratio of 8.9 dB, and FIG. 25(*c*) shows the case under measurement conditions of the transmission rate of 2.5 Gbps, the drive current of 80 mA, the RF amplitude of 39 mA, the device temperature of 25° C., and an extinction ratio of 4.9 dB;

DESCRIPTION OF THE REFERENCE NUMERALS

Figure 1:
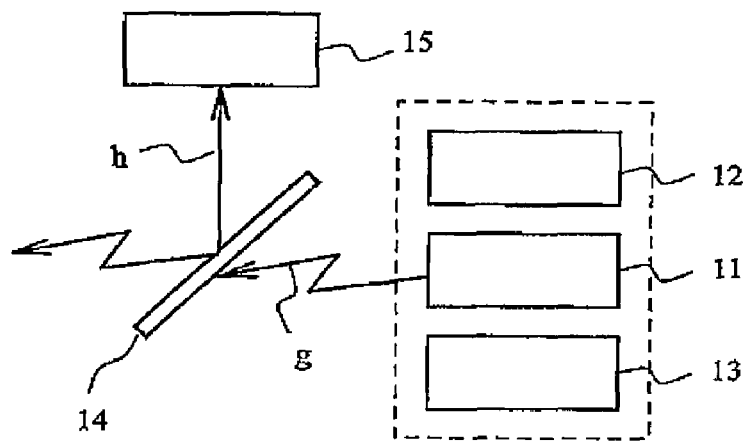
FIG. 1 is a block diagram showing an example of a conventional optical communication light source unit.
Figure 2:
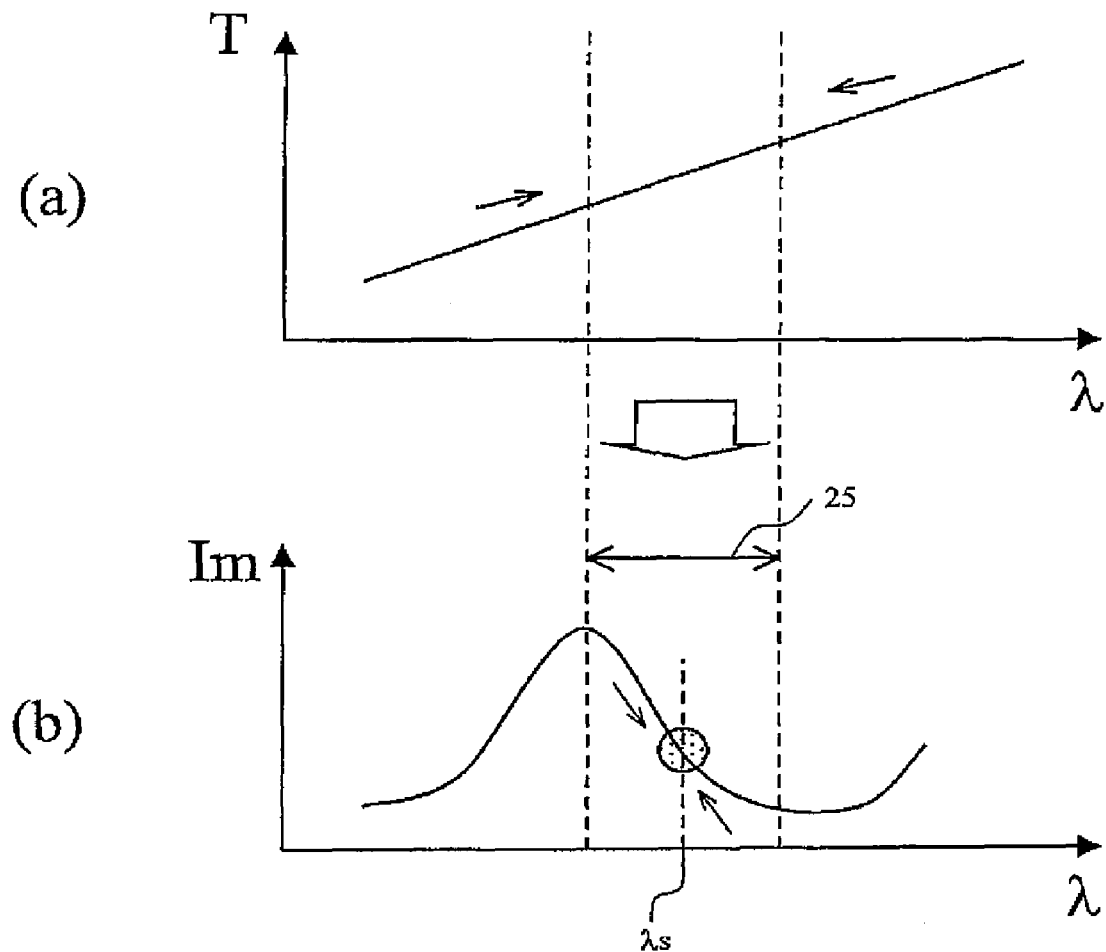
FIG. 2 is an explanatory view showing an outline of setting and controlling an optical output wavelength of a conventional light emitting device.

11: light emitting device
12: means for automatically maintaining optical output power of light g from the light emitting device 11 at a given target value
13: means for automatically maintaining device temperature of the light emitting device 11 at a given target value
14: means for branching light from the light emitting device 11
15: wavelength locker
25: pull-in range
101: eleventh means, 102: twelfth means, 103: thirteenth means, 104: fourteenth means, 105: fifteenth means, 106: sixteenth means, 107: seventeenth means, a1: light from the eleventh means 101, b1: specified optical output wavelength and optical output power, c1: drive current or optical output power determined by the fifteenth means 105, d1: device temperature determined by the fifteenth means 105, e1: both or one of the specified optical output wavelength range and optical output power range, f1: comparison determination result

201: twenty-first means, 202: twenty-second means, 203: twenty-third means, 204: twenty-fourth means, 205: twenty-fifth means, 206: twenty-sixth means, 207: twenty-seventh means, 208: twenty-eighth means, a2: light from the twenty-first means 201, b2: drive current of the light emitting device constituting the twenty-first means 201, c2: allowable fluctuation range of the specified drive current, d2: parameter value for determining a relationship among the drive current, the device temperature, and the optical output power during drive current fluctuation of the light emitting device which is predicted by the twenty-fifth means 205, e2: specified optical output wavelength and optical output power, f2: latest drive current or optical output power determined by the twenty-sixth means 206, g2: latest device temperature determined by the twenty-sixth means 206, h2: both or one of the specified optical output wavelength range and optical output power range, j2: comparison determination result

401: forty-first means, 402: forty-second means, 403: forty-third means, 404: forty-fourth means, 405: forty-fifth means, 406: forty-sixth means, 407: forty-seventh means, 408: forty-eighth means, 409: forty-ninth means, 410: fiftieth means, a4: light from forty-first means 401, b4: specified optical output wavelength and optical output power, c4: drive current or optical output power determined by the forty-sixth means 406, d4: RF amplitude determined by the forty-sixth means 406, e4: device temperature determined by the forty-sixth means 406, f4: drive current of the light emitting device constituting the forty-first means 401, g4: allowable fluctuation range of specified drive current, h4: parameter value for determining a relationship among the drive current, the device temperature, and the optical output power during the drive current fluctuation of the light emitting device which is predicted by the forty-seventh means 407, and parameter value for determining a relationship among the drive current, the device temperature, and the RF amplitude, j4: latest drive current or optical output power determined by the forty-eighth means 408, k4: latest RF amplitude determined by the forty-eighth means 408, l4: latest device temperature determined by the forty-eighth means 408, m4: both or one of the specified optical output wavelength range and optical output power range, n4: comparison determination result

35: optical output wavelength contour line
37: optical output power contour line
235: optical output wavelength contour line
237: optical output power contour line (before drive current fluctuation)
237*a*: optical output power contour line (during drive current fluctuation, when drive current i is increased)
237*b*; optical output power contour line (during drive current fluctuation, when drive current i is decreased)
245: movement amount of optical output power characteristics which is moved in parallel by the increase in drive current

255: drive current allowable fluctuation range
335: drive current operating range
337: device temperature operating range
361 to 364: measuring points of the optical output wavelength and optical output power
435: drive current operating range
437: device temperature operating range
445: movement amount of RF amplitude characteristics which is moved in parallel by the increase in drive current
461 to 464: measuring points of the optical output wavelength, optical output power and RF amplitude
Im: photocurrent generated by detection of optical output
i: drive current
it: target value for drive current during automatic control
it0: drive current target value (before drive current fluctuation)
ita: drive current target value (during drive current fluctuation, when drive current i is increased)
itb: drive current target value (during drive current fluctuation, when drive current i is decreased)
T: device temperature
Tt: target value for the device temperature during automatic control
Tt0: target value for the device temperature during automatic control
Tta: device temperature target value (during drive current fluctuation, when drive current i is increased)
Ttb: device temperature target value (during drive current fluctuation, when drive current i is decreased)
R: ratio of an absolute value of an optical output wavelength approximate error
p: specific coordinate of an internally dividing point of a drive current operating range
q: specific coordinate of an internally dividing point of a device temperature operating range
$i_{RF}$: RF amplitude
λ: optical output wavelength
λs: specified optical output wavelength
Pw: optical output power
Ps: specified optical output power
S101-0: start step
S101-1: step of reading at least one value, stored in the fourteenth means, to output the value to the fifteenth means
S101-2: step of computing the parameter value for determining the relationship among the drive current, the device temperature, and the optical output wavelength for the eleventh means using at least one value inputted from the fourteenth means
S101-3: step of computing the parameter value for determining the relationship among the drive current, the device temperature, and the optical output power for the eleventh means using at least one value inputted from the fourteenth means
S101-4: step of computing the drive current or optical output power and the device temperature of the eleventh means at which the optical output wavelength and optical output power of the eleventh means become the specified values at the same time using parameter values computed steps S101-2 and S11-3
S101-5: step of setting the drive current or optical output power computed in step S101-4 as the target value to the twelfth means and setting the device temperature computed in step S101-4 as the target value to the thirteenth means
S11-6: step of inputting the specified optical output wavelength and optical output power
S101-7: end step
S102-0: start step
S102-1: step of determining whether or not the value stored in the sixteenth means is used
S102-2: step of determining whether or not the drive current or optical output power and the device temperature are stored in the sixteenth means
S102-3: step of reading the drive current or optical output power and the device temperature stored in the sixteenth means and outputting them to the twelfth means and thirteenth means
S102-4: step of reading at least one value stored in the fourteenth means and outputting the value to the fifteenth means
S102-5: step of computing the parameter value for determining the relationship among the drive current, the device temperature, and the optical output wavelength for the eleventh means using at least one value inputted from the fourteenth means
S102-6: step of computing the parameter value for determining the relationship among the drive current, the device temperature, and the optical output power for the eleventh means using at least one value inputted from the fourteenth means
S102-7: step of computing the drive current or optical output power and the device temperature of the eleventh means at which both the optical output wavelength and optical output power of the eleventh means become the specified values using parameter values computed in steps S102-5 and S102-6
S102-8: step of storing the drive current or optical output power and the device temperature computed in step S102-7 in the sixteenth means
S102-9: step of setting the drive current or optical output power which is computed in step S102-7 or inputted in step S102-3 as the target value to the twelfth means and setting the device temperature which is computed in step S102-7 or inputted in step S102-3 as the target value to the thirteenth means
S102-10: step of inputting the specified optical output wavelength and optical output power
S102-11: end step
S103-0: start step
S103-1: step of monitoring the optical output wavelength and optical output power of the light generated by the eleventh means
S103-2: step of comparing the optical output wavelength and optical output power monitored in step S103-1 to the specified optical output wavelength range and optical output power range, respectively
S103-3: step of determining whether or not the optical output wavelength and optical output power monitored in step S103-1 are located in the specified optical output wavelength range and optical output power range respectively
S103-4: step of outputting the result of the comparison determination in step S103-3 as status display
S103-5: step of outputting the result of the comparison determination in step S103-3 as abnormal warning
S103-6: step of outputting the specified optical output wavelength range and optical output power range
S201-0: start step
S201-1: step of reading at least one value of the optical output wavelength for the drive current and device temperature, at least one value concerning these three, or at least one parameter value for determining the relationship among these three, which are stored in the twenty-fourth means, and outputting the value to the twenty-sixth means
S201-2: step of computing the parameter value for determining the relationship among the drive current, device temperature, and optical output wavelength for the twenty-first means using at least one value inputted from the twenty-fourth means S201-3: step of reading at least one value of the optical output power for the drive current and device temperature, at least one value concerning these three, or at least one parameter value for determining the relationship among these three, which are stored in the twenty-fourth means, and outputting the value to the twenty-fifth means S201-4: step of computing the parameter value for determining the relationship among the drive current, device temperature, and optical output power before the drive current fluctuation for the twenty-first means using at least one value inputted from the twenty-fourth means S201-5: step of monitoring drive power of the twenty-first means by the twenty-fifth means to compare the drive power to the allowable fluctuation range of the separately specified drive current S201-6: step of determining whether or not the drive power of the twenty-first means is located in the allowable fluctuation range of the separately specified drive current as a result of the comparison in step S201-5

S201-7: step of predicting and computing the parameter value for determining the relationship among the drive current, device temperature, and optical output power during the drive current fluctuation for the twenty-first means using the parameter value computed in step S201-4 and outputting the parameter value to the twenty-sixth means S201-8: step of computing the latest drive current or optical output power and the latest device temperature of the twenty-first means at which the optical output wavelength and the optical output power become the specified values at the same time during the drive current fluctuation of the twenty-first means using the parameter value computed in step S201-2 and the parameter value inputted in step S201-7

S201-9: setting the drive current or optical output power computed in step S201-8 to the twenty-second means as the new target value in the drive current fluctuation and setting the device temperature computed in step S201-8 to the twenty-third means as the new target value in the drive current fluctuation S201-10: step of inputting the allowable fluctuation range of the specified drive current S201-11: step of inputting the specified optical output wavelength and optical output power S202-0: start step S202-1: step of determining whether or not the value stored in the twenty-seventh means is used S202-2: step of determining whether or not the latest drive current or optical output power and the latest device temperature are stored in the twenty-seventh means S202-3: step of reading the latest drive current or optical output power and the latest device temperature stored in the twenty-seventh means and outputting the latest drive current or optical output power and the latest device temperature to the twenty-second means and twenty-third means respectively S202-4: step of reading at least one value of the optical output wavelength for the drive current and device temperature, at least one value concerning these three, or at least one parameter value for determining the relationship among these three, which are stored in the twenty-fourth means, and outputting the value to the twenty-sixth means S202-5: step of computing the parameter value for determining the relationship among the drive current, device temperature, and optical output wavelength for the twenty-first means using at least one value inputted from the twenty-fourth means S202-6: step of reading at least one value of the optical output power for the drive current and device temperature, at least one value concerning these three, or at least one parameter value for determining the relationship among these three, which are stored in the twenty-fourth means, and outputting the value to the twenty-fifth means S202-7: step of computing the parameter value for determining the relationship among the drive current, device temperature, and optical output power before the drive current fluctuation for the twenty-first means using at least one value inputted from the twenty-fourth means S202-8: step of monitoring the drive power of the twenty-first means by the twenty-fifth means to compare the drive power to the allowable fluctuation range of the separately specified drive current S202-9: step of determining whether or not the drive power of the twenty-first means is located in the allowable fluctuation range of the separately specified drive current as a result of the comparison in step S202-8

S202-10: step of predicting and computing the parameter value for determining the relationship among the drive current, device temperature, and optical output power during the drive current fluctuation for the twenty-first means using the parameter value computed in step S202-7 and outputting the parameter value to the twenty-sixth means S202-11: step of computing the latest drive current or optical output power and the latest device temperature of the twenty-first means at which the optical output wavelength and the optical output power become the specified values at the same time during the drive current fluctuation of the twenty-first means using the parameter value computed in step S202-5 and the parameter value inputted in step S202-10

S202-12: step of storing the drive current or optical output power and device temperature computed in step S202-11 in the twenty-seventh means S202-13: step of setting the drive current or optical output power which is computed in step S202-11 or inputted in S202-3 to the twenty-second means as the new target value in the drive current fluctuation and setting the device temperature which is computed in step S202-3 or inputted in step S202-3 to the twenty-third means as the new target value in the drive current fluctuation S202-14: step of inputting allowable fluctuation range of specified drive current S202-15: step of inputting specified optical output wavelength and optical output power S203-0: start step S203-1; step of monitoring the optical output wavelength and optical output power of the light generated by the twenty-first means S203-2: step of comparing the optical output wavelength and optical output power monitored in step S203-1 to the specified optical output wavelength range and optical output power range respectively S203-3: step of determining whether or not the optical output wavelength and optical output power monitored in step S203-1 are located in the specified optical output wavelength range and optical output power range respectively S203-4: step of outputting the result of the comparison determination in step S203-3 as the status display S203-5: step of outputting the result of the comparison determination in step S203-3 as the abnormal warning S203-6: step of inputting the specified optical output wavelength range and optical output power range respectively S301-0: start step S301-1: step of inputting the operating ranges of the drive current and device temperature S301-2: step of internally dividing the drive current operating range ($i_1 \leq i \leq i_2$) by p:1-p and 1-p:p to determine drive currents $i_{s1}$ and $i_{s2}$ in the internally dividing point using an arbitrary value p (p is a specific coordinate of an internally dividing point in the drive current operating range, and p is a real number satisfying 0<p<1) and thereby determining approximate errors $|\delta\lambda_0|_{i=i1 \text{ or } i2}$ and $|\delta\lambda_0|_{=(i1+i2)/2}$ between the optical output wavelength characteristics for the drive current and optical output wavelength characteristics approximated by a drive current linear function, determining the value p such that the approximate errors are equal to each other, and determining the drive currents $i_{s1 \text{ and } is2}$ to the drive currents at the measuring points while the internally dividing points are set at the measuring points at that time S301-3: step of internally dividing the device temperature operating range ($T_1 \leq T \leq T_2$) by p:1-p and 1-p:p to determine device temperatures $T_{S1}$ and $T_{S2}$ in the measuring points using the value p determined in step S301-2

S301-4: step of selecting three points as the measuring points of the optical output wavelength and optical output power characteristics from the points ($i_{s1}, T_{s1}$), ($i_{s1}, T_{s2}$), ($i_{s2}, T_{s1}$), and ($i_{s2}, T_{s2}$) determined in steps S301-2 to S301-3

S301-5: step of inputting the operating ranges of the specified drive current and device temperature S301-6: end step S302-0: start step S302-1: step of inputting operating ranges of drive current and device temperature S302-2: step of internally dividing the device temperature operating range ($T_1 \leq T \leq T_2$) by q:1-q and 1-q:q to determine device temperatures $T_{s1 \text{ and } Ts2}$ in the internally dividing point using an arbitrary value q (q is a specific coordinate of an internally dividing point in the drive current operating range, and q is a real number satisfying 0<q<1) and thereby determining approximate errors $|\delta\lambda_0|_{T=T1 \text{ or } T2}$ and $|\delta\lambda_0|_{T=(T1+T2)/2}$ between the optical output wavelength characteristics for the device temperature and optical output wavelength characteristics approximated by a device temperature linear function, determining the value q such that the approximate errors are equal to each other, and determining the device temperatures $T_{s1}$ and $T_{s2}$ to the device temperatures at the measuring points while the internally dividing points are set at the measuring points at that time S302-3: step of internally dividing the drive current operating range ($i_1 \leq i \leq i_2$) by q:1-q and 1-q:q to determine drive currents is, and is 2 in the measuring points using the value q determined in step S302-2 s302-4: step of selecting three points as the measuring points of the optical output wavelength and optical output power characteristics from the points ($i_{s1}, T_{s1}$), ($i_{s1}, T_{s2}$), ($i_{s2}, T_{s1}$) and ($i_{s2}, T_{s2}$) determined in steps s302-2 to s302-3

S302-5: step of inputting the operating ranges of the specified drive current and device temperature S302-6: end step S401-0: start step S401-1: step of reading at least one value, stored in the forty-fifth means, to output the value to the forty-sixth means S401-2: step of computing the parameter value for determining the relationship among the drive current, device temperature, and optical output wavelength during the direct modulation which satisfies the predetermined extinction ratio and eye mask requirement for the forty-first means using at least one value inputted from the forty-fifth means S401-3: step of computing the parameter value for determining the relationship among the drive current, device temperature, and optical output power during the direct modulation which satisfies the predetermined extinction ratio and eye mask requirement for the forty-first means using at least one value inputted from the forty-fifth means S401-4: step of computing the parameter value for determining the relationship among the drive current, device temperature, and RF amplitude during the direct modulation which satisfies the predetermined extinction ratio and eye mask requirement for the forty-first means using at least one value inputted from the forty-fifth means S401-5: step of computing the drive current or optical output power and the device temperature of the forty-first means at which the optical output wavelength and the optical output power become the specified values at the same time during the direct modulation which satisfies the predetermined extinction ratio and eye mask requirement for the forty-first means using the parameter value computed in step S401-2 and S401-3 and computing the RF amplitude in the determined drive current or optical output power and the device temperature using the parameter value computed in step S401-4

S401-6: step of setting the drive current or optical output power computed in step S401-5 as the target value to the forty-second means, setting the device temperature as the target value to the forty-third means, and setting the RF amplitude as the target value to the forty-fourth means S401-7: step of inputting specified optical output wavelength and optical output power S401-8: end step S402-0: start step S402-1: step of reading at least one value of the optical output wavelength for the drive current and device temperature during the direct modulation which satisfies the predetermined extinction ratio and eye mask requirement stored in the forty-fifth means, at least one value concerning these three, or at least one parameter value for determining the relationship among these three and outputting the value to the forty-eighth means S402-2: step of computing the parameter value for determining the relationship among the drive current, device temperature, and optical output wavelength during the direct modulation which satisfies the predetermined extinction ratio and eye mask requirement for the forty-first means using at least one value inputted from the forty-fifth means S402-3: step of reading at least one value of the optical output power during the direct modulation which satisfies the predetermined extinction ratio and eye mask requirement for the drive current and device temperature, at least one value concerning these three, at least one parameter value for determining the relationship among these three, at least one value of the RF amplitude for the drive current and device temperature during the direct modulation which satisfies the predetermined extinction ratio and eye mask requirement, at least one value concerning these three, or at least one parameter value for determining the relationship among these three, which are stored in the forty-fifth means, and outputting the value to the forty-seventh means S402-4: step of computing the parameter value for determining the relationship among the drive current, device temperature, and optical output power before the drive current fluctuation during the direct modulation which satisfies the predetermined extinction ratio and eye mask requirement for the forty-first means using at least one value inputted from the forty-fifth means S402-5: step of computing the parameter value for determining the relationship among the drive current, device temperature, and RF amplitude during the direct modulation which satisfies the predetermined extinction ratio and eye mask requirement for the forty-first means using at least one value inputted from the forty-fifth means S402-6: step of monitoring the drive current of the forty-first means by the forty-seventh means to compare the drive current to the allowable fluctuation range of the separately specified drive current S402-7: step of determining whether or not the monitored drive current is located in the drive current allowable fluctuation range S402-8: step of predicting and computing the parameter value for determining the relationship among the drive current, device temperature, and optical output power during the direct modulation which satisfies the predetermined extinction ratio and eye mask requirement for the forty-first means in the drive current fluctuation using the parameter value computed in step S402-4 and outputting the parameter value to the forty-eighth means S402-9: step of predicting and computing the parameter value for determining the relationship among the drive current, device temperature, and RF amplitude during the direct modulation which satisfies the predetermined extinction ratio and eye mask requirement for the forty-first means in the drive current fluctuation using the parameter value computed in step S402-5 and outputting the parameter value to the forty-eighth means S402-10: step of computing the latest drive current or optical output power and the latest device temperature of the forty-first means at which the optical output wavelength and optical output power become the specified values at the same time during the direct modulation which satisfies the predetermined extinction ratio and eye mask requirement in the drive current fluctuation of the forty-first means using the parameter value computed in step S402-2 and the parameter value computed in step S402-8 and computing the latest RF amplitude in the latest drive current or optical output power and the latest device temperature using the parameter value computed in step S402-9

S402-11: step of setting the drive current or optical output power computed in step S402-10 to the forty-second means as the new target value in the drive current fluctuation, setting the device temperature computed in step S402-10 to the forty-third means as the new target value in the drive current fluctuation, and setting the RF amplitude computed in step S402-10 to the forty-fourth means as the new target value in the drive current fluctuation S402-12: step of inputting the allowable fluctuation range of the specified drive current S402-13: step of inputting the specified optical output wavelength and optical output power S403-0: start step S403-1: step of determining whether or not the value stored in the forty-ninth means is used S403-2: step of determining whether or not the latest drive current or optical output power, device temperature, and RF amplitude are stored in the forty-ninth means S403-3: step of reading the latest drive current or optical output power, device temperature, and RF amplitude stored in the forty-ninth means and outputting the drive current or optical output power, device temperature, and RF amplitude to the forty-second means, forty-third means, and forty-fourth means respectively S403-4: step of reading at least one value of the optical output wavelength for the drive current and device temperature during the direct modulation which satisfies the predetermined extinction ratio and eye mask requirement, at least one value concerning these three, or at least one parameter value for determining the relationship among these three, which are stored in the forty-fifth means, and outputting the value to the forty-eighth means S403-5: step of computing the parameter value for determining the relationship among the drive current, device temperature, and optical output wavelength during the direct modulation which satisfies the predetermined extinction ratio and eye mask requirement for the forty-first means using at least one value inputted from the forty-fifth means S403-6: step of reading at least one value of the optical output power for the drive current and device temperature during the direct modulation which satisfies the predetermined extinction ratio and eye mask requirement, at least one value concerning these three, at least one parameter value for determining the relationship among these three, at least one value of the RF amplitude for the drive current and device temperature during the direct modulation which satisfies the predetermined extinction ratio and eye mask requirement, at least one value concerning these three, or at least one parameter value for determining the relationship among these three, which are stored in the forty-fifth means, and outputting the value to the forty-seventh means S403-7: step of computing the parameter value for determining the relationship among the drive current, device temperature, and optical output power before the drive current fluctuation during the direct modulation which satisfies the predetermined extinction ratio and eye mask requirement for the forty-first means using at least one value inputted from the forty-fifth means S403-8: step of computing the parameter value for determining the relationship among the drive current, device temperature, and RF amplitude before the drive current fluctuation during the direct modulation which satisfies the predetermined extinction ratio and eye mask requirement for the forty-first means using at least one value inputted from the forty-fifth means S403-9: step of monitoring the drive current of the forty-first means by the forty-seventh means to compare the drive current to the allowable fluctuation range of the separately specified drive current S403-10: step of determining whether or not the monitored drive current is located in the drive current allowable fluctuation range S403-11: step of predicting and computing the parameter value for determining the relationship among the drive current, device temperature, and optical output power during the direct modulation which satisfies the predetermined extinction ratio and eye mask requirement for the forty-first means in the drive current fluctuation using the parameter value computed in step S403-7 and outputting the parameter value to the forty-eighth means S403-12: step of predicting and computing the parameter value for determining the relationship among the drive current, device temperature, and RF amplitude during the direct modulation which satisfies the predetermined extinction ratio and eye mask requirement for the forty-first means in the drive current fluctuation using the parameter value computed in step S403-8 and outputting the parameter value to the forty-eighth means S403-13: step of computing the latest drive current or optical output power and the latest device temperature of the forty-first means at which the optical output wavelength and optical output power become the specified values at the same time during the direct modulation which satisfies the predetermined extinction ratio and eye mask requirement in the drive current fluctuation of the forty-first means using the parameter value computed in step S403-5 and the parameter value computed in step S403-11, and computing the latest RF amplitude in the latest drive current or optical output power and the latest device temperature using the parameter value computed in step S403-12

S403-14: step of storing the drive current or optical output power, device temperature, and RF amplitude computed in step S403-13 in the forty-ninth means S403-15: step of setting the drive current or optical output power computed in step S403-13 or inputted in step S403-3 to the forty-second means as the new target value in the drive current fluctuation, setting the device temperature computed in step S403-13 or inputted in step S403-3 to the forty-third means as the new target value in the drive current fluctuation, and setting the RF amplitude which is computed in step S403-13 or inputted in step S403-3 to the forty-fourth means as the new target value in the drive current fluctuation S403-16: step of inputting the allowable fluctuation range of the specified drive current S403-17: step of inputting the specified optical output wavelength and optical output power S404-0: start step S404-1: step of monitoring the optical output wavelength and optical output power of the optical output generated by the forty-first means S404-2: step of comparing the optical output wavelength and optical output power monitored in step S404-1 to the specified optical output wavelength range and optical output power range respectively S404-3: step of determining whether the monitored optical output wavelength and optical output power are located in the optical output wavelength range and optical output power range respectively S404-4: step of outputting the result of the comparison determination in step S404-3 as the status display S404-5: step of outputting the result of the comparison determination in step S404-3 as the abnormal warning S404-6: step of inputting the specified optical output wavelength range and optical output power range respectively S405-0: start step S405-1: step of inputting the operating ranges of the drive current and device temperature S405-2: step of internally dividing the drive current operating range ($i_1 \leq i \leq i_2$) by p:1-p and 1-p:p to determine drive currents $i_{s1}$ and $i_{s2}$ in the internally dividing point using an arbitrary value p (p is a specific coordinate of an internally dividing point in the drive current operating range, and p is a real number satisfying 0<p<1) and thereby determining a minimum value $|\delta\lambda_0|_{i=i1\ or\ i2}$ and a maximum value $|\delta\lambda_0|_{i=(i1+i2)/2}$ of the approximate error between the optical output wavelength characteristics for the drive current during the direct modulation satisfying the predetermined extinction ratio and eye mask requirement and optical output wavelength characteristics approximated by the drive current linear function, determining the value p such that the approximate errors are equal to each other, and determining the drive currents $i_{s1}$ and $i_{s2}$ to the drive currents at the measuring points while the internally dividing points are set at the measuring points at that time S405-3: step of internally dividing the device temperature operating range ($T_1 \leq T \leq T_2$) by p:1-p and 1-p:p to determine device temperatures $T_{s1}$ and $T_{s2}$ in the measuring points using the value p determined in step S405-2

S405-4: step of selecting three points as the measuring points of the optical output wavelength characteristics, optical output power characteristics, and RF amplitude characteristics during the direct modulation which satisfies the predetermined extinction ratio and eye mask requirement from the points $(i_{s1}, T_{s1})$, $(i_{s1}, T_{s2})$, $(i_{s2}, T_{s1})$, and $(i_{s2}, T_{s2})$ determined in steps s405-2 to s405-3

S405-5: step of inputting the operating ranges of the specified drive current and device temperature S406-0: start step S406-1: step of inputting the operating ranges of the drive current and device temperature S406-2: step of internally dividing the device temperature operating range ($T_1 \leq T \leq T_2$) by q:1-q and 1-q:q to determine drive currents $T_{s1}$ and $T_{s2}$ in the internally dividing point using an arbitrary value q (q is a specific coordinate of an internally dividing point in the device temperature operating range, and q is a real number satisfying 0<q<1) and thereby determining a minimum value $|\delta\lambda_0|_{T=T1\ or\ T2}$ and a maximum value $|\delta\lambda_0|_{T=(T1+T2)/2}$ of the approximate error between the optical output wavelength characteristics for the device temperature during the direct modulation satisfying the predetermined extinction ratio and eye mask requirement and optical output wavelength characteristics approximated by the device temperature linear function for the device temperature during the direct modulation which satisfies the predetermined extinction ratio and eye mask requirement, determining the value q such that the approximate errors are equal to each other, and determining the device temperature $T_{s1}$ and $T_{s2}$ to the device temperatures at the measuring points while the internally dividing points are set at the measuring points at that time S406-3: step of internally dividing the device current operating range ($i_1 \leq i \leq i_2$) by q:1-q and 1-q:q to determine device currents $i_{S1}$ and $i_{S2}$ in the measuring points using the value q determined in step S406-2 s406-4: step of selecting three points as the measuring points of the optical output wavelength characteristics, optical output power characteristics, and RF amplitude characteristics which satisfies the predetermined extinction ratio and eye mask requirement from the points $(i_{s1}, T_{s1})$, $(i_{s1}, T_{s2})$, $(i_{s2}, T_{s2})$, and $(i_{s2}, T_{s2})$ determined in steps s406-2 to s406-3

S406-5: step of inputting the operating ranges of the specified drive current and device temperature

BEST MODE FOR CARRYING OUT THE INVENTION

Preferred embodiments of the invention will be described below with reference to the accompanying drawings. The following embodiments are described only by way of example of the configutration of the invention, and the invention is not limited to the following embodiments.

First Embodiment

Figure 4:
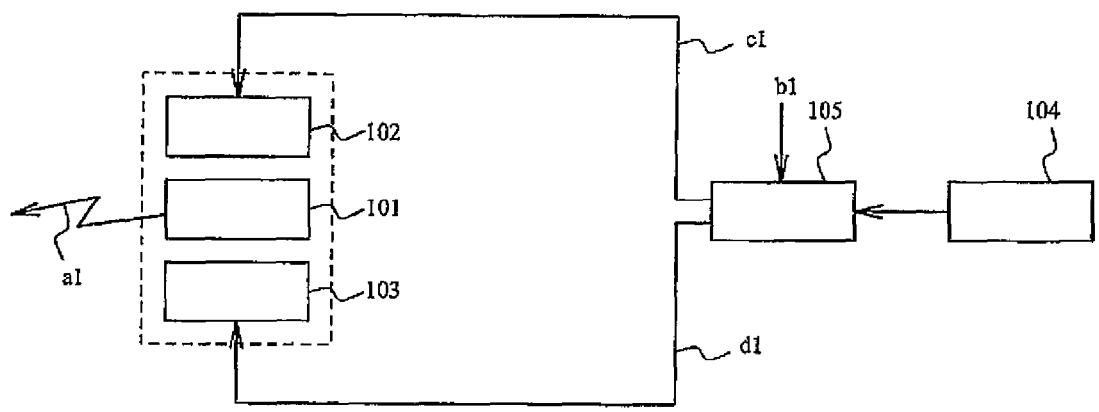
FIG. 4 is a block diagram showing a first embodiment of an optical communication light source unit according to the invention.

FIG. 4 shows a configuration of a first embodiment corresponding to first and seventh aspects of the invention.

In FIG. 4, the reference numeral 101 designates the eleventh means including a light emitting device such as LD to emit the light. The reference numeral 102 designates the twelfth means for automatically controlling the drive current or optical output power of the light emitting device constituting the eleventh means 101 by feedback control or the like such that the drive current or optical output power is maintained at a given target value. The reference numeral 103 designates the thirteenth means for automatically controlling the device temperature of the light emitting device constituting the eleventh means 101 by the feedback control or the like such that the device temperature is maintained at a given target value.

The reference numeral 104 designates the fourteenth means. At least one value of the optical output wavelength for the drive current and device temperature, at least one value concerning these three, or at least one parameter value for determining the relationship among these three is stored in the fourteenth means 104 in the light emitting device constituting the eleventh means 101.

The reference numeral 105 designates the fifteenth means for determining the drive current or optical output power and the device temperature at which both the optical output wavelength and optical output power of the light emitting device become the separately specified values from the relationship among the drive current, device temperature, and optical output wavelength of the light emitting device and the relationship among the drive current, device temperature, and optical output power of the light emitting device. The relationship among the drive current, device temperature, and optical output wavelength of the light emitting device and the relationship among the drive current, device temperature, and optical output power of the light emitting device are determined by at least one value for the light emitting device constituting the eleventh means 101. At least one value is stored in the fourteenth means 104.

The reference numeral a1 designates the light from the eleventh means 101, the reference numeral b1 designates the specified optical output wavelength and optical output power, the reference numeral c1 designates the drive current or optical output power determined by the fifteenth means 105, and the reference numeral d1 designates the device temperature determined by the fifteenth means 105.

Figure 5:
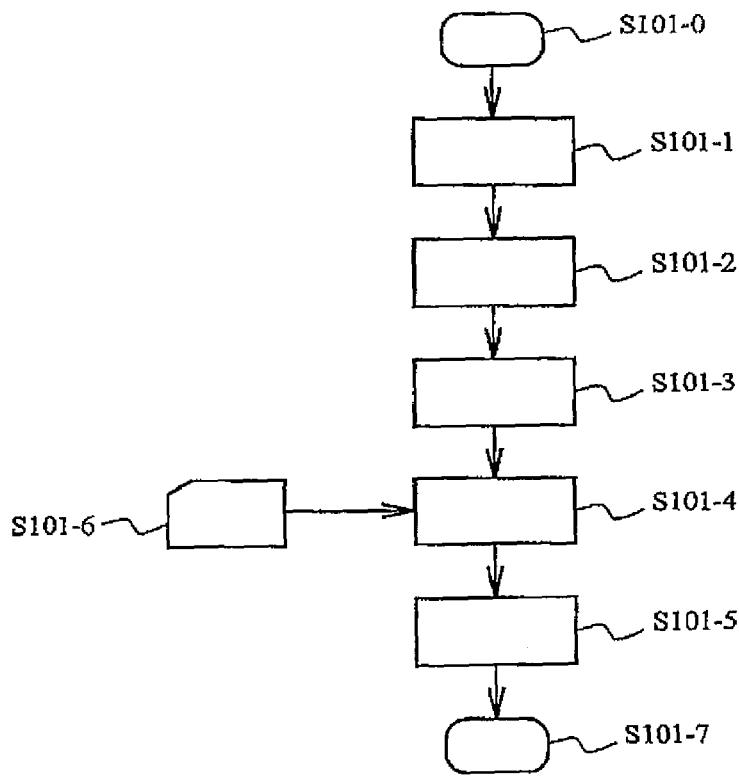
FIG. 5 is a flowchart showing an operating procedure of the first embodiment.

FIG. 5 shows an operating procedure of the first embodiment.

In S101-1, at least one value of the optical output wavelength for the drive current and device temperature, at least one value concerning these three, or at least one parameter value for determining the relationship among these three, and at least one value of the optical output power for the drive current and device temperature, at least one value concerning these three, or at least one parameter value for determining the relationship among these three, which is stored in the fourteenth means 104, are read and outputted to the fifteenth means 105.

In S101-2, the fifteenth means 105 computes the parameter value for determining the relationship among the drive current, device temperature, and optical output wavelength for the light emitting device in the eleventh means 101 using the at least one value inputted from the fourteenth means 104.

In S101-3, similarly, the fifteenth means 105 computes the parameter value for determining the relationship among the drive current, device temperature, and optical output power for the light emitting device in the eleventh means 101 using the at least one value inputted from the fourteenth means 104.

Then, in S101-4, the fifteenth means 105 computes the drive current or optical output power c1 and the device temperature d1 at which the optical output wavelength and optical output power of the light emitting device become the specified values at the same time using the parameter values computed in S101-2 and S101-3 based on the separately specified optical output wavelength and optical output power b1.

In S101-5, the drive current or optical output power c1 computed in S101-4 is set as the target value to the twelfth means 102, and the device temperature d1 computed in S101-4 is set as the target value to the thirteenth means 103.

Thus, the optical output wavelength and optical output power of the light a1 from the eleventh means 101 can be set and controlled as the specified value.

For example, the above-described operating procedures S101-1 to S101-4 can be realized as follows.

Figure 3:
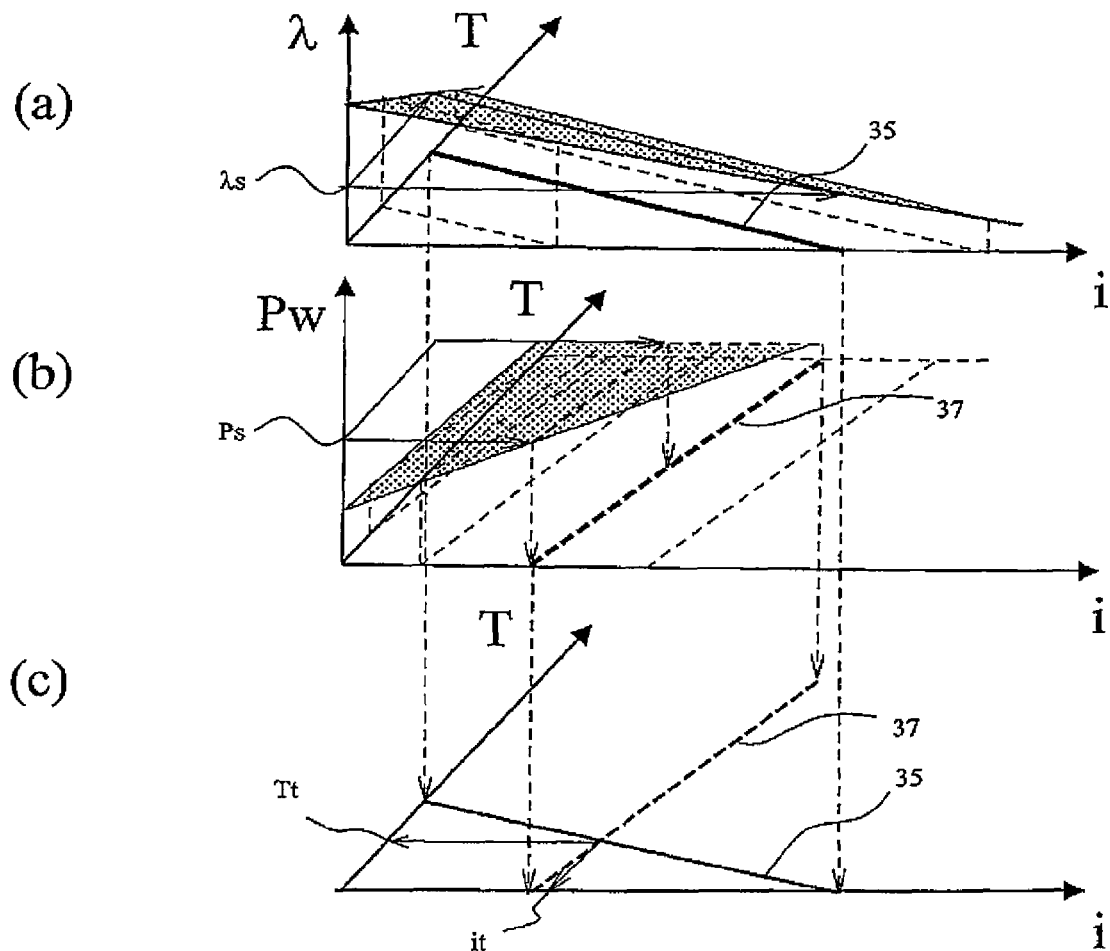
FIG. 3 is an explanatory view showing an outline of setting and controlling the optical output wavelength and optical output power of a light emitting device according to the invention.

In this case, the case in which the optical output wavelength characteristics of the light emitting device is well expressed by a plane (linear function of drive current and device temperature) in a three-dimensional space having coordinate axes of the drive current, device temperature, and optical output wavelength and similarly the optical output power characteristics of the light emitting device is well expressed by a plane (linear function of drive current and device temperature) in a three-dimensional space having coordinate axes of the drive current, device temperature, and optical output power (in FIG. 3, the surfaces expressing the characteristics become the plane respectively and thereby the isopleth becomes linear) will be described. The case in which the values of the optical output wavelength and optical output power of the light emitting device for the determined drive current and device temperature are stored in the fourteenth means 104 will be described by way of example.

In S101-1, these values stored in the fourteenth means 104 are read and inputted to the fifteenth means 105.

In S101-2, the fifteenth means 105 computes a coefficient of the linear function of the optical output wavelength characteristics of the light emitting device using the values inputted from the fourteenth means 104.

Similarly, in S101-3, the fifteenth means 105 computes a coefficient of the linear function of the optical output power characteristics of the light emitting device using the values inputted from the fourteenth means 104.

In this case, the coefficients computed in S101-2 and S101-3 are the parameter values for determining the above-described relationship among the drive current, device temperature, and optical output wavelength and the relationship among the drive current, device temperature, and optical output power.

In S101-4, because all the coefficients of the equations (linear equations) shown in FIG. 3(c) which express the optical output wavelength contour line and optical output power contour line are determined from the coefficients computed in S101-2 and S101-3 and the specified optical output wavelength and optical output power, a coordinate value (drive current and device temperature) of an intersecting point of the two isopleths is computed by utilizing these coefficients.

In the above example, the case in which the dependence of the optical output wavelength and optical output power of the light emitting device on the drive current and the dependence of the optical output wavelength and optical output power on the device temperature are well expressed by the planes (linear function of drive current and device temperature) is described for the sake of simplification. However, even in the case in which the dependence of the optical output wavelength and optical output power of the light emitting device on the drive current and the dependence of the optical output wavelength and optical output power on the device temperature are well expressed by a quadratic surface or a more general function, or well expressed by a plane or a curved surface in each of divided plural regions, the coefficients of the functions expressing the characteristics can numerically be determined by the similar procedure, so that the effect of the invention is not changed.

Second Embodiment

Figure 6:
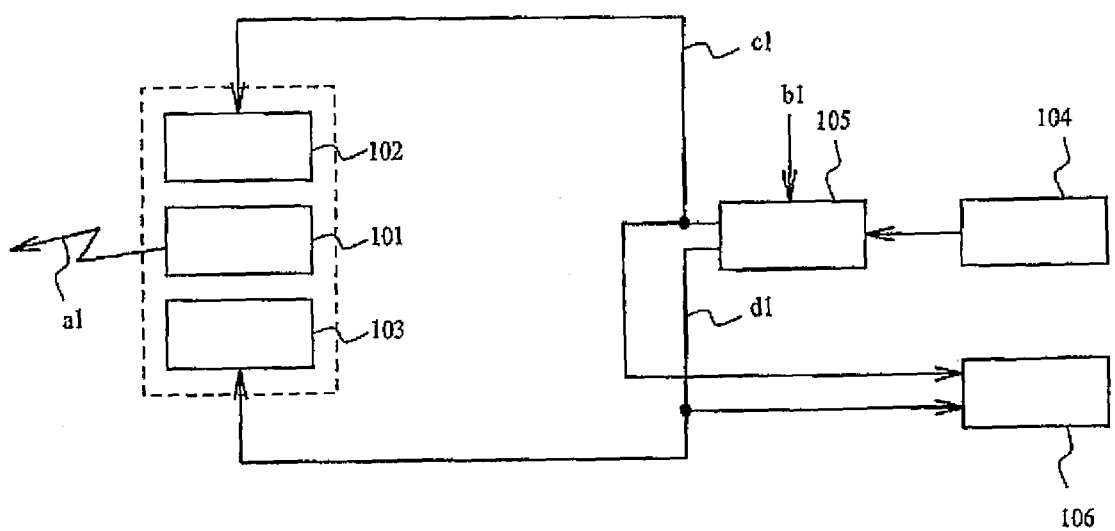
FIG. 6 is a block diagram showing a second embodiment of the optical communication light source unit according to the invention.

FIG. 6 shows a configuration of a second embodiment corresponding to second and eighth aspects of the invention. The configuration shown in FIG. 6 differs from the configuration of the first embodiment shown in FIG. 4 in that the sixteenth means 106, in which the drive current or optical output power c1 and the device temperature d1 which are determined by the fifteenth means 105 are stored, is added.

Figure 7:
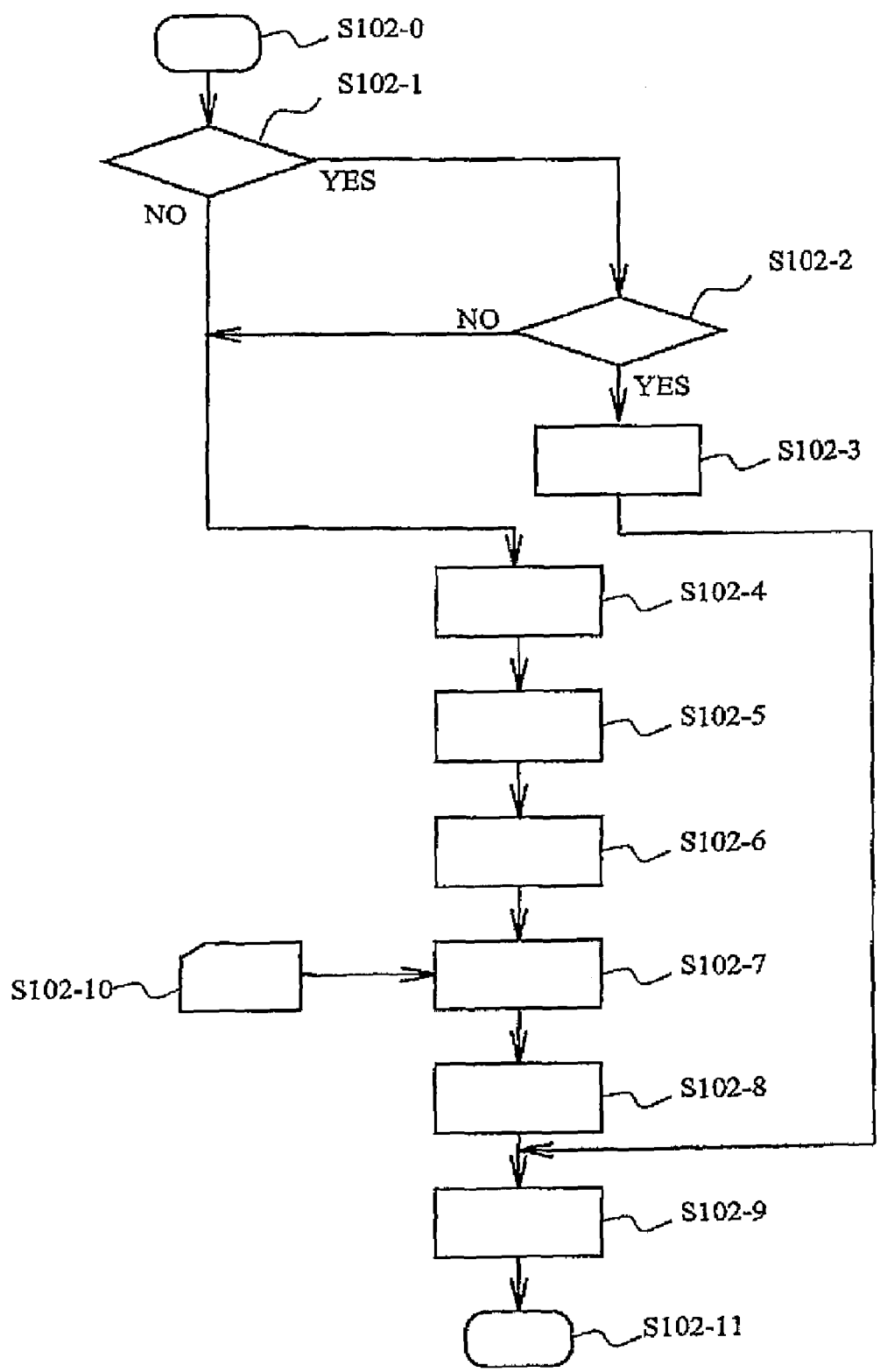
FIG. 7 is a flowchart showing the operating procedure of the second embodiment.

FIG. 7 shows an operating procedure of the second embodiment. The portions which are different from the operating procedure shown in FIG. 5 will mainly be described below.

In S102-1, in consideration of warm start of the optical communication light source unit, it is determined whether or not the value stored in the sixteenth means 106 is used.

When the value is used, it is further determined in S102-2 whether or not the drive current or optical output power c1 and the device temperature d1 which are determined by the fifteenth means 105 are stored in the sixteenth means 106.

When the drive current or optical output power c1 and the device temperature d1 which are determined by the fifteenth means 105 are stored in the sixteenth means 106, in S102-3, the values are read and outputted to the twelfth means 102 and the thirteenth means 103 respectively.

Then, in S102-9, the twelfth means 102 and the thirteenth means 103 set the values inputted from the sixteenth means 106 at the target values respectively.

On the other hand, when the value stored in the sixteenth means 106 is not used, or when the drive current or optical output power c1 and the device temperature d1 which are determined by the fifteenth means 105 are not stored in the sixteenth means 106, procedures S102-4 to S102-7 similar to the procedures S101-1 to S101-4 in the first embodiment are performed. Then, in S102-8, the drive current or optical output power c1 and the device temperature d1 which are determined in S102-7 are stored in the sixteenth means 106. The next S102-9 is similar to the procedure S101-5 in the first embodiment.

Third Embodiment

Figure 8:
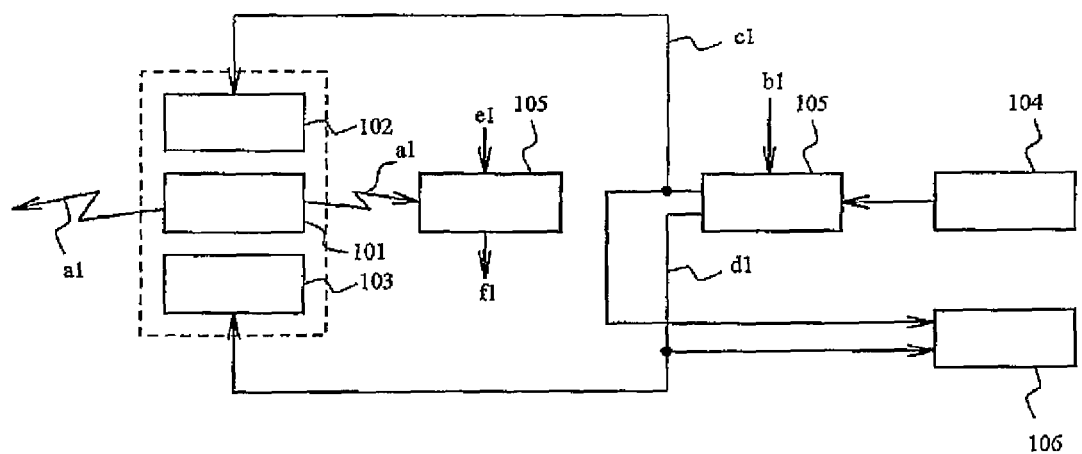
FIG. 8 is a block diagram showing a third embodiment of the optical communication light source unit according to the invention.

FIG. 8 shows a configuration of a third embodiment corresponding to third and ninth aspects of the invention. The configuration shown in FIG. 8 differs from the configuration of the second embodiment shown in FIG. 6 in that the seventeenth means 107, which monitors both or one of the optical output wavelength and optical output power of the light a1 from the eleventh means 101, makes the comparison determination whether or not the optical output wavelength and optical output power are located in the separately specified optical output wavelength range and optical output power range respectively, and outputs the comparison determination result, is added. The case in which comparison determination is made to both the optical output wavelength and the optical output power will be described in the third embodiment.

Figure 9:
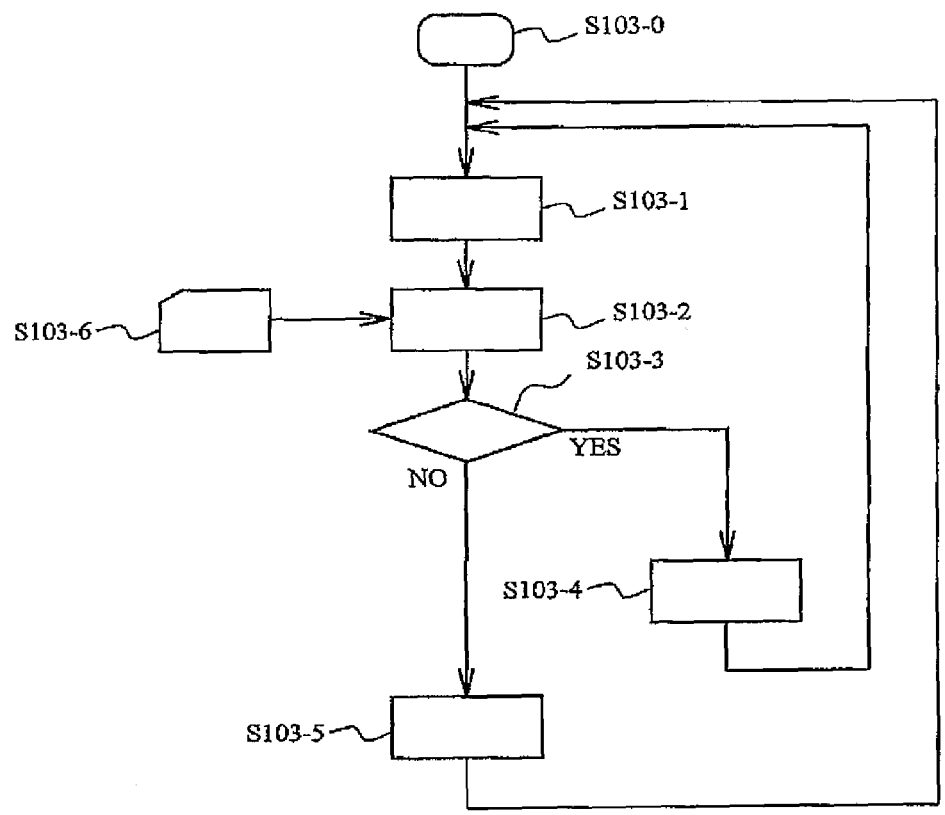
FIG. 9 is a flowchart showing the operating procedure of the third embodiment.

FIG. 9 shows an operating procedure of the third embodiment.

After the setting is performed such that the optical output wavelength and optical output power become the specified optical output wavelength and optical output power b1 by the procedures similar to the operating procedures S101-1 to S101-5 in the first embodiment or the operating procedures S102-1 to S102-9 in the second embodiment, the optical output wavelength and optical output power are monitored for the light a1 from the eleventh means 101.

In S103-1, the seventeenth means 107 monitors both the optical output wavelength and optical output power of the light a1 from the eleventh means 101 which is driven while the drive current or optical output power c1 and the device temperature d1 are set as the target values. The drive current or optical output power c1 and the device temperature d1 are determined by the fifteenth means 105.

Then, in S103-2, the optical output wavelength and optical output power monitored in S103-1 are compared to the separately specified optical output wavelength range and optical output power range e1.

The determination is made in S103-3. When the monitored optical output wavelength and optical output power are located in the specified optical output wavelength range and optical output power range respectively, the comparison determination result f1 is outputted as the status display in S103-4, and the procedure returns to S103-1.

When the monitored optical output wavelength and optical output power are not located in the specified optical output wavelength range and optical output power range respectively, the comparison determination result f1 is outputted as the abnormal warning in S103-5, and the procedure returns to S103-1.

In the above-described operating procedures, for example, S103-1 can be realized as follows. The optical output of the light emitting device in the eleventh means 101 is inputted to optical band transmission means such as an optical filter which transmits the light having the specified optical output wavelength range. The output is further inputted to photoelectric conversion means such as a photodiode which converts the optical power of the input light into photocurrent. The optical output wavelength and optical output power are monitored and compared by monitoring and comparing the photocurrent obtained in the above-described manner. That is, the above-described comparison is performed by comparing the photocurrent range and the photocurrent obtained by the above monitoring. The photocurrent range is determined from the previously known optical wavelength transmission characteristics of the optical band transmission means, the previously known conversion characteristics of the photoelectric conversion means, the specified optical output wavelength range, and optical output power range respectively.

Other Embodiments

In the first embodiment to the third embodiment, the case where the eleventh means 101 includes one light emitting device is described for the sake of simplification. However, even in the case where the eleventh means 101 may include the plural light emitting devices, the twelfth means 102 may automatically control the drive current or optical output power of each light emitting device such that the drive current or optical output power is maintained at the target value given to each light emitting device, and the thirteenth means 103 may automatically control the device temperature of each light emitting device such that the device temperature is maintained at the target value given to each light emitting device, at least one value of the optical output wavelength for the drive current and device temperature, at least one value concerning these three, or at least one parameter value for determining the relationship among these three, and at least one value of the optical output power for the drive current and device temperature, at least one value concerning these three, or at least one parameter value for determining the relationship among these three are stored in the fourteenth means 104 for each light emitting device constituting the eleventh means 101, the fifteenth means 105 determines the drive current or optical output power and the device temperature at which both the optical output wavelength and optical output power become the separately specified values in each light emitting device from the relationship among the drive current, device temperature, and optical output wavelength in each light emitting device and the relationship among the drive current, device temperature, and optical output power in each light emitting device, the relationship being determined by at least one value for each light emitting device constituting the eleventh means 101 stored in the fourteenth means 104 (fourth and tenth aspects of the invention), and thereby the optical output wavelength and the optical output power can similarly be set and controlled for each light emitting device constituting the eleventh means 101. Alternatively, the drive current or optical output power and the device temperature which are determined by the fifteenth means 105 are stored in the sixteenth means 106 in each light emitting device (fifth and eleventh aspects of the invention), and thereby the setting and control including the case where the warm start of the optical output wavelength and optical output power is performed to each light emitting device constituting the eleventh means 101 can similarly be performed. Alternatively, the seventeenth means 107 monitors both or one of the optical output wavelength and optical output power of the optical output generated by each light emitting device constituting the eleventh means 101, makes the comparison determination whether or not the optical output wavelength and the optical output power are located in the separately specified optical output wavelength range and optical output power range respectively, and outputs the comparison determination result (sixth and twelfth aspects of the invention), and thereby both or one of the optical output wavelength and optical output power can be monitored for each light emitting device constituting the eleventh means 101. Therefore, the effect of the invention is not changed. Although the optical output wavelengths separately specified for the plural light emitting devices constituting the eleventh means 101 are usually different from one another, an arbitrary optical output wavelength including all the same wavelength or including partially the same wavelength can obviously be specified to each light emitting device. Although the optical output powers separately specified for the plural light emitting devices constituting the eleventh means 101 are usually similar to one another, an arbitrary optical output power including all the different power or including partially the different power can obviously be specified to each light emitting device.

The case where at least one value of itself (raw value) is stored in the fourteenth means 104 in the first embodiment to the third embodiment is described. However, the effect of the invention is not changed, even if a coding process such as normalization, scramble, bit inversion, and encryption is previously performed to all the values or at least one value to store the value in the fourteenth means 104 and then the value is used by performing a decoding process such as denormalization, descramble, bit inversion, and encryption decoding after the value is read from the fourteenth means 104.

Similarly, in the second embodiment and the third embodiment, the case where the drive current or optical output power c1 and the device temperature d1 of themselves (raw values) which are determined by the fifteenth means 105 are stored in the sixteenth means 106, is described. However, the effect of the invention is not changed, even if the coding process such as the normalization, the scramble, the bit inversion, and the encryption is previously performed to all the values or at least one value to store the value in the sixteenth means 106 and then the value is used by performing the decoding process such as the denormalization, the descramble, the bit inversion, and the encryption decoding after the value is read from the sixteenth means 106.

In the third embodiment, the effect of the invention is not changed, even if the comparison determination and the result output thereof are performed for both or one of the optical output wavelength and the optical output power. Furthermore, the effect of the invention is not changed, even if both or one of the status display and the abnormal warning is outputted for the optical output wavelength and the optical output power.

The effect of the invention is not changed even if the procedures S101-2 and S101-3 in the first embodiment, the procedures S102-1 and S102-2 in the second embodiment, the procedures S102-5 and S102-6 in the second embodiment, and the procedures S102-8 and S102-9 in the second embodiment are performed in the adverse order, respectively.

Fourth Embodiment

Figure 13:
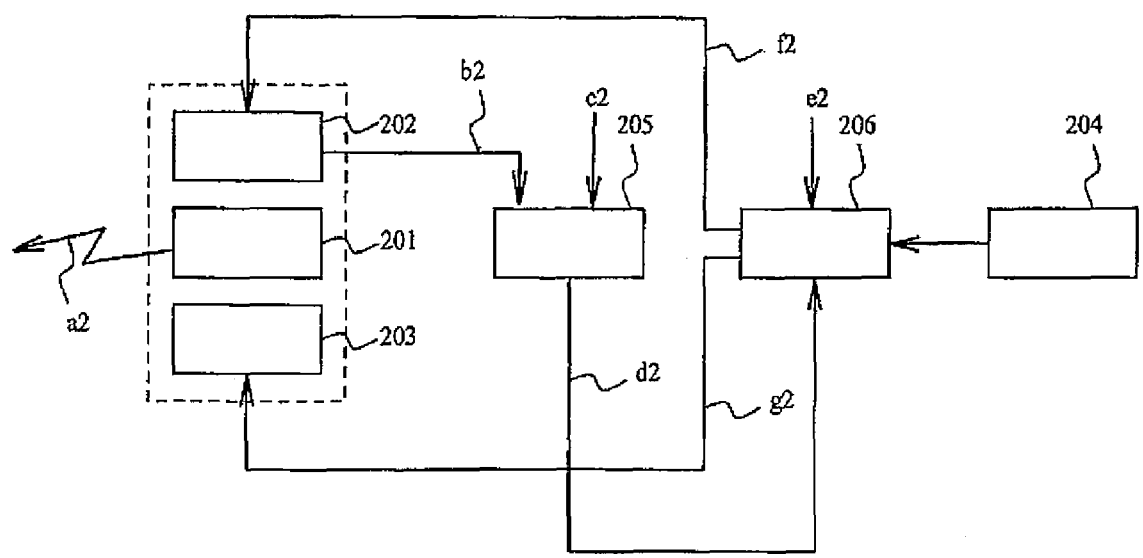
FIG. 13 is a block diagram showing a fourth embodiment of the communication light source unit according to the invention.

FIG. 13 shows a configuration of a fourth embodiment corresponding to thirteenth and nineteenth aspects of the invention.

In FIG. 13, the reference numeral 201 designates the twenty-first means including a light emitting device such as LD to emit the light. The reference numeral 202 designates the twenty-second means for automatically controlling the optical output power of the light emitting device constituting the twenty-first means 201 by the feedback control or the like such that the optical output power is maintained at a given target value. The reference numeral 203 designates the twenty-third means for automatically controlling the device temperature of the light emitting device constituting the twenty-first means 201 by the feedback control or the like such that the device temperature is maintained at a given target value.

The reference numeral 204 designates the twenty-fourth means in which at least one value of the optical output wavelength for the drive current and device temperature, at least one value concerning these three, or at least one parameter value for determining the relationship among these three and at least one value of the optical output power for the drive current and device temperature, at least one value concerning these three, or at least one parameter value for determining the relationship among these three are stored in the light emitting device constituting the twenty-first means 201.

The reference numeral 205 designates the twenty-fifth means for monitoring the drive current of the light emitting device constituting the twenty-first means 201. The twenty-fifth means 205 makes the comparison determination whether or not the drive current is located in the separately specified allowable fluctuation range. When the drive current is not located in the separately specified allowable fluctuation range, the twenty-fifth means 205 predicts the relationship among the drive current, device temperature, and optical output power in the drive current fluctuation of the light emitting device from the relationship among the drive current, device temperature, and optical output power of the light emitting device. The relationship among is determined at least one value for the light emitting device constituting the twenty-first means 201, the value being stored in the twenty-fourth means 204.

The reference numeral 206 designates the twenty-sixth means for determining the latest drive current or optical output power and the latest device temperature at which both the optical output wavelength and the optical output power in the drive current fluctuation of the light emitting device become the separately specified values from the relationship among the drive current, device temperature, and optical output wavelength determined by at least one value stored in the twenty-fourth means 204 for the light emitting device constituting the twenty-first means 201 and the relationship among the drive current, device temperature, and optical output power in the drive current fluctuation of the light emitting device predicted by the twenty-fifth means 205.

The reference numeral a2 designates the optical output from the twenty-first means 201, the reference numeral b2 designates the drive current of the light emitting device constituting the twenty-first means 201, the reference numeral c2 designates the allowable fluctuation range of the separately specified drive current, the reference numeral d2 designates the parameter value for determining the relationship among the drive current, device temperature, and optical output power in the light emitting device drive current fluctuation predicted by the twenty-fifth means 205, the reference numeral e2 designates the separately specified optical output wavelength and optical output power, the reference numeral f2 designates the latest drive current or optical output power determined by the twenty-sixth means 206, and the reference numeral g2 designates the latest device temperature determined by the twenty-sixth means 206.

Figure 14:
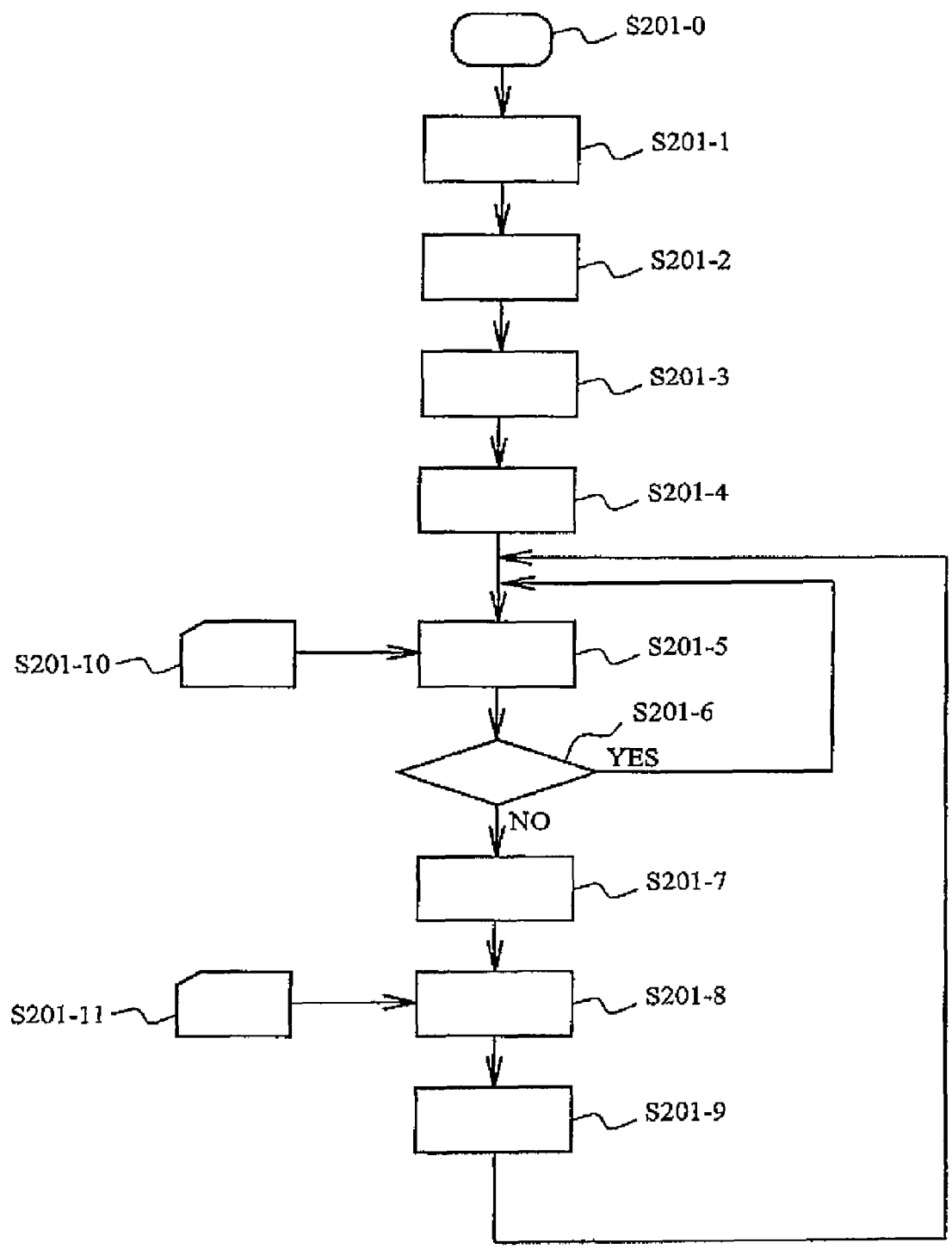
FIG. 14 is a flowchart showing the operating procedure of the fourth embodiment.

FIG. 14 shows an operating procedure of the fourth embodiment.

In S201-1, at least one value of the optical output wavelength for the drive current and device temperature, at least one value concerning these three, or at least one parameter value for determining the relationship among these three, which is stored in the fourteenth means 204, is read and outputted to the twenty-sixth means 206.

In S201-2, the twenty-sixth means 206 computes the parameter value for determining the relationship among the drive current, device temperature, and optical output wavelength for the light emitting device constituting the twenty-first means using the at least one value inputted from the twenty-fourth means 204.

In S201-3, at least one value of the optical output power for the drive current and device temperature, at least one value concerning these three, or at least one parameter value for determining the relationship among these three, which is stored in the fourteenth means 204, is read and outputted to the twenty-fifth means 205.

In S201-4, the twenty-fifth means 205 computes the parameter value for determining the relationship among the drive current, device temperature, and optical output power before the drive current fluctuation for the light emitting device constituting the twenty-first means 201 using the at least one value inputted from the twenty-fourth means 204.

In S201-5, the twenty-fifth means 205 monitors the drive current b2 of the light emitting device constituting the twenty-first means 201 to make the comparison determination whether or not the drive current is located in the allowable fluctuation range c2 of the separately specified drive current.

In S201-6, the procedure S201-5 is performed again when the drive current b2 is located in the allowable fluctuation range c2, and the procedure goes to S201-7 when the drive current b2 is not located in the allowable fluctuation range.

In S201-7, the twenty-fifth means 205 predicts and computes the parameter value d2 for determining the relationship among the drive current, device temperature, and optical output power for the light emitting device constituting the twenty-first means 201 in the drive current fluctuation using the parameter value computed in S201-4, and the twenty-fifth means 205 outputs the parameter value d2 to the twenty-sixth means 206.

In S201-8, on the basis of the separately specified optical output wavelength and optical output power, the twenty-sixth means 206 computes the latest drive current or optical output power f2 and the latest device temperature g2 at which both the optical output wavelength and the optical output power in the drive current fluctuation of the light emitting device constituting the twenty-first means 201 become the specified values e2 at the same time using the parameter value computed in S201-2 and the parameter value d2 predicted in S201-7.

In S201-9, the latest drive current or optical output power f2 computed in S201-8 is set to the twenty-second means 202 as the new target value in the drive current fluctuation, and the latest device temperature g2 computed in S201-8 is set to the twenty-third means 203 as the new target value. Then, the procedure returns to S201-5.

Thus, even in the drive current fluctuation, the adjustment and control can automatically be performed such that both the optical output wavelength and the optical output power of the light a2 from the twenty-first means 201 become the separately specified values e2.

For example, the above-described operating procedures S201-1 to S201-4, S201-5 to S201-6, and S201-7 to S201-8 can be realized as follows.

First the operating procedures S201-1 to S201-4 will be described.

Figure 10:
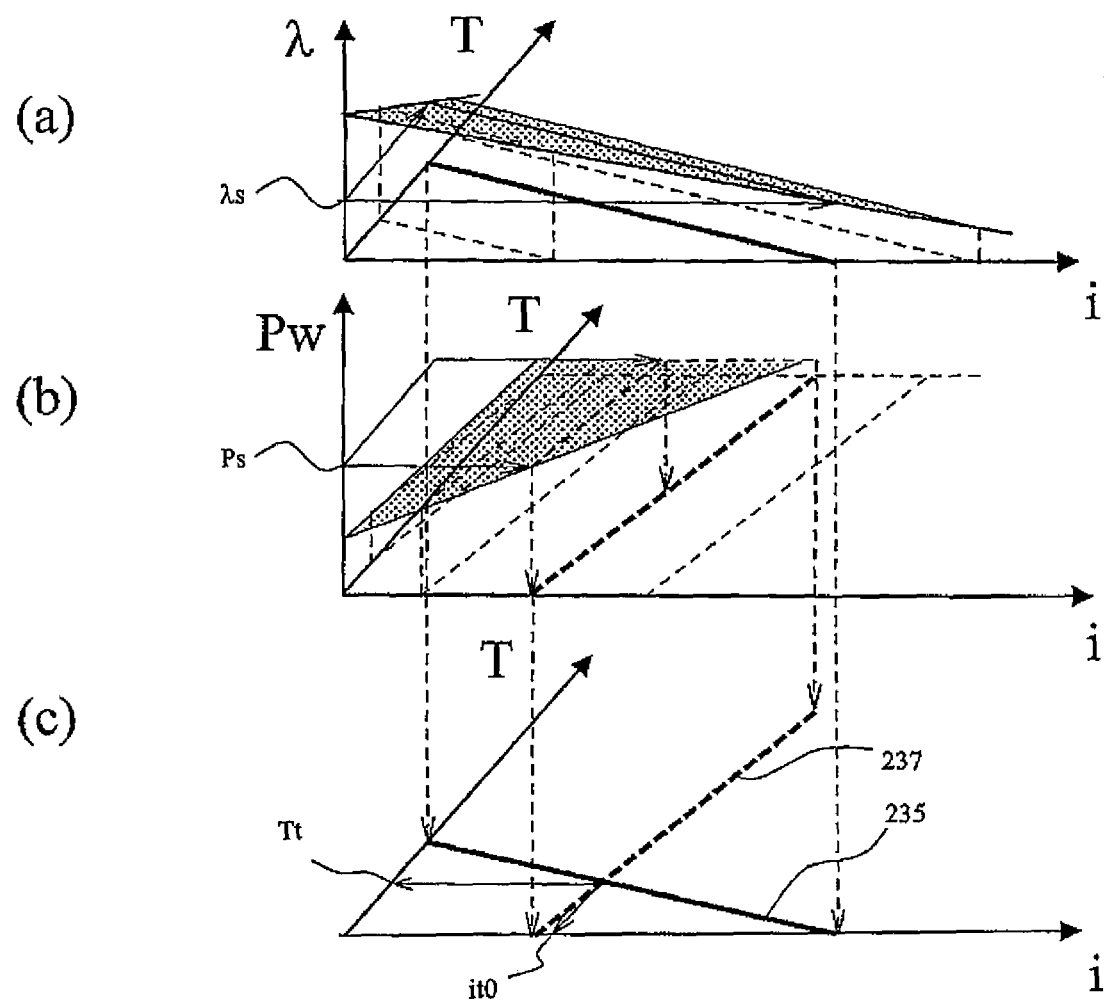
FIG. 10 is an explanatory view (before drive current fluctuation) showing an outline of controlling the optical output wavelength and optical output power of the light emitting device according to the invention.

In this case, the case in which the optical output wavelength characteristics of the light emitting device is well expressed by a plane (linear function of drive current and device temperature) in a three-dimensional space having coordinate axes of the drive current, device temperature, and optical output wavelength and similarly the optical output power characteristics of the light emitting device is well expressed by a plane (linear function of drive current and device temperature) in a three-dimensional space having coordinate axes of the drive current, device temperature, and optical output power (in FIG. 10, the surfaces expressing the characteristics become the plane respectively and thereby the isopleth becomes linear) will be described. The case in which the values of the optical output wavelength and optical output power of the light emitting device for the determined drive current and device temperature are stored in the twenty-fourth means 204 will be described by way of example.

In S201-1, the optical output wavelength value of the light emitting device, stored in the twenty-fourth means 204, for the determined drive current and device temperature are read and inputted to the twenty-sixth means 206.

In S201-2, the twenty-sixth means 206 computes the coefficient of the linear function of the optical output wavelength characteristics of the light emitting device using the values inputted from the twenty-fourth means 204.

Similarly, in S201-3, the light emitting device optical output power value, stored in the twenty-fourth means 204, for the determined drive current and device temperature are read and inputted to the twenty-fifth means 205.

In S201-4, the twenty-fifth means 205 computes the coefficient of the linear function expressing the optical output power characteristics before the drive current fluctuation of the light emitting device using the values inputted from the twenty-fourth means 204. In this case, the coefficients computed in S201-2 and S201-3 are the parameter values for determining the above-described relationship among the drive current, device temperature, and optical output wavelength and the relationship among the drive current, device temperature, and optical output power.

Then, the operating procedures S201-5 to S201-6 will be described.

In S201-5, the comparison determination is performed to the value which is obtained by performing a filtering process of reducing an instantaneous noise to the drive current of the light emitting device constituting the twenty-first means 201 and the allowable fluctuation range of the specified drive current. Examples of the filtering process include taking a time average (movement average) for a determined short time, passing the drive current through a low-frequency pass filter or a high-frequency cut filter having determined cut-off characteristics.

In S201-6, the procedure goes to S201-7 only when the comparison determination result in S201-5 is not located in the range in determined consecutive times not lower than one or only when the comparison determination result is located out of the range, and the procedure returns to S201-5 in other cases.

In this case, the drive current allowable fluctuation range is separately specified. However, assuming that m is a time average value of the drive current for a determined long time, $\sigma$ is a standard deviation, $\alpha$ is a determined multiple, and t is the latest target value of the drive current, even if the optical communication light source unit (for example, twenty-fifth means 205 or twenty-sixth means 206) computes $m \pm \alpha \sigma$ or $t \pm \alpha \sigma$ to set either of them at the allowable fluctuation range of the drive current, the effect of the invention is not changed.

The effect of the invention is not changed, even if the maximum value $i_{max}$ and the minimum value $i_{min}$ of the drive current are determined by the monitoring for a determined long time in which aged deterioration is not generated in the optical output power characteristics of the light emitting device although the sufficiently long time since a predetermined time elapses to stabilize the optical output of the light emitting device after the power-on to set the range determined by the $i_{max}$ and $i_{min}$ at the drive current allowable fluctuation range.

Finally the operating procedures S201-7 to S201-8 will be described.

In S201-7, when the monitored drive current is not located in the allowable fluctuation range of the specified drive current based on the comparison determination result in S201-5, the coefficient of the linear function expressing the optical output power characteristics in the drive current fluctuation is predicted and computed based on the coefficient, computed in S201-4, of the linear function expressing the optical output power characteristics before the drive current fluctuation of the light emitting device. That is, the coefficient of the linear function expressing the plane in which the plane (linear function) expressing the optical output power characteristics of the light emitting device is moved in parallel along the coordinate axis concerning the drive current according to the increase or decrease in drive current is predicted and computed. In this case, the coefficient computed in S201-7 is the parameter value for determining the relationship among the drive current, device temperature, and optical output power in the drive current fluctuation.

Figure 11:
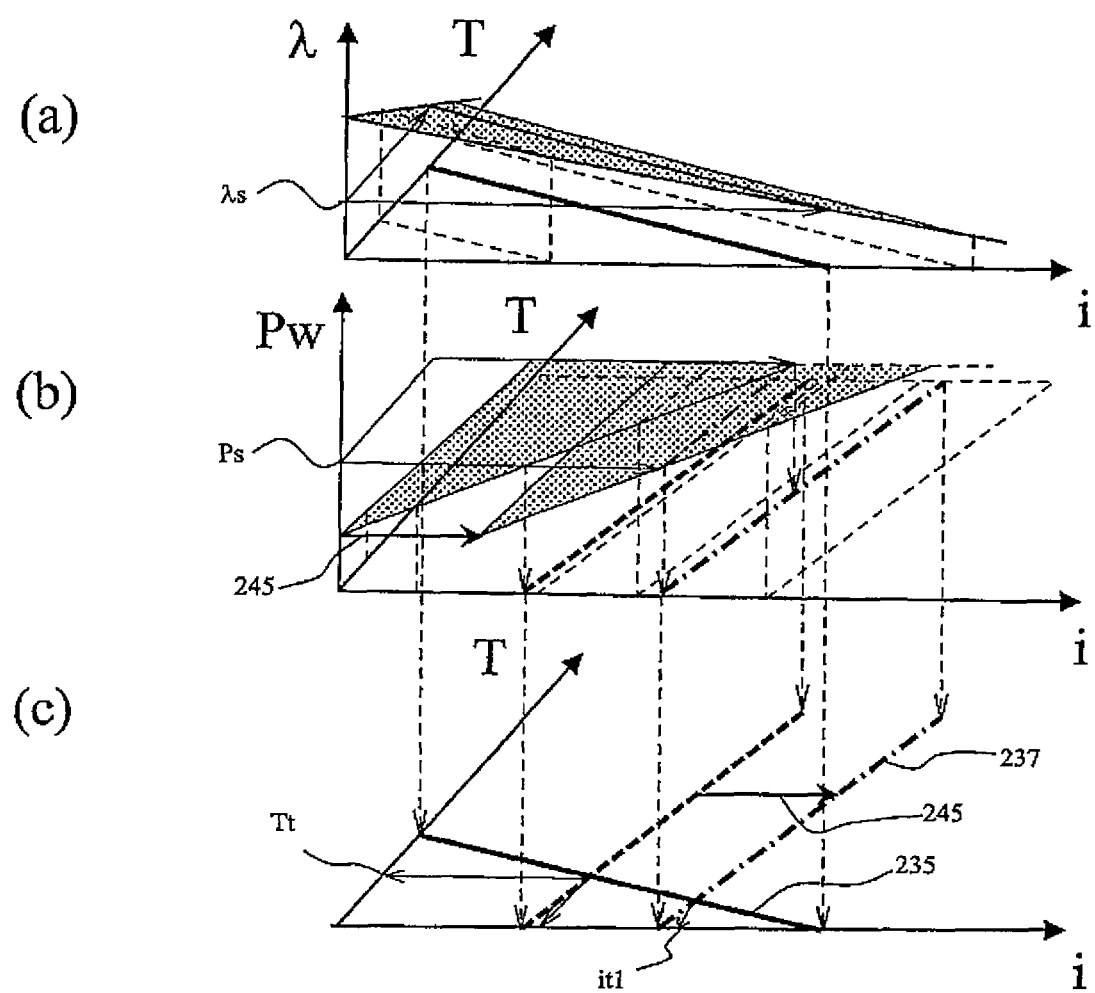
FIG. 11 is an explanatory view (during drive current fluctuation) showing an outline of controlling the optical output wavelength and optical output power of the light emitting device according to the invention.
Figure 12:
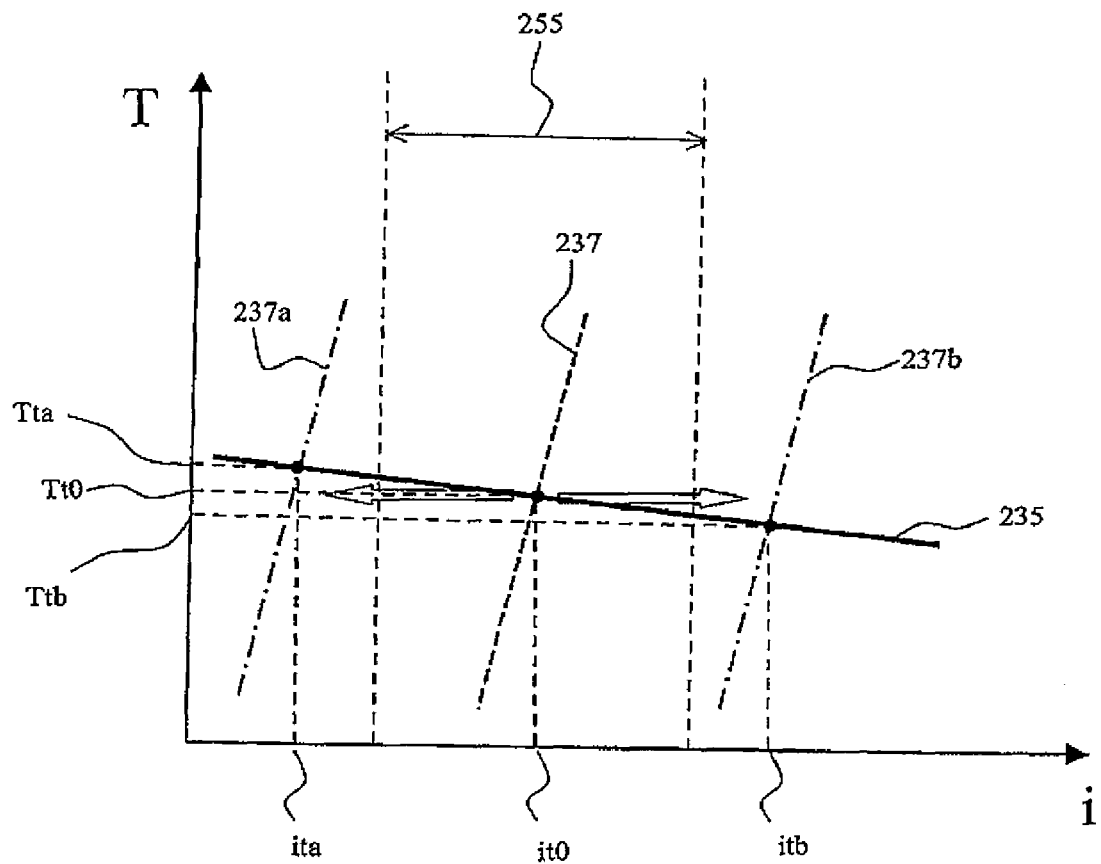
FIG. 12 is an explanatory view showing a detail of controlling the optical output wavelength and optical output power during the drive current fluctuation of the light emitting device according to the invention.

In S201-8, because all the coefficients of the equations (linear equations) shown in FIG. 11, which express the optical output wavelength contour line and the optical output power contour line in the drive current fluctuation, are determined from the coefficients computed in S201-2 and S201-7 and the specified optical output wavelength and optical output power, the latest drive current or optical output power and the latest device temperature in the drive current fluctuation are computed as the coordinate value (drive current and device temperature) of the intersecting point of the two isopleths by utilizing these coefficients.

In the above example, the dependence of the optical output wavelength and optical output power of the light emitting device on the drive current and the dependence of the optical output wavelength and optical output power on the device temperature are well expressed by the planes (linear function of drive current and device temperature) respectively is described for the sake of simplification. However, even if the dependence of the optical output wavelength and optical output power of the light emitting device on the drive current and the dependence of the optical output wavelength and optical output power on the device temperature are well expressed by the quadratic surface or the more general function, or well expressed by the plane or the curved surface in each of divided plural regions, the coefficients of the functions expressing the characteristics can numerically be determined by the similar procedure, so that the effect of the invention is not changed.

The function expressing the optical output power in the drive current fluctuation is predicted by moving in parallel the function before the drive current fluctuation according to the increase or decrease in drive current. In the case where shift is generated from the parallel movement, the effect of the invention is not changed, even if conversion is performed according to the increase or decrease in drive current. Examples of the conversion include rotating the function by an angle according to the increase or decrease in drive current before or after the parallel movement and performing non-linear conversion such as quadratic conversion with the coefficient according to the increase or decrease in drive current.

The effect of the invention is not changed, even if the conversion according to the increase or decrease in drive current is performed not to the function expressing the optical output power but to the optical output power contour line before or after the parallel movement.

Fifth Embodiment

Figure 15:
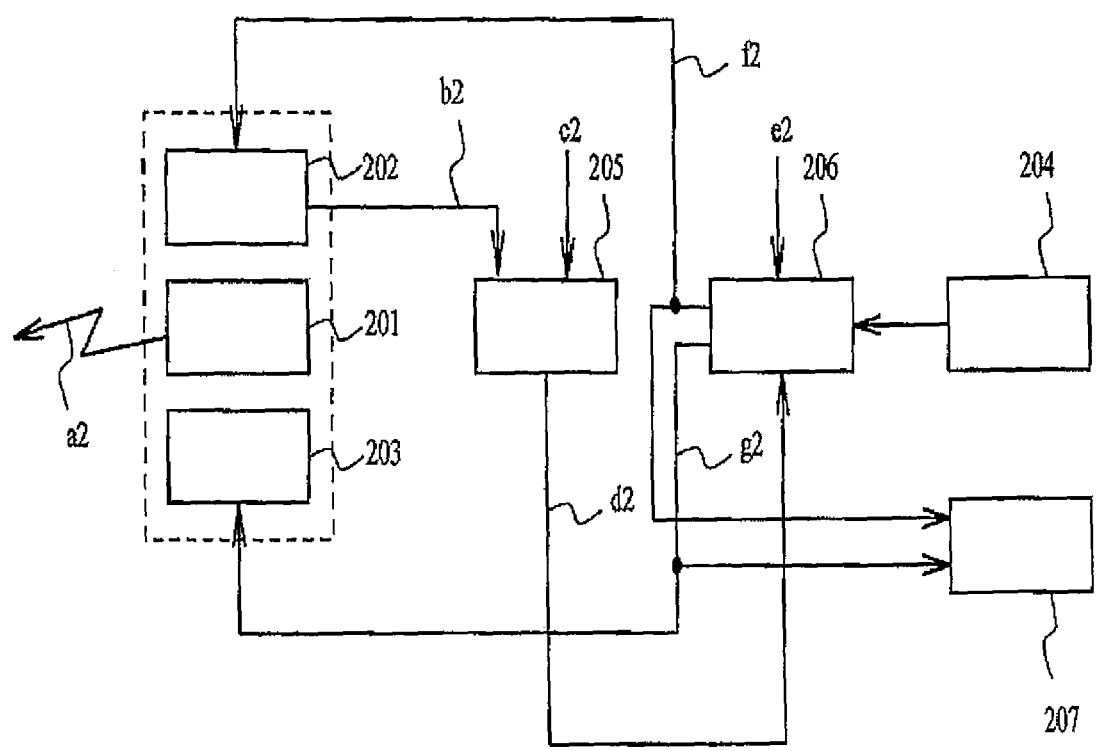
FIG. 15 is a block diagram showing a fifth embodiment of the optical communication light source unit according to the invention.

FIG. 15 shows a configuration of a fifth embodiment corresponding to fourteenth and twentieth aspects of the invention. The configuration shown in FIG. 15 differs from the configuration of the fourth embodiment shown in FIG. 13 in that the twenty-seventh means 207, in which the latest drive current or optical output power and the latest device temperature which are determined by the twenty-sixth means 206 are stored, is added.

Figure 16:
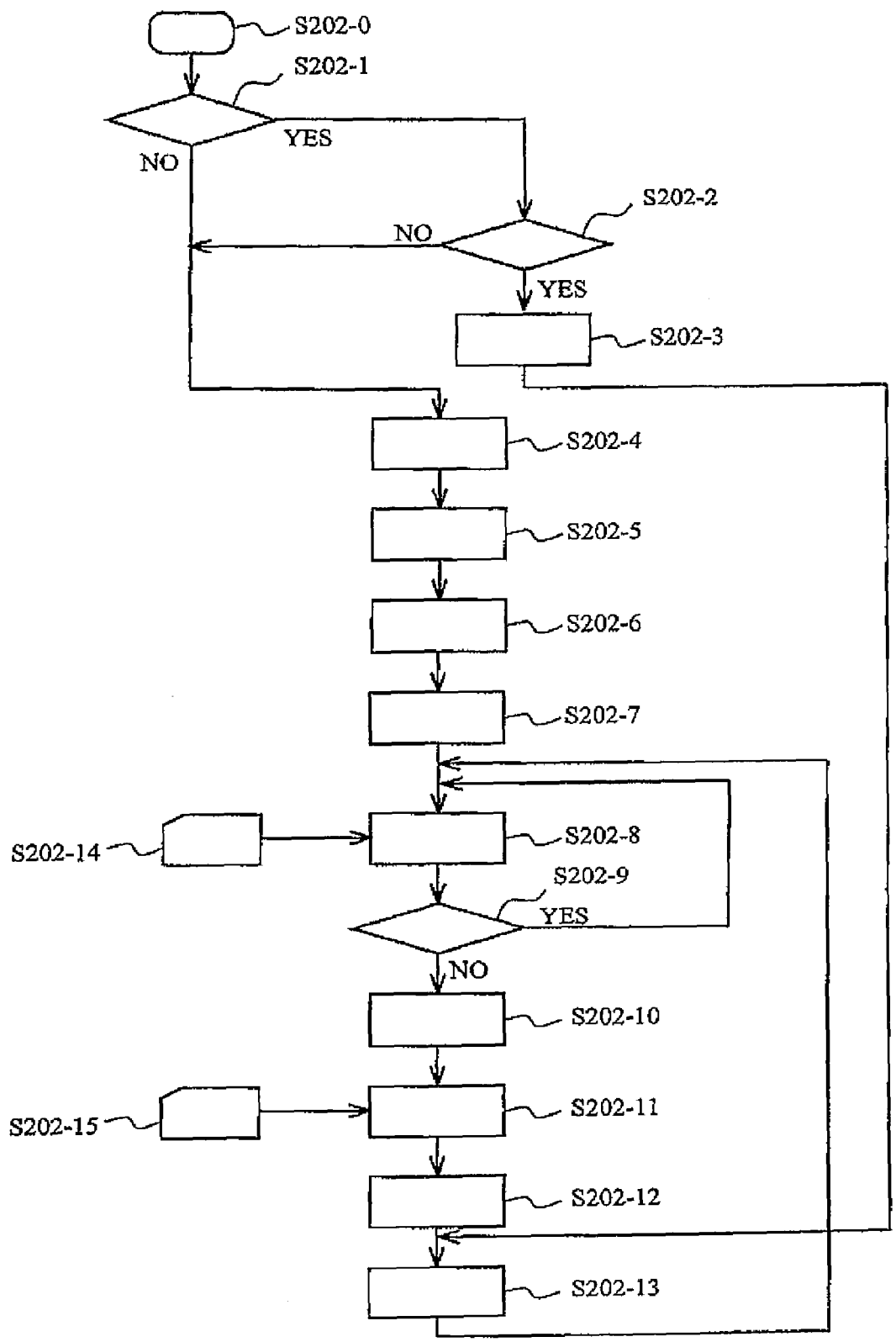
FIG. 16 is a flowchart showing the operating procedure of the fifth embodiment.

FIG. 16 shows an operating procedure of the fifth embodiment. The portions which are different from the operating procedure shown in FIG. 14 will mainly be described below.

In S202-1, in consideration of the warm start of the optical communication light source unit, it is determined whether or not the value stored in the twenty-seventh means 207 is used.

When the value is used, it is further determined in S202-2 whether or not the latest drive current or optical output power and the latest device temperature g2 are stored in the twenty-seventh means 207.

When the latest drive current or optical output power f2 and the device temperature g2 are stored in the twenty-seventh means 207, in S202-3, the values are read and outputted to the twenty-second means 202 and the twenty-third means 203 respectively.

Then, in S202-13, the twenty-second means 202 and the twenty-third means 203 set the values inputted from the twenty-seventh means 207 at the new target values respectively.

On the other hand, when the value stored in the twenty-seventh means 207 is not used, or when the latest drive current or optical output power f2 and the latest device temperature g2 are not stored in the twenty-seventh means 207, the procedures S202-4 to S202-11 are performed similar to the procedures S201-1 to S201-8 in the fourth embodiment.

Then, in S202-12, the latest drive current or optical output power f2 and the latest device temperature g2 which are determined in S202-11 are stored in the twenty-seventh means 207. The next S202-13 is similar to the procedure S201-9 in the fourth embodiment.

Sixth Embodiment

Figure 17:
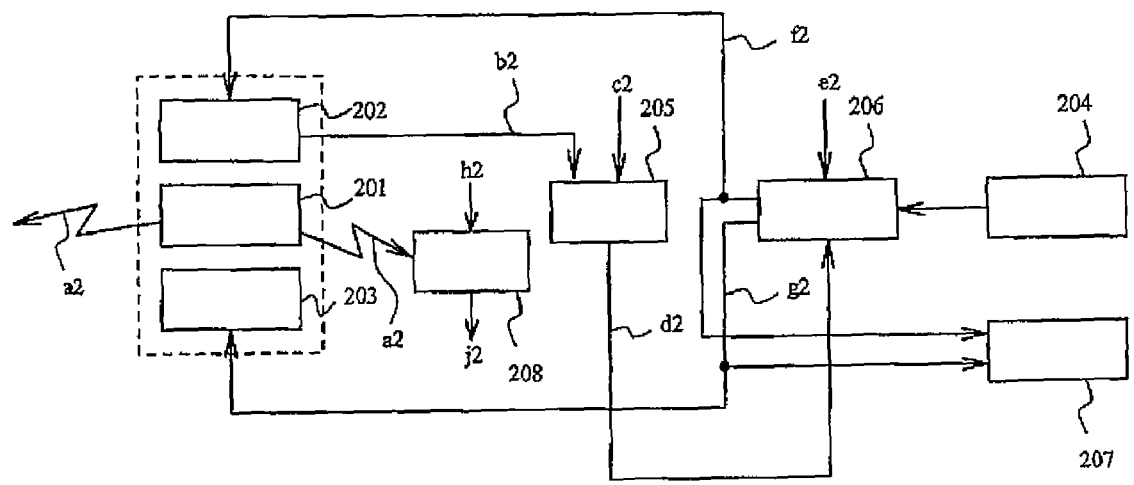
FIG. 17 is a block diagram showing a sixth embodiment of the communication light source unit according to the invention.

FIG. 17 shows a configuration of a sixth embodiment corresponding to fifteenth and twenty-first aspects of the invention. The configuration shown in FIG. 17 differs from the configuration of the fifth embodiment shown in FIG. 15 in that the twenty-eighth means 208, which monitors both or one of the optical output wavelength and optical output power of the light a2 from the twenty-first means 201, makes the comparison determination whether or not the optical output wavelength and optical output power are located in the separately specified optical output wavelength range and optical output power range respectively, and outputs the comparison determination result, is added. The case in which the comparison determination is made to both the optical output wavelength and the optical output power will be described in the sixth embodiment.

Figure 18:
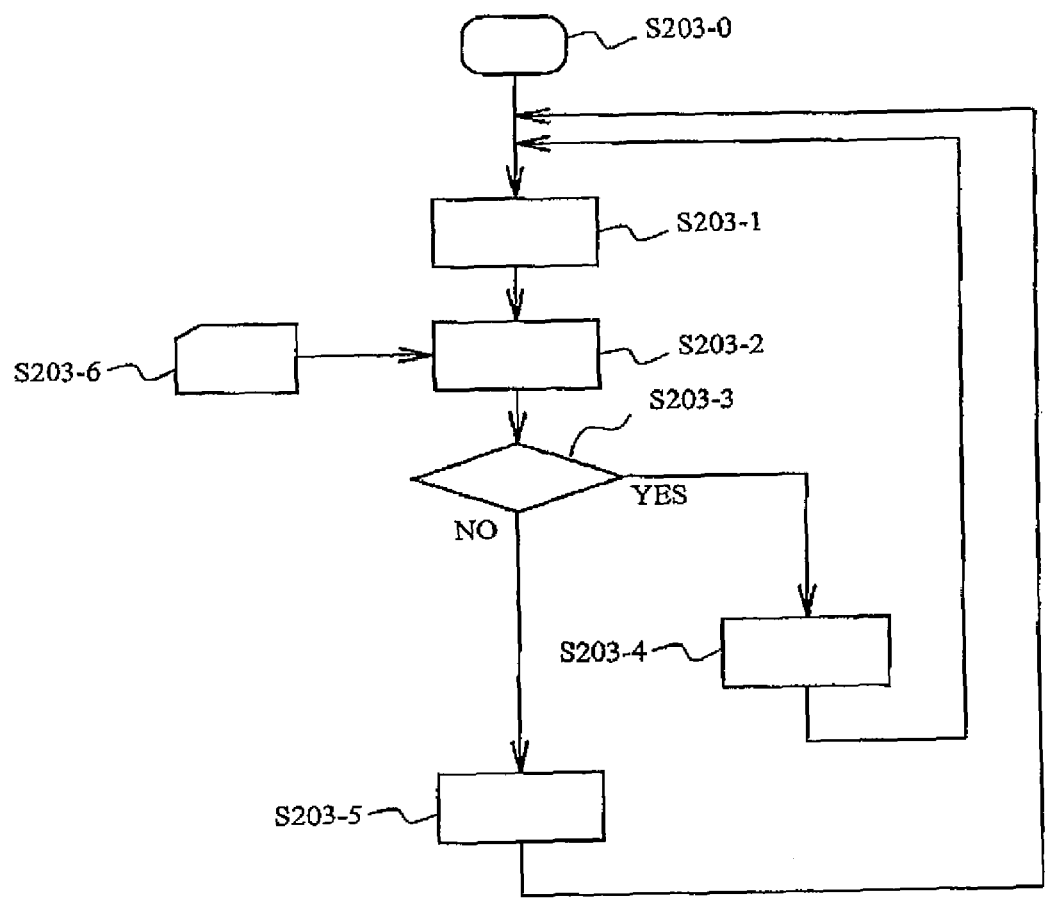
FIG. 18 is a flowchart showing the operating procedure of the sixth embodiment.

FIG. 18 shows an operating procedure of the sixth embodiment.

While the drive current or optical output power and the device temperature are adjusted and controlled such that the optical output wavelength and optical output power become the specified optical output wavelength and optical output power e2 by the procedures similar to the operating procedures S201-1 to S201-9 in the fourth embodiment or the operating procedures S202-1 to S202-13 in the fifth embodiment, the optical output wavelength and optical output power are monitored for the light a2 from the twenty-first means 201.

In S203-1, the twenty-eighth means 208 monitors both the optical output wavelength and optical output power of the light a2 from the twenty-first means 201 which is driven by the latest drive current or optical output power f2 and the latest device temperature g2. The latest drive current or optical output power f2 and the latest device temperature g2 are determined by the twenty-sixth means 206.

Then, in S203-2, the optical output wavelength and optical output power monitored in S203-1 are compared to the separately specified optical output wavelength range and optical output power range h2.

The determination is made in S203-3. When the monitored optical output wavelength and optical output power are located in the specified optical output wavelength range and optical output power range respectively, the comparison determination result j2 is outputted as the status display in S203-4, and the procedure returns to S203-1.

When the monitored optical output wavelength and optical output power are not located in the specified optical output wavelength range and optical output power range respectively, the comparison determination result j2 is outputted as the abnormal warning in S203-5, and the procedure returns to S203-1.

In the above-described operating procedures, for example, S203-1 can be realized as follows. The light a2 from the twenty-first means 201 is inputted to the optical band transmission means such as the optical filter which transmits the light having the specified optical output wavelength range. The output is further inputted to the photoelectric conversion means such as a photodiode which converts the optical power of the input light into the photocurrent. The optical output wavelength and optical output power are monitored and compared by monitoring and comparing the photocurrent obtained in the above-described manner. That is, the above-described comparison is performed by comparing the photocurrent range and the photocurrent obtained by the above monitoring. The photocurrent range is determined from the previously known optical wavelength transmission characteristics of the optical band transmission means, the previously known conversion characteristics of the photoelectric conversion means, the specified optical output wavelength range, and optical output power range respectively.

Other Embodiments

In the fourth embodiment to the sixth embodiment, the case where the twenty-first means 201 includes one light emitting device, is described for the sake of simplification. However, even in the case where the twenty-first means 201 may include the plural light emitting devices, the twenty-second means 202 may automatically control the drive current or optical output power of each light emitting device such that the drive current or optical output power is maintained at the target value given to each light emitting device, and the twenty-third means 203 may automatically control the device temperature of each light emitting device such that the device temperature is maintained at the target value given to each light emitting device, at least one value of the optical output wavelength for the drive current and device temperature, at least one value concerning these three, or the at least one parameter value for determining the relationship among these three, and at least one value of the optical output power for the drive current and device temperature, at least one value concerning these three, or the at least one parameter value for determining the relationship among these three are stored in the twenty-fourth means 204 for each light emitting device constituting the twenty-first means 201, the twenty-fifth means 205 monitors the drive current of each light emitting device constituting the twenty-first means 201, and makes the comparison determination whether or not the drive current is located in the allowable fluctuation range separately specified in each light emitting device. For the light emitting device whose drive current is not located in the allowable fluctuation range, the relationship among the drive current, device temperature, and optical output power in the drive current fluctuation of the light emitting device is predicted from the relationship among the drive current, device temperature and optical output power of the light emitting device. The relationship is determined by at least one value stored in the twenty-fourth means 204 for the light emitting device. Then, for the light emitting device whose drive current is not located in the allowable fluctuation range, the twenty-sixth means 206 determines the latest drive current or optical output power and the latest device temperature at which both the optical output wavelength and the optical output power of the light emitting device become the separately specified values in each light emitting device from the relationship among the drive current, device temperature, and optical output wavelength of the light emitting device determined by at least one value stored in the twenty-fourth means 204 for the light emitting device and the relationship among the drive current, device temperature, and optical output power in the light emitting device drive current fluctuation predicted by the twenty-fifth means 205 (sixteenth and twenty-second aspects of the invention), and thereby the optical output wavelength and the optical output power can be similarly controlled for each light emitting device constituting the twenty-first means 201. Furthermore, the latest drive current or optical output power and the latest device temperature of each light emitting device, which are determined by the twenty-sixth means 206 are stored in the twenty-seventh means 207 (seventeenth and twenty-third aspects of the invention), and thereby the control including the warm start of the optical output wavelength and optical output power can also be performed for each light emitting device constituting the twenty-first means 201. Furthermore, the twenty-eighth means 208 monitors both or one of the optical output wavelength and the optical output power of the optical output generated by each light emitting device constituting the twenty-first means 201, makes the comparison determination whether or not the optical output wavelength and the optical output power are located in the optical output wavelength range and the optical output power range in each light emitting device, and outputs the comparison determination result (eighteenth and twenty-fourth aspects of the invention), and thereby both or one of the optical output wavelength and the optical output power can be monitored for each light emitting device constituting the twenty-first means 201. Therefore, the effect of the invention is not changed.

Although the optical output wavelengths separately specified for the plural light emitting devices constituting the twenty-first means 201 are usually different from one another, an arbitrary optical output wavelength including all the same wavelength or including partially the same wavelength can obviously be specified to each light emitting device. Although the optical output powers separately specified for the plural light emitting devices constituting the twenty-first means 201 are usually similar to one another, an arbitrary optical output power including only the single power or including partially the same power can obviously be specified to each light emitting device.

At least one value of itself (raw value) is stored in the twenty-fourth means 204 in the fourth embodiment to the sixth embodiment. However, the effect of the invention is not changed, even if the coding process such as the normalization, the scramble, the bit inversion, and the encryption is previously performed to all the values or at least one value to store the value in the twenty-fourth means 204 and then the value is used by performing the decoding process such as the denormalization, the descramble, the bit inversion, and the encryption decoding after the value is read from the twenty-fourth means 204.

Similarly, in the fifth embodiment and the sixth embodiment, the drive current or optical output power f2 and the device temperature g2 of themselves (raw values) which are determined by the twenty-sixth means 206 are stored in the twenty-seventh means 207. However, the effect of the invention is not changed, even if the coding process such as the normalization, the scramble, the bit inversion, and the encryption is previously performed to all the values or at least one value to store the value in the twenty-seventh means 207 and then the value is used by performing the decoding process such as the denormalization, the descramble, the bit inversion, and the encryption decoding after the value is read from the twenty-seventh means 207.

In the fourth embodiment to the sixth embodiment, the drive current is monitored in the procedures S201-5 and S202-8. However, the effect of the invention is not changed, even if the fluctuation amount from the target value or the average value of the drive current is monitored.

In the fourth embodiment to the sixth embodiment, the case where the twenty-second means automatically controls the optical output power by the feedback control or the like such that the optical output power is maintained at a given target value, namely the optical output power is directly controlled by an automatic power control circuit (APC), is described. However, the effect of the invention is not changed, even if the optical output power is indirectly controlled using an automatic current control circuit (ACC).

In the sixth embodiment, the effect of the invention is not changed, even if the comparison determination and the result output thereof are performed for both or one of the optical output wavelength and the optical output power. Furthermore, the effect of the invention is not changed, even if both or one of the status display and the abnormal warning is outputted for the optical output wavelength and the optical output power.

The effect of the invention is not changed even if the procedures S201-1 and S201-2, and S201-3 and S201-4 in the fourth embodiment, the procedures S202-1 and S202-2 in the fifth embodiment, the procedures S202-4 and S202-5, and S202-6 and S202-7 in the fifth embodiment, and the procedures S202-12 and S202-13 in the fifth embodiment are performed in the adverse order, respectively.

Additionally, in the fourth embodiment to the sixth embodiment, the new target value of the drive current of the light emitting device is clearly given. However, the effect of the invention is not changed, even if the automatic power control circuit (APC) is autonomously operated to finely adjust the drive current.

In the fourth embodiment to the sixth embodiment, the effect of the invention is not changed, even if the optical output from the twenty-first means 201 is either continuous light (CW light) or modulation light.

Seventh Embodiment

Figure 23:
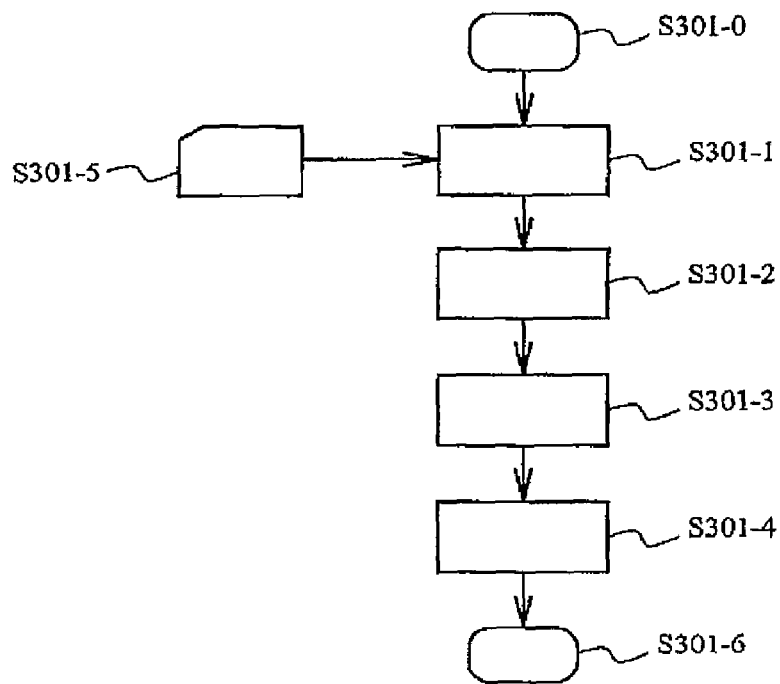
FIG. 23 is a flowchart showing the processing procedure of a seventh embodiment of the invention.

FIG. 23 shows a seventh embodiment corresponding to twenty-fifth and twenty-ninth aspects of the invention.

The optical communication light source unit used in the invention includes the light emitting device such as LD shown in FIGS. 4, 6, 8, 13, 15, and 17. Thirty-first means to thirty-fourth means of twenty-fifth and twenty-ninth aspects of the invention correspond to the eleventh means 101 to fourteenth means 104 of the first embodiment to third embodiment or the twenty-first means 201 to twenty-fourth means 204 of the fourth embodiment to sixth embodiment. Specifically the seventh embodiment includes the thirty-first means which generates the optical output, the thirty-second means which automatically controls the drive current or optical output power of the light emitting device constituting the thirty-first means by the feedback control or the like such that the drive current or optical output power is maintained at a given target value, the thirty-third means which automatically controls the device temperature of the light emitting device constituting the thirty-first means by the feedback control or the like such that the device temperature is maintained at a given target value, and the thirty-fourth means in which least one value of the optical output wavelength for the drive current and device temperature, at least one value concerning these three, or at least one parameter value for determining the relationship among these three, and at least one value of the optical output power for the drive current and device temperature, at least one value concerning these three, or at least one parameter value for determining the relationship among these three are stored in order to set and control the optical output wavelength and optical output power of the light emitting device constituting the thirty-first means.

In each configuration, the dependence of the optical output wavelength on the drive current and device temperature and the dependence of the optical output power on the drive current and device temperature are determined using at least one value stored in the thirty-fourth means, and the optical output wavelength and optical output power are set and controlled.

In the seventh embodiment, the processing procedures will be described when a method of selecting the measuring point for determining the dependence of the optical output wavelength on the drive current and device temperature and the dependence of the optical output power on the drive current and device temperature is performed using a selection circuit. The selection circuit controls the fifteenth means of the first embodiment to third embodiment or the sixteenth means of the fourth embodiment to the sixth embodiment such that the optical output wavelength and the optical output power are measured at the measuring point. The selection circuit may be included in the fifteenth means or the sixteenth means. For example, the selection circuit is incorporated into an apparatus which inspects the optical communication light source unit or a computer which controls the apparatus.

In S301-1, the operating range ($i_1 \leq i \leq i_2$) of the separately specified drive current i and the operating range ($T_1 \leq T \leq T_2$) of the separately specified device temperature T are inputted in the light emitting device constituting the thirty-first means.

Figure 19:
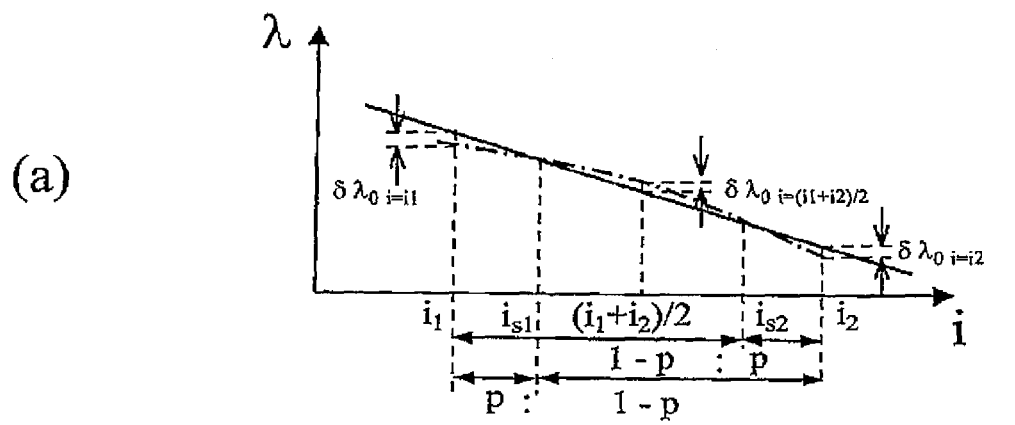
FIG. 19 is an explanatory view showing an optical output wavelength approximate error in a light emitting device operating range.
Figure 19:
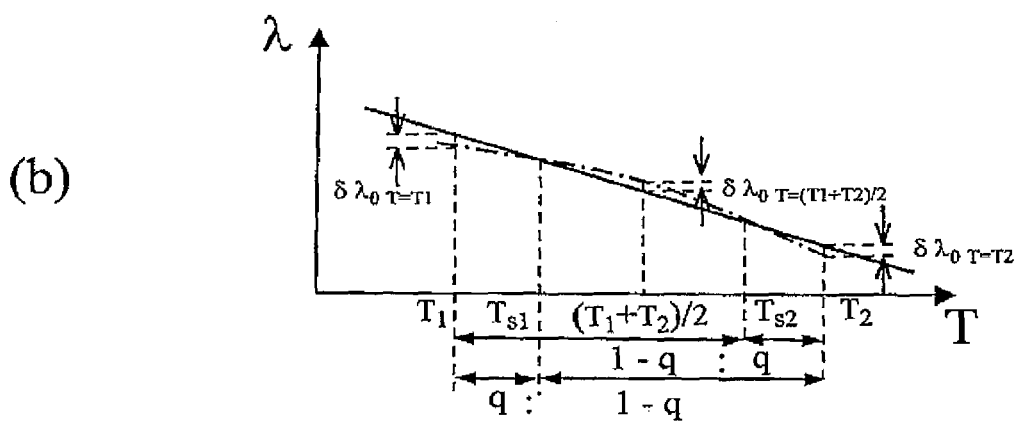
Figure 20:
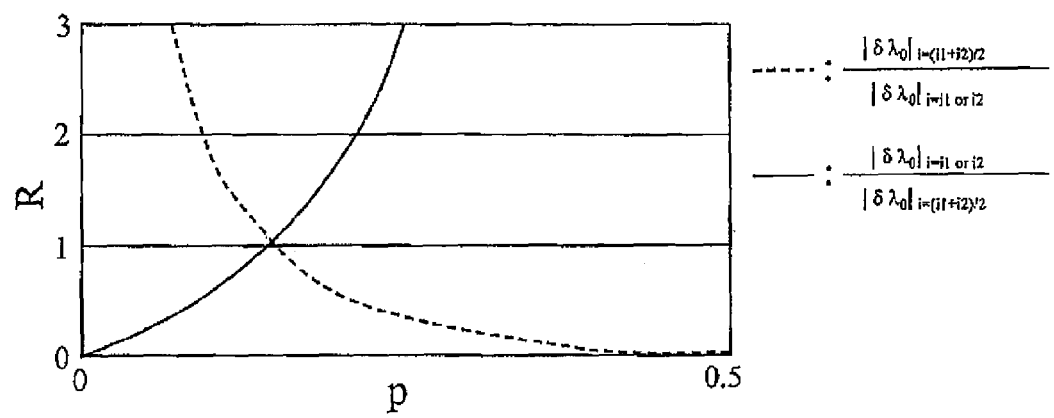
FIG. 20 is an explanatory view showing a relationship between a specific coordinate of an internally dividing point of a drive current operating range and a ratio of an absolute value of the optical output wavelength approximate error.
Figure 21:
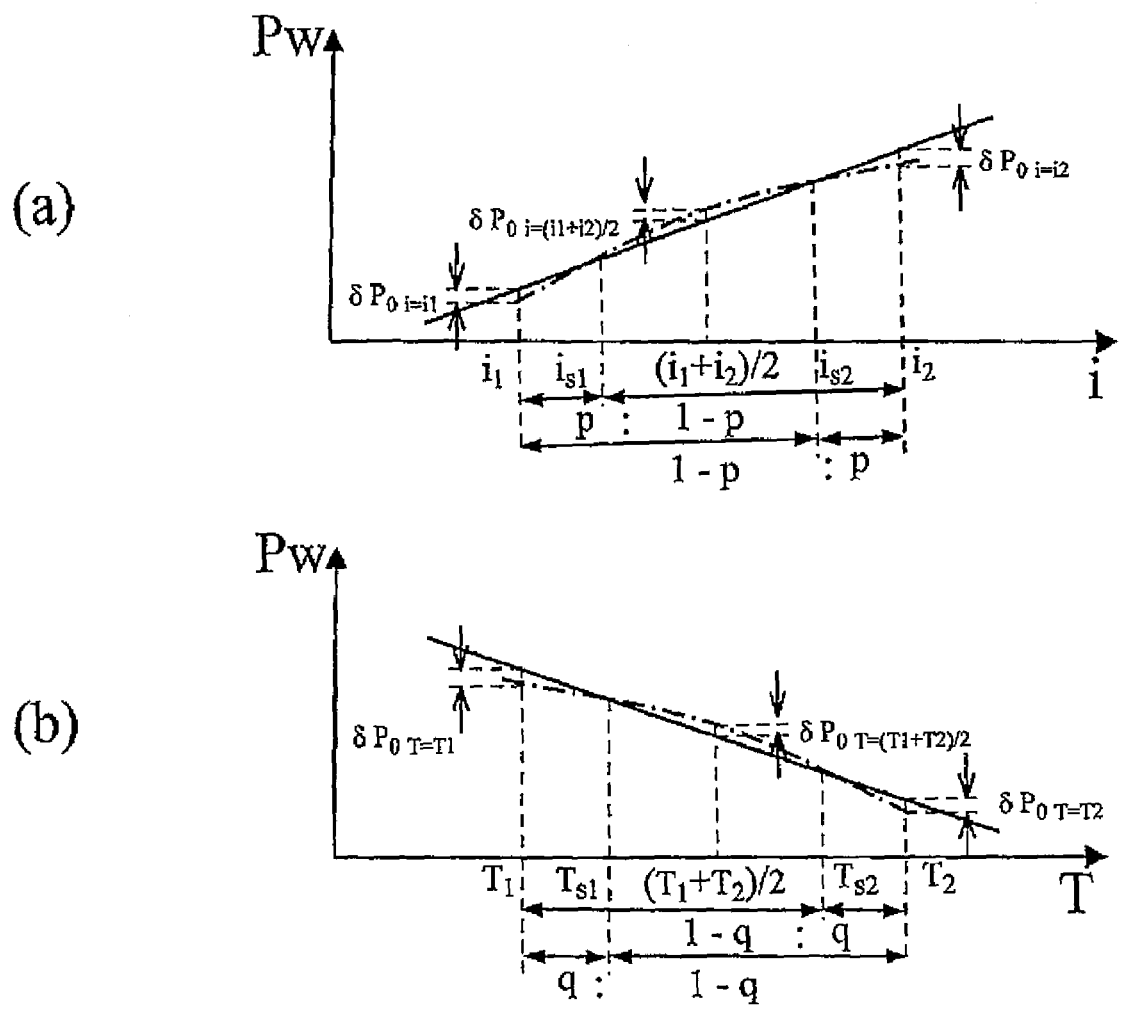
FIG. 21 is an explanatory view of an optical output power approximate error in the light emitting device operating range.
Figure 22:
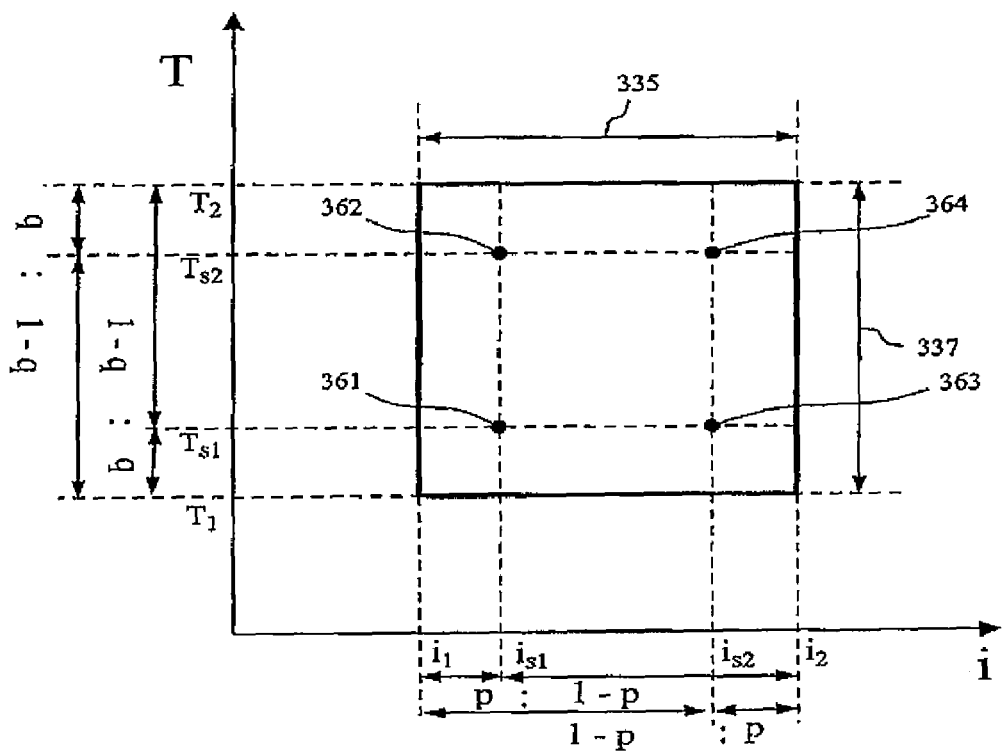
FIG. 22 is an explanatory view showing a relationship between the light emitting device operating range and optical output wavelength characteristics and measuring points of the optical output power characteristics.

In S301-2, as shown in FIG. 19(a), on the two-dimensional plane having the coordinate axes of the device temperature and the optical output wavelength, the drive current operating range ($i_1 \leq i \leq i_2$) of the drive current i of the light emitting device is internally divided by p:1-p and 1-p:p to determine the drive currents $i_{s1}$ and $i_{s2}$ at the internally dividing points using an arbitrary value p (p is a specific coordinate of an internally dividing point in the drive current operating range, and p is a real number satisfying 0<p<1) and thereby the approximate errors $|\delta\lambda_0|_{i=i1 \ or \ i2}$ and $|\delta\lambda_0|_{i=(i1+i2)/2}$ between the optical output wavelength characteristics expressed by the drive current quadratic function of the light emitting device and the optical output wavelength characteristics approximated by the drive current linear function are determined, the value p is determined such that the approximate errors are equal to each other, and the drive currents $i_{s1}$ and $i_{s2}$ are determined as the drive currents at the measuring points while the internally dividing points are set at the measuring points at that time.

In S301-3, the device temperature which internally divides the device temperature operating range ($T_1 \leq T \leq T_2$) of the device temperature T of the light emitting device by p:1-p and 1-p:p is determined as the device temperatures $T_{S1}$ and $T_{S2}$ in the measuring points using the value p determined in the procedure S301-2.

Finally, in S301-4, three points are selected as the measuring points of the optical output wavelength and optical output power characteristics from the four points ($i_{s1},T_{s1}$), ($i_{s1},T_{s2}$), ($i_{s2},T_{s1}$), and ($i_{s2},T_{s2}$) which are formed by combination of the values determined in the procedures S301-2 and S301-3.

Thus, the estimated errors of the optical output wavelength and optical output power can be decreased in setting and controlling the optical output wavelength and optical output power by selecting the measuring points for determining the dependence of the optical output wavelength on the drive current and device temperature and the dependence of the optical output power on the drive current and device temperature in the light emitting device of the optical communication light source unit.

Eighth Embodiment

Figure 24:
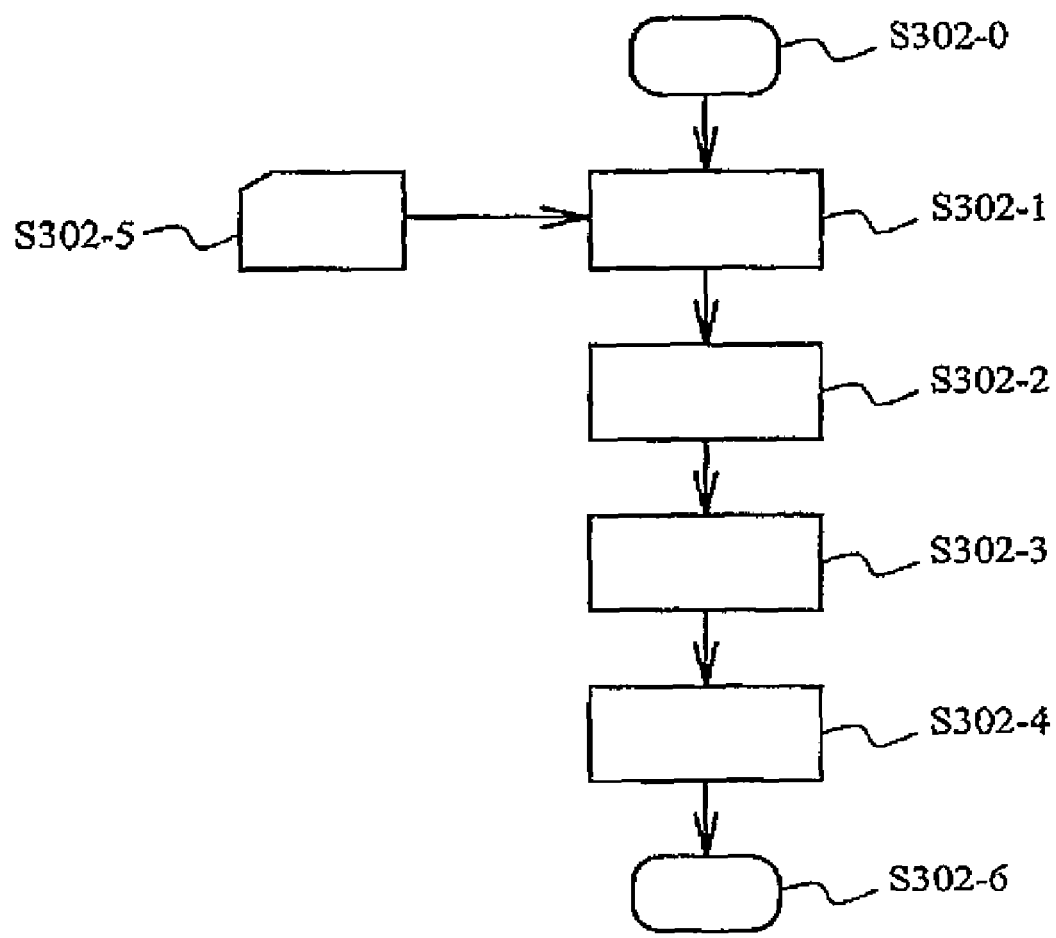
FIG. 24 is a flowchart showing the processing procedure of an eighth embodiment of the invention.
Figure 25:
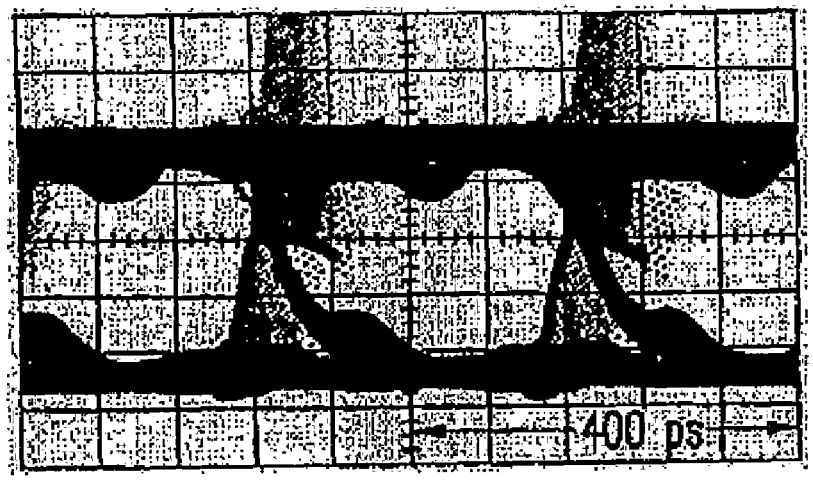
FIG. 25 is an explanatory view showing a measurement example of eye patterns during direct modulation of the light emitting device.
Figure 25:
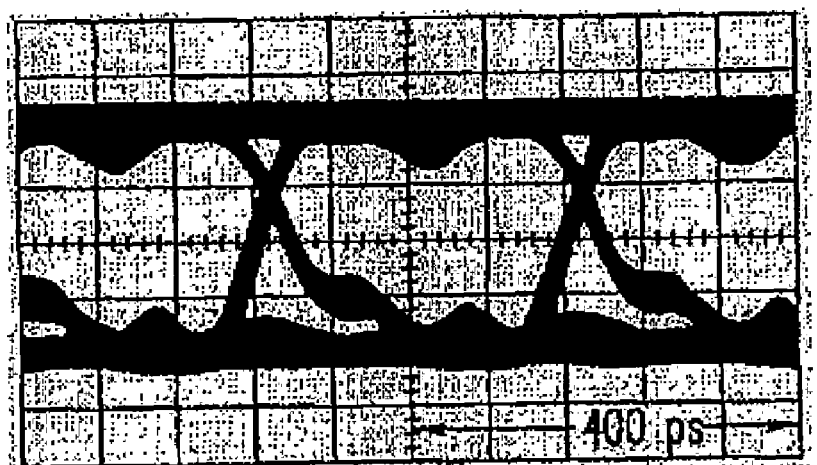
Figure 25:
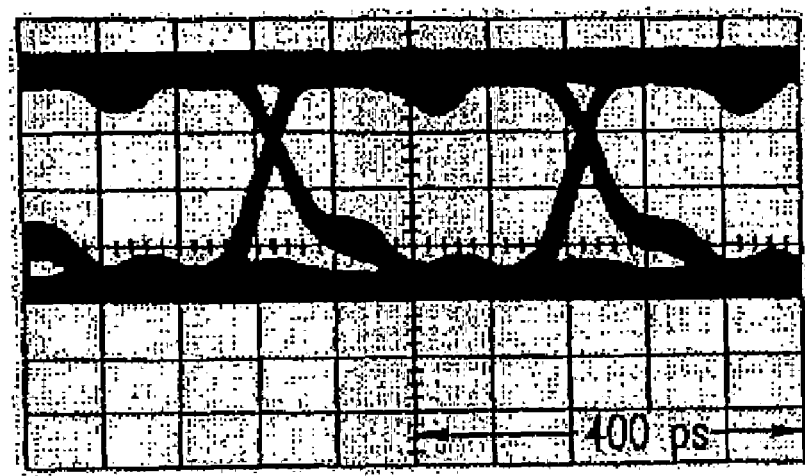
Figure 26:
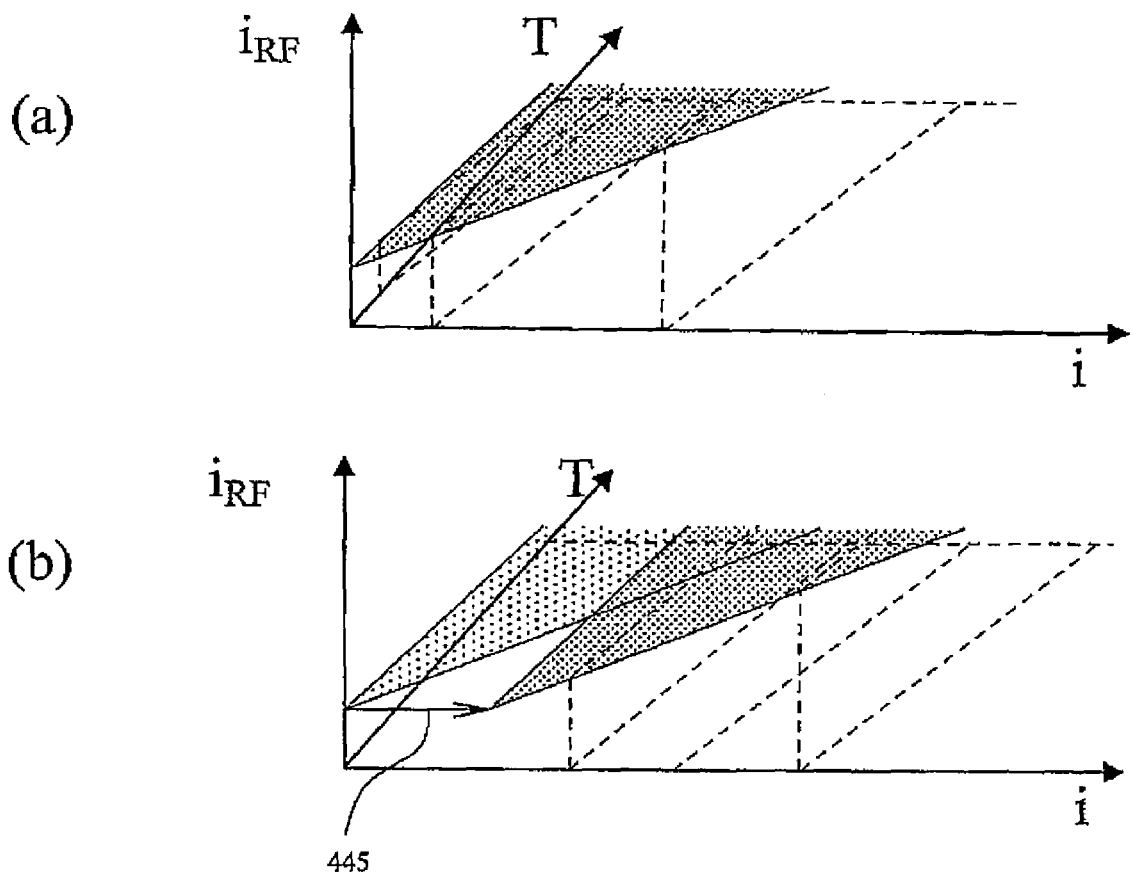
FIG. 26 is an explanatory view showing a relationship between the drive current and device temperature and the RF amplitude during the direct modulation which satisfies predetermined extinction ratio and eye mask requirement of the light emitting device, FIG. 26(*a*) shows RF amplitude characteristics before the drive current fluctuation, and FIG. 26(*b*) shows the RF amplitude characteristics during the drive current fluctuation when the drive current is increased.

FIG. 24 shows an eighth embodiment corresponding to twenty-sixth and thirtieth aspects of the invention.

The eighth embodiment shown in FIG. 24 differs from the seventh embodiment shown in FIG. 23 in the procedures S302-2 and S302-3, although the procedures S302-1 and S302-4 in the eighth embodiment are similar to the procedures S301-1 and S301-4 in the seventh embodiment. The portions different from the seventh embodiment of FIG. 23 will mainly be described below.

In S302-2, as shown in FIG. 19(b), on the two-dimensional plane having the coordinate axes of the device temperature and the optical output wavelength, the device temperature operating range ($T_1 \leq T \leq T_2$) of the specified device temperature T of the light emitting device is internally divided by q:1-q and 1-q: q to determine device temperature $T_{s1}$, and $T_{s2}$ at the internally dividing point using an arbitrary value q (q is a specific coordinate of an internally dividing point in the device temperature operating range, and q is a real number satisfying 0<q<1) and thereby the approximate errors $|\delta\lambda_0|_{T=T1 \ or \ T2}$ and $|\delta\lambda_0|_{T=(T1+T2)/2}$ between the optical output wavelength characteristics expressed by a device temperature quadratic function of the light emitting device and the optical output wavelength characteristics approximated by the device temperature linear function are determined, the value q is determined such that the approximate errors are equal to each other, and the device temperatures $T_{s1}$ and $T_{s2}$ are determined as the device temperatures at the measuring points while the internally dividing points are set at the measuring points at that time.

In S302-3, the drive currents in which the operating range of drive current i ($i_1 \leq i \leq i_2$) of the light emitting device is internally divided by q:1-q and 1-q:q, are determined as the drive currents $i_{S1}$ and $i_{S2}$ in the measuring points using the value q determined in step S302-2.

Thus, in the seventh embodiment, the drive current at the measuring point is determined to decrease the approximate error between the optical output wavelength characteristics expressed by the drive current quadratic function and the optical output wavelength characteristics approximated by the drive current linear function. In the eighth embodiment, the device temperature at the measuring point is determined to decrease the approximate error between the optical output wavelength characteristics expressed by the device temperature quadratic function and the optical output wavelength characteristics approximated by the device temperature linear function. However, even if the drive current at the measuring point is determined to decrease the approximate error between the optical output wavelength characteristics expressed by the drive current quadratic function and the optical output wavelength characteristics approximated by the drive current linear function, or even if the device temperature at the measuring point is determined to decrease the approximate error between the optical output wavelength characteristics expressed by the device temperature quadratic function and the optical output wavelength characteristics approximated by the device temperature linear function, the effect of the invention is not changed because the same results are obtains in each of the above cases.

In the seventh embodiment and the eighth embodiment, the case where the optical output wavelength characteristics and optical output power characteristics of the light emitting device are considered up to second-order terms for the drive current and device temperature within the operating range (using the quadratic function of the drive current and device temperature), and the dependence of the optical output wavelength characteristics and optical output power characteristics of the light emitting device on the drive current and the dependence of the optical output wavelength characteristics and optical output power characteristics of the light emitting device on the device temperature are approximated by the planes (linear functions of the drive current and device temperature) in actually setting and controlling the optical output wavelength and optical output power, is described. However, even if the operating ranges of the drive current and device temperature are divided into plural regions and each divided region is approximated by the plane, the drive current and device temperature of the measuring point at which the absolute values of the maximum value and minimum value of the approximate error expressing each characteristic are equal to each other can be selected using the similar procedures. Therefore, the effect of the invention is not changed.

In the seventh embodiment and the eighth embodiment, the case where the thirty-first means includes one light emitting device is described for the sake of simplification. However, even in the case where the thirty-first means may include the plural light emitting devices, the thirty-second means may automatically control the drive current or optical output power of each light emitting device such that the drive current or optical output power is maintained at the target value given to each light emitting device, the thirty-third means may automatically control the device temperature of each light emitting device such that the device temperature is maintained at the target value given to each light emitting device, the thirty-fourth means may store at least one value of the optical output wavelength for the drive current and device temperature, at least one value concerning these three, or the at least one parameter value for determining the relationship among these three, and at least one value of the optical output power for the drive current and device temperature, at least one value concerning these three, or the at least one parameter value for determining the relationship among these three for each light emitting device, and the optical output wavelength and optical output power of each light emitting device may be set and controlled using at least one value stored in the thirty-fourth means for each light emitting device, the measuring points of the optical output wave length characteristics and optical output power characteristics of the plural light emitting devices constituting the thirty-first means can similarly be selected by performing the first to fourth procedures (twenty-seventh, twenty-eighth, thirty-first and thirty-second aspects of the invention) of the seventh embodiment or eighth embodiment to each light emitting device. Therefore, the effect of the invention is not changed.

In the seventh embodiment and the eighth embodiment, the measuring point for determining the dependence of the light emitting device optical output wavelength on the drive current and device temperature and the dependence of the light emitting device optical output power on the drive current and device temperature is selected to set and control the optical output wavelength and optical output power. However, the effect of the invention is not changed, even if the measuring point for determining the dependence of the light emitting device optical output wavelength on the drive current and device temperature is selected only to monitor the optical output wavelength.

In the seventh embodiment and the eighth embodiment. The means in which the optical output power is automatically controlled such that the optical output power is maintained at a given target value, namely the case where the optical output power is directly controlled by the automatic power control circuit (APC), is described by way of an example. However, the effect of the invention is not changed, even if the optical output power is indirectly controlled using the automatic current control circuit (ACC). In the seventh embodiment and the eighth embodiment, the effect of the invention is not changed, even if the optical output from the thirty-first means is either the continuous light (CW light) or the modulation light.

Ninth Embodiment

Figure 30:
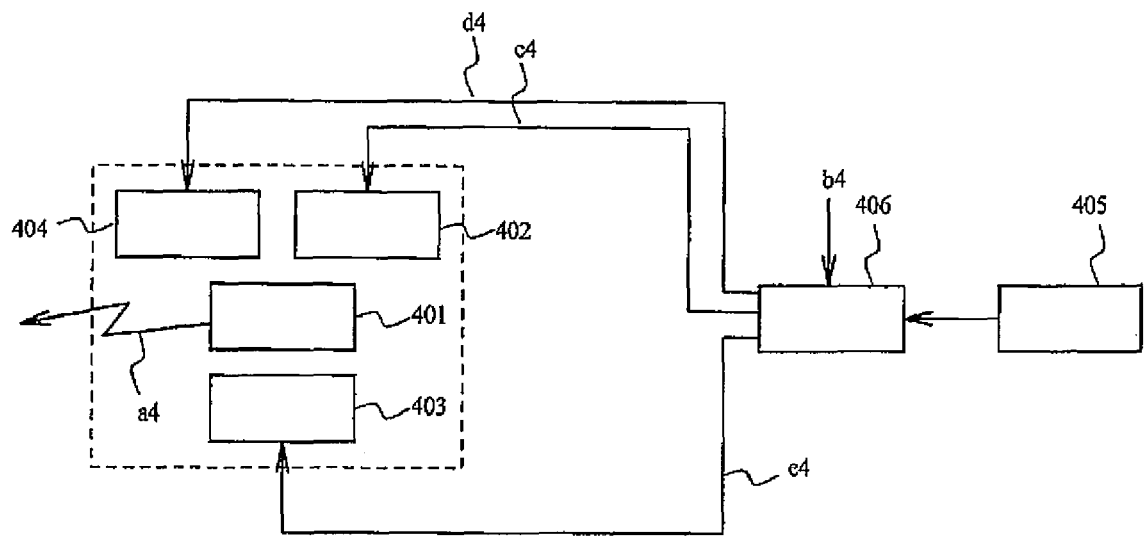
FIG. 30 is a block diagram showing a ninth embodiment of a direct modulation type communication light source unit according to the invention.

FIG. 30 shows a configuration of a ninth embodiment corresponding to thirty-third aspect of the invention.

In FIG. 30, the reference numeral 401 designates the forty-first means including a light emitting device such as LD to emit the light. The reference numeral 402 designates the forty-second means for automatically controlling the drive current or optical output power of the light emitting device constituting the forty-first means 401 by the feedback control or the like such that the drive current or optical output power is maintained at a given target value. The reference numeral 403 designates the forty-third means for automatically controlling the device temperature of the light emitting device constituting the forty-first means 401 by the feedback control or the like such that the device temperature is maintained at a given target value. The reference numeral 404 designates the forty-fourth means for automatically controlling the directly modulating RF amplitude of the light emitting device constituting the forty-first means 401 by the feedback control or the like such that the RF amplitude is maintained at a given target value.

The reference numeral 405 designates the forty-fifth means. At least one value of the optical output wavelength for the drive current and device temperature during the direct modulation satisfying the predetermined extinction ratio and eye mask requirement with respect to the light emitting device constituting the forty-first means 401, at least one value concerning these three, or at least one parameter value for determining the relationship among these three, at least one value of the optical output power for the drive current and device temperature during the direct modulation satisfying the predetermined extinction ratio and eye mask requirement, at least one value concerning these three, or at least one parameter value for determining the relationship among these three, and at least one value of the RF amplitude for the drive current and device temperature during the direct modulation satisfying the predetermined extinction ratio and eye mask requirement, at least one value concerning these three, or at least one parameter value for determining the relationship among these three are stored in the forty-fifth means.

The reference numeral 406 designates the forty-sixth means. The forty-sixth means 406 determines the drive current or optical output power and the device temperature at which both the optical output wavelength and the optical output power of the light emitting device become the separately specified values from the relationship among the drive current, device temperature, and optical output wavelength during the direct modulation satisfying the predetermined extinction ratio and eye mask requirement of the light emitting device and the relationship among the drive current, device temperature, and optical output power during the direct modulation satisfying the predetermined extinction ratio and eye mask requirement of the light emitting device. The forty-sixth means 406 also determines the RF amplitude in the determined drive current or optical output power and device temperature from the relationship among the drive current, device temperature, and RF amplitude in the drive current fluctuation during the direct modulation satisfying the predetermined extinction ratio and eye mask requirement of the light emitting device.

The reference numeral a4 designates the optical output from the forty-first means 401, the reference numeral b4 designates the specified optical output wavelength and optical output power, the reference numeral c4 designates the drive current or optical output power determined by the forty-sixth means 406, the reference numeral d4 designates the RF amplitude determined by the forty-sixth means 406, and the reference numeral e4 designates the device temperature determined by the forty-sixth means 406.

Figure 31:
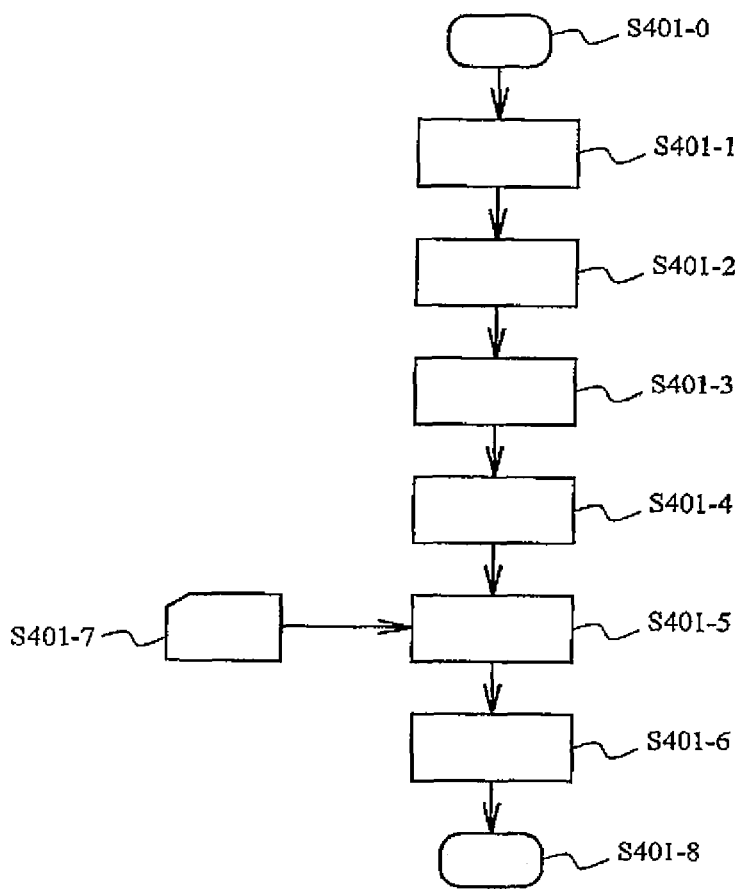
FIG. 31 is a flowchart showing the operating procedure of the ninth embodiment.

FIG. 31 shows an operating procedure of the ninth embodiment.

In S401-1, at least one value of the optical output wavelength for the drive current and device temperature during the direct modulation satisfying the predetermined extinction ratio and eye mask requirement, at least one value concerning these three, or at least one parameter value for determining the relationship among these three, at least one value of the optical output power for the drive current and device temperature during the direct modulation satisfying the predetermined extinction ratio and eye mask requirement, at least one value concerning these three, or at least one parameter value for determining the relationship among these three, and at least one value of the RF amplitude for the drive current and device temperature during the direct modulation satisfying the predetermined extinction ratio and eye mask requirement, at least one value concerning these three, or at least one parameter value for determining the relationship among these three, which are stored in the forty-fifth means 405, are read and outputted to the forty-sixth means 406.

In S401-2, forty-sixth means 406 computes the parameter value for determining the relationship among the drive current, device temperature, and optical output wavelength during the direct modulation satisfying the predetermined extinction ratio and eye mask requirement for the light emitting device constituting the forty-first means 401 using at least one value inputted from the forty-fifth means 405.

In S401-3, the forty-sixth means 406 computes the parameter value for determining the relationship among the drive current, device temperature, and optical output power during the direct modulation satisfying the predetermined extinction ratio and eye mask requirement for the light emitting device constituting the forty-first means 401 using at least one value inputted from the forty-fifth means 405.

Similarly, in S401-4, the forty-sixth means 406 computes the parameter value for determining the relationship among the drive current, device temperature, and RF amplitude during the direct modulation satisfying the predetermined extinction ratio and eye mask requirement for the light emitting device constituting the forty-first means 401 using at least one value inputted from the forty-fifth means 405.

Then, in S401-5, on the basis of the specified optical output wavelength and optical output power b4, the forty-sixth means 406 computes and determines the drive current or optical output power c4 and the device temperature e4 at which the optical output wavelength and optical output power of the light emitting device during the direct modulation satisfying the predetermined extinction ratio and eye mask requirement become the specified values at the same time using the parameter values computed in S401-2 and S401-3, and the forty-sixth means 406 computes the RF amplitude d4 in the computed and determined drive current or optical output power and device temperature using the parameter value computed in S401-4.

In S401-6, the drive current or optical output power computed in step S401-5 is set as the target value to the forty-second means 402, the device temperature e4 computed in step S401-5 is set as the target value to the forty-third means 403, and the RF amplitude d4 computed in step S401-5 to the forty-fourth means 404 as the target value. Thus, the optical output wavelength and optical output power of the light a4 from the forty-first means 401 can be set and controlled at the specified values.

For example, the above-described operating procedures S401-1 to S401-6 can be realized as follows.

In this case, the case in which the optical output wavelength characteristics during the direct modulation satisfying the predetermined extinction ratio and eye mask requirement of the light emitting device is well expressed by the plane (linear function of drive current and device temperature) in the three-dimensional space having the coordinate axes of the drive current, device temperature, and optical output wavelength, the optical output power characteristics during the direct modulation satisfying the predetermined extinction ratio and eye mask requirement of the light emitting device is well expressed by the plane (linear function of drive current and device temperature) in a three-dimensional space having the coordinate axes of the drive current, device temperature, and optical output power, and similarly the RF amplitude characteristics during the direct modulation satisfying the predetermined extinction ratio and eye mask requirement is well expressed by the plane (linear function of drive current and device temperature) in a three-dimensional space having the coordinate axes of the drive current, device temperature, and optical output wavelength (linear function of drive current and device temperature) will be described. The case in which the values of the optical output wavelength, optical output power and RF amplitude of the light emitting device for the determined drive current and device temperature are stored in the forty-fifth means 405 will be described by way of example.

In S401-1, these values stored in the forty-fifth means 405 are read and inputted to the forty-sixth means 406.

In S401-2, the forty-sixth means 406 computes the coefficient of the linear function expressing the optical output wavelength characteristics during the direct modulation satisfying the predetermined extinction ratio and eye mask requirement of the light emitting device using the values inputted from the forty-fifth means 405.

In S401-3, the forty-sixth means 406 computes the coefficient of the linear function expressing the optical output power characteristics during the direct modulation satisfying the predetermined extinction ratio and eye mask requirement of the light emitting device using the values inputted from the forty-fifth means 405.

In S401-4, the forty-sixth means 406 computes the coefficient of the linear function expressing the RF amplitude characteristics during the direct modulation satisfying the predetermined extinction ratio and eye mask requirement of the light emitting device using the values inputted from the forty-fifth means 405.

In this case, the coefficients computed in S401-2 to S401-4 are the parameter values for determining the above-described relationship among the drive current, device temperature, and optical output wavelength during the direct modulation satisfying the predetermined extinction ratio and eye mask requirement, the relationship among the drive current, device temperature, and optical output power during the direct modulation satisfying the predetermined extinction ratio and eye mask requirement, and the relationship among the drive current, device temperature, and RF amplitude during the direct modulation satisfying the predetermined extinction ratio and eye mask requirement.

In S401-5, because all the coefficients of the equations (linear equations) shown in FIG. 3(c) which express the optical output wavelength contour line and optical output power contour line are determined from the coefficients computed in S401-2 and S401-3 and the specified optical output wavelength and optical output power, the coordinate value (drive current and device temperature) of the intersecting point of the two isopleths is computed by utilizing these coefficients, and the RF amplitude is computed from the computed drive current and device temperature and the coefficient computed in S401-4.

In the above example, the case in which the dependence of the optical output wavelength, optical output power and RF amplitude during the direct modulation satisfying the predetermined extinction ratio and eye mask requirement of the light emitting device on the drive current and device temperature are well expressed by the planes (linear function of drive current and device temperature) is described for the sake of simplification. However, even if the dependence of the optical output wavelength, optical output power and RF amplitude during the direct modulation satisfying the predetermined extinction ratio and eye mask requirement of the light emitting device on the drive current and the device temperature are well expressed by the quadratic surface or the more general function, or well expressed by the plane or the curved surface in each of divided plural regions, the coefficients of the functions expressing the characteristics can numerically be determined by the similar procedure, so that the effect of the invention is not changed.

Tenth Embodiment

Figure 32:
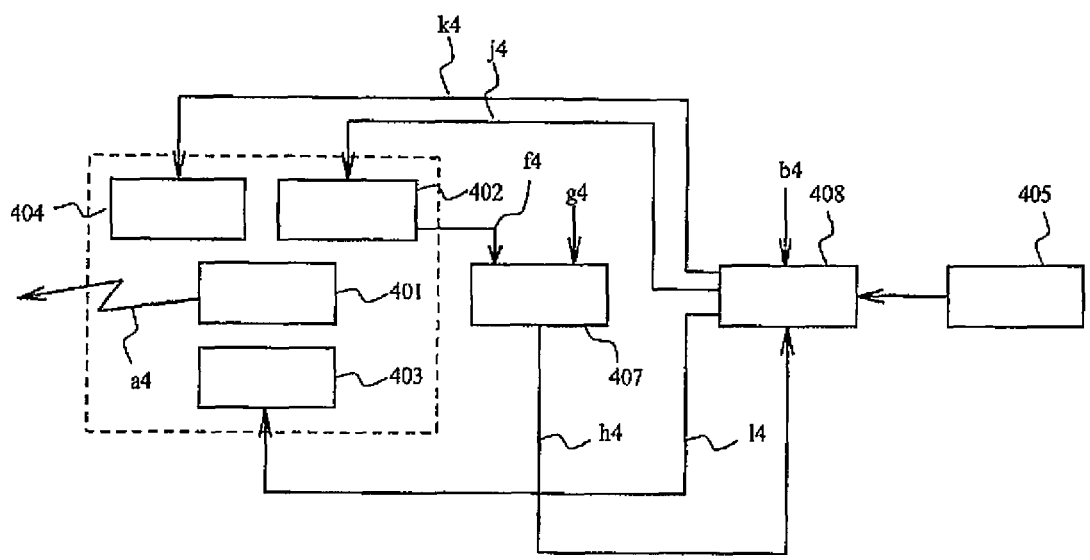
FIG. 32 is a block diagram showing a tenth embodiment of the direct modulation type communication light source unit according to the invention.

FIG. 32 shows a configuration of a tenth embodiment corresponding to thirty-fourth aspect of the invention. The tenth embodiment differs from the ninth embodiment shown in FIG. 30 in that the tenth embodiment includes the forty-seventh means 407 and the forty-eighth means 408 instead of the forty-sixth means 406.

The forty-seventh means 407 monitors the drive current of the light emitting device constituting the forty-first means 401, and makes the comparison determination whether or not the drive current is located in the separately specified allowable fluctuation range. When the drive current is not located in the separately specified allowable fluctuation range, the forty-seventh means 407 predicts the relationship among the drive current, device temperature, and optical output power in the drive current fluctuation of the light emitting device from the relationship among the drive current, device temperature, and optical output power during the direct modulation satisfying the predetermined extinction ratio and eye mask requirement of the light emitting device, which is determined by at least one value stored in the forty-fifth means 405 for the light emitting device. The forty-seventh means 407 also predicts the relationship among the drive current, device temperature, and RF amplitude in the drive current fluctuation of the light emitting device from the relationship among the drive current, device temperature, and RF amplitude during the direct modulation satisfying the predetermined extinction ratio and eye mask requirement of the light emitting device, which is determined by at least one value stored in the forty-fifth means 405 for the light emitting device.

The forty-eighth means 408 predicts the latest drive current or optical output power and the latest device temperature at which both the optical output wavelength and the optical output power during the direct modulation satisfying the predetermined extinction ratio and eye mask requirement in the drive current fluctuation of the light emitting device become the separately specified values, respectively, from the relationship among the drive current, device temperature, and optical output wavelength during the direct modulation satisfying the predetermined extinction ratio and eye mask requirement of the light emitting device, which is determined by at least one value stored in the forty-fifth means 405 for the light emitting device and from the relationship among the drive current, device temperature, and optical output power in the drive current fluctuation during the direct modulation satisfying the predetermined extinction ratio and eye mask requirement of the light emitting device, which is predicted by the forty-seventh means 407. The forty-eighth means 408 also predicts the latest RF amplitude in the latest drive current or optical output power and the latest device temperature from the relationship among the drive current, device temperature, and RF amplitude in the drive current fluctuation during the direct modulation satisfying the predetermined extinction ratio and eye mask requirement of the light emitting device, which is predicted by the forty-seventh means 407.

The f4 designates the drive current of the light emitting device constituting the forty-first means 401, the reference numeral g4 designates the allowable fluctuation range of the specified drive current, the reference numeral h4 designates the parameter value for determining the relationship among the drive current, device temperature, and optical output power and the parameter value for determining the relationship among the drive current, device temperature, and RF amplitude in the light emitting device drive current fluctuation, which is predicted by the forty-seventh means 407, the reference numeral j4 designates the latest drive current or optical output power determined by the forty-eighth means 408, the reference numeral k4 designates the latest RF amplitude determined by the forty-eighth means 408, and the reference numeral 14 designates the latest device temperature determined by the forty-eighth means 408.

Figure 33:
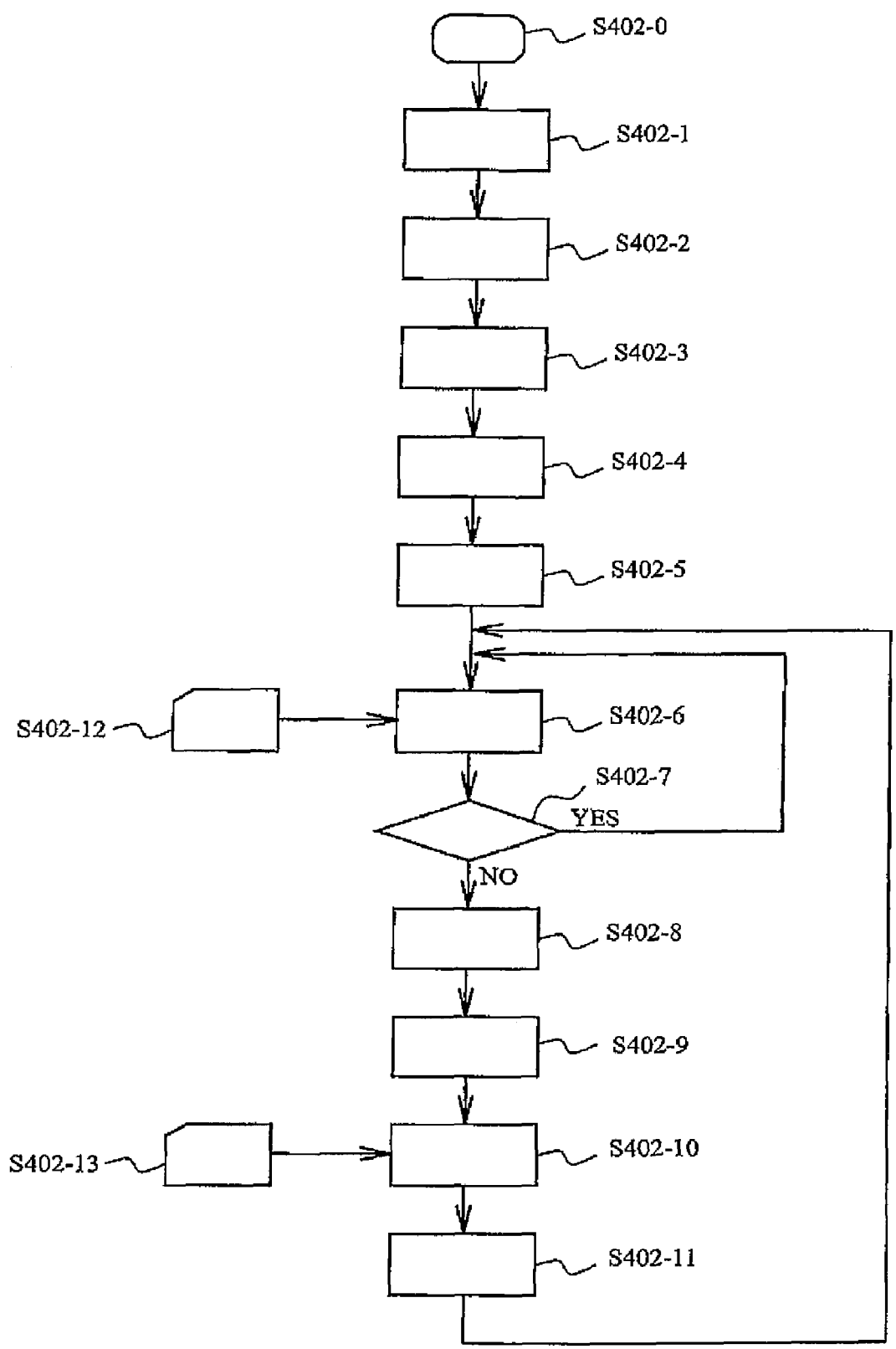
FIG. 33 is a flowchart showing the operating procedure of the tenth embodiment.

FIG. 33 shows an operating procedure of the tenth embodiment.

In S402-1, at least one value of the optical output wavelength for the drive current and device temperature during the direct modulation satisfying the predetermined extinction ratio and eye mask requirement, at least one value concerning these three, or at least one parameter value for determining the relationship among these three, which is stored in the forty-fifth means 405, is read and outputted to the forty-eighth means 408.

In S402-2, the forty-eighth means 408 computes the parameter value for determining the relationship among the drive current, device temperature, and optical output wavelength during the direct modulation satisfying the predetermined extinction ratio and eye mask requirement for the light emitting device constituting the forty-first means 401 using the at least one value inputted from the forty-fifth means 405.

In S402-3, at least one optical output power for the drive current and device temperature during the direct modulation satisfying the predetermined extinction ratio and eye mask requirement, at least one value concerning these three, or at least one parameter value for determining the relationship among these three and at least one RF amplitude for the drive current and device temperature during the direct modulation satisfying the predetermined extinction ratio and eye mask requirement, at least one value concerning these three, or at least one parameter value for determining the relationship among these three, which are stored in the forty-fifth means 405, are read and outputted to the forty-seventh means 407.

In S402-4, the forty-seventh means 407 computes the parameter value for determining the relationship among the drive current, device temperature, and optical output power before the drive current fluctuation during the direct modulation satisfying the predetermined extinction ratio and eye mask requirement for the light emitting device constituting the forty-first means 401 using the at least one value inputted from the forty-fifth means 405.

In S402-5, the forty-seventh means 407 computes the parameter value for determining the relationship among the drive current, device temperature, and RF amplitude before the drive current fluctuation during the direct modulation satisfying the predetermined extinction ratio and eye mask requirement for the light emitting device constituting the forty-first means 401 using the at least one value inputted from the forty-fifth means 405.

In S402-6, the forty-seventh means 407 monitors the drive current f4 of the light emitting device constituting the forty-first means 401 to make the comparison determination whether or not the drive current f4 is located in the allowable fluctuation range g4 of the separately specified drive current.

In S402-7, the procedure S402-6 is performed again when the drive current f4 is located in the allowable fluctuation range, and the procedure goes to S402-8 when the drive current f4 is not located in the allowable fluctuation range.

In S402-8, the forty-seventh means 407 predicts and computes the parameter value for determining the relationship among the drive current, device temperature, and optical output power during the direct modulation satisfying the predetermined extinction ratio and eye mask requirement for the light emitting device constituting the forty-first means 401 in the drive current fluctuation using the parameter value computed in S402-5, and the forty-seventh means 407 outputs the parameter value to the forty-eighth means 408.

In S402-9, the forty-seventh means 407 predicts and computes the parameter value for determining the relationship among the drive current, device temperature, and RF amplitude during the direct modulation satisfying the predetermined extinction ratio and eye mask requirement for the light emitting device constituting the forty-first means 401 in the drive current fluctuation using the parameter value computed in S402-5, and the forty-seventh means 407 outputs the parameter value to the forty-eighth means 408.

In S402-10, on the basis of the specified optical output wavelength and optical output power, the forty-eighth means 408 computes the latest drive current or optical output power j4 and the latest device temperature 14 at which the optical output wavelength and the optical output power during the direct modulation satisfying the predetermined extinction ratio and eye mask requirement in the drive current fluctuation of the light emitting device constituting the forty-first means 401 become the specified valuesb4 at the same time using the parameter value computed in S402-2 and the parameter value h4 predicted in S402-8. The forty-eighth means 408 also computes the latest RF amplitude k4 in the latest drive current or optical output power j4 and the latest device temperature 14 using the parameter computed in the procedure S402-9.

In S402-11, the drive current or optical output power j4 computed in S402-10 is set to the forty-second means 402 as the new target value in the drive current fluctuation, the latest device temperature 14 computed in S402-10 is set to the forty-third means 403 as the new target value, and the RF amplitude k4 computed in S402-10 is set to the forty-fourth means 404 as the new target value in the drive current fluctuation. Then, the procedure returns to S402-6.

Thus, even in the drive current fluctuation, the adjustment and control can automatically be performed such that both the optical output wavelength and the optical output power of the light a4 from the forty-first means 401 become the separately specified values b4.

For example, the above-described operating procedures S402-1 to S402-5, S402-6 and S402-7, and S402-8 to S402-10 can be realized as follows.

First the operating procedures S402-1 to S402-5 will be described. In this case, the case in which the optical output wavelength characteristics during the direct modulation satisfying the predetermined extinction ratio and eye mask requirement of the light emitting device is well expressed by the plane (linear function of drive current and device temperature) in the three-dimensional space having the coordinate axes of the drive current, device temperature, and optical output wavelength, the optical output power characteristics during the direct modulation satisfying the predetermined extinction ratio and eye mask requirement of the light emitting device is well expressed by the plane (linear function of drive current and device temperature) in a three-dimensional space having the coordinate axes of the drive current, device temperature, and optical output power, and similarly the RF amplitude characteristics during the direct modulation satisfying the predetermined extinction ratio and eye mask requirement is well expressed by the plane (linear function of drive current and device temperature) in a three-dimensional space having the coordinate axes of the drive current, device temperature, and optical output wavelength (linear function of drive current and device temperature) will be described. The case in which the values of the optical output wavelength, optical output power and RF amplitude during the direct modulation satisfying the predetermined extinction ratio and eye mask requirement of the light emitting device for the determined drive current and device temperature are stored in the forty-fifth means 405 will be described by way of example.

In S402-1, the optical output wavelength characteristics and optical output power characteristics values, stored in the forty-fifth means 405, during the direct modulation satisfying the predetermined extinction ratio and eye mask requirement for the determined drive current and device temperature are read and inputted to the forty-eighth means 408.

In S402-2, the forty-eighth means 408 computes the coefficient of the linear function of the optical output wavelength characteristics of the light emitting device during the direct modulation satisfying the predetermined extinction ratio and eye mask requirement using the values inputted from the forty-fifth means 405.

Similarly, in S402-3, the light emitting device optical output power value during the direct modulation satisfying the predetermined extinction ratio and eye mask requirement for the determined drive current and device temperature and the light emitting device RF amplitude during the direct modulation satisfying the predetermined extinction ratio and eye mask requirement for the determined drive current and device temperature, which are stored in the forty-fifth means 405, are read and inputted to the forty-seventh means 407.

In S402-4, the forty-seventh means 407 computes the coefficient of the linear function expressing the optical output power characteristics of the light emitting device during the direct modulation satisfying the predetermined extinction ratio and eye mask requirement before the drive current fluctuation of the light emitting device using the values inputted from the forty-fifth means 405.

In S402-5, the forty-seventh means 407 computes the coefficient of the linear function expressing the RF amplitude characteristics of the light emitting device during the direct modulation satisfying the predetermined extinction ratio and eye mask requirement before the drive current fluctuation of the emitting device using the values inputted from the forty-fifth means 405. In this case, the coefficients computed in S402-2, S402-4, and S402-5 are the parameter values for determining the above-described relationship among the drive current, device temperature, and optical output wavelength during the direct modulation satisfying the predetermined extinction ratio and eye mask requirement, the relationship among the drive current, device temperature, and optical output power during the direct modulation satisfying the predetermined extinction ratio and eye mask requirement and the relationship among the drive current, device temperature, and RF amplitude during the direct modulation satisfying the predetermined extinction ratio and eye mask requirement.

Then, the operating procedures S402-6 and S402-7 will be described.

In S402-6, the comparison determination is made to the value which is obtained by performing the filtering process of reducing the instantaneous noise to the drive current of the light emitting device constituting the forty-first means 401 and the allowable fluctuation range of the specified drive current. Examples of the filtering process include taking the time average (movement average) for the determined short time, passing the drive current through the low-frequency pass filter or the high-frequency cut filter having the determined cut-off characteristics.

In S402-7, the procedure goes to S402-8 only when the comparison determination result in S402-6 does not exists in the range in determined consecutive times not lower than one or only when the comparison determination result exists out of the range, and the procedure returns to S402-6 in other cases.

In this case, the drive current allowable fluctuation range is separately specified. However, assuming that $i_{av}$ is a time average value of the drive current for a determined long time, $\sigma$ is a standard deviation, $\alpha$ is a determined multiple, and $i_{new}$ is the latest target value of the drive current, even if the optical communication light source unit (for example, forty-seventh means 407 or forty-eighth means 408) computes $i_{av} \pm \alpha\sigma$ or $i_{new} \pm \alpha\sigma$ to set either of them at the allowable fluctuation range of the drive current, the effect of the invention is not changed.

The effect of the invention is not changed, even if the maximum value Max and the minimum value Min of the drive current are determined by the monitoring for a determined long time in which aged deterioration is not generated in the optical output power characteristics of the light emitting device although the sufficiently long time since a predetermined time elapses to stabilize the optical output of the light emitting device after the power-on to set the range determined by the Max and Min at the drive current allowable fluctuation range.

Finally the operating procedures S402-8 to S402-10 will be described.

In S402-8, when the monitored drive current is not located in the allowable fluctuation range of the specified drive current based on the comparison determination result in S402-6, the coefficient of the linear function expressing the optical output power characteristics during the direct modulation satisfying the predetermined extinction ratio and eye mask requirement in the drive current fluctuation is predicted and computed based on the coefficient, computed in S402-4, of the linear function expressing the optical output power characteristics during the direct modulation satisfying the predetermined extinction ratio and eye mask requirement before the drive current fluctuation of the light emitting device. That is, the coefficient of the linear function expressing the plane in which the plane (linear function) expressing the optical output power characteristics of the light emitting device is moved in parallel along the coordinate axis concerning the drive current according to the increase or decrease in drive current is predicted and computed.

Then, in S402-9, the coefficient of the linear function expressing the RF amplitude characteristics during the direct modulation satisfying the predetermined extinction ratio and eye mask requirement in the drive current fluctuation is predicted and computed based on the coefficient, computed in S402-5, of the linear function expressing the RF amplitude characteristics during the direct modulation satisfying the predetermined extinction ratio and eye mask requirement before the drive current fluctuation of the light emitting device. That is, the coefficient of the linear function expressing the plane in which the plane (linear function) expressing the RF amplitude characteristics of the light emitting device is moved in parallel along the coordinate axis concerning the drive current according to the increase or decrease in drive current is predicted and computed. In this case, the coefficient computed in S402-8 is the parameter value for determining the relationship among the drive current, device temperature, and optical output power during the direct modulation satisfying the predetermined extinction ratio and eye mask requirement in the drive current fluctuation, and the coefficient computed in S402-9 is the parameter value for determining the relationship among the drive current, device temperature, and RF amplitude during the direct modulation satisfying the predetermined extinction ratio and eye mask requirement in the drive current fluctuation.

In S402-10, because all the coefficients of the equations (linear equations) which express the optical output wavelength contour line and the optical output power contour line in the drive current fluctuation, are determined from the coefficients computed in S402-2 and S402-8 and the specified optical output wavelength and optical output power, the latest drive current or optical output power and the latest device temperature in the drive current fluctuation are computed as the coordinate value (drive current and device temperature) of the intersecting point of the two isopleths by utilizing these coefficients. The latest RF amplitude is computed using the latest computed drive current or optical output power, the latest device temperature, and the coefficient computed in S402-9.

In the above example, the case where the dependence of the optical output wavelength, optical output power, and RF amplitude during the direct modulation satisfying the predetermined extinction ratio and eye mask requirement of the light emitting device on the drive current and the device temperature are well expressed by the planes (linear function of drive current and device temperature), respectively, is described for the sake of simplification. However, even if the dependence of the optical output wavelength, optical output power, and RF amplitude of the light emitting device on the drive current and on the device temperature are well expressed by the quadratic surface or the more general function, or well expressed by the plane or the curved surface in each of divided plural regions, the coefficients of the functions expressing the characteristics can numerically be determined by the similar procedure, so that the effect of the invention is not changed.

Eleventh Embodiment

Figure 34:
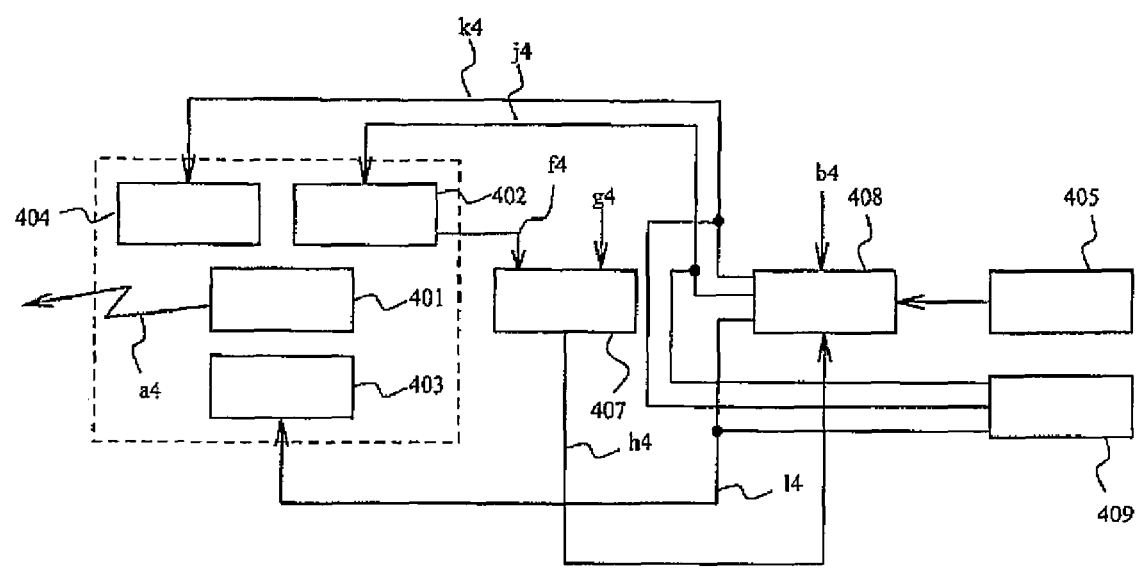
FIG. 34 is a block diagram showing an eleventh embodiment of a direct modulation type communication light source unit according to the invention.

FIG. 34 shows a configuration of an eleventh embodiment corresponding to thirty-fifth aspect of the invention. The eleventh embodiment differs from the tenth embodiment shown in FIG. 32 in that the forty-ninth means 409, in which the latest drive current or optical output power j4, the latest RF amplitude k4, and the latest device temperature 14 which are determined by the forty-eighth means 408 are stored, is added.

Figure 35:
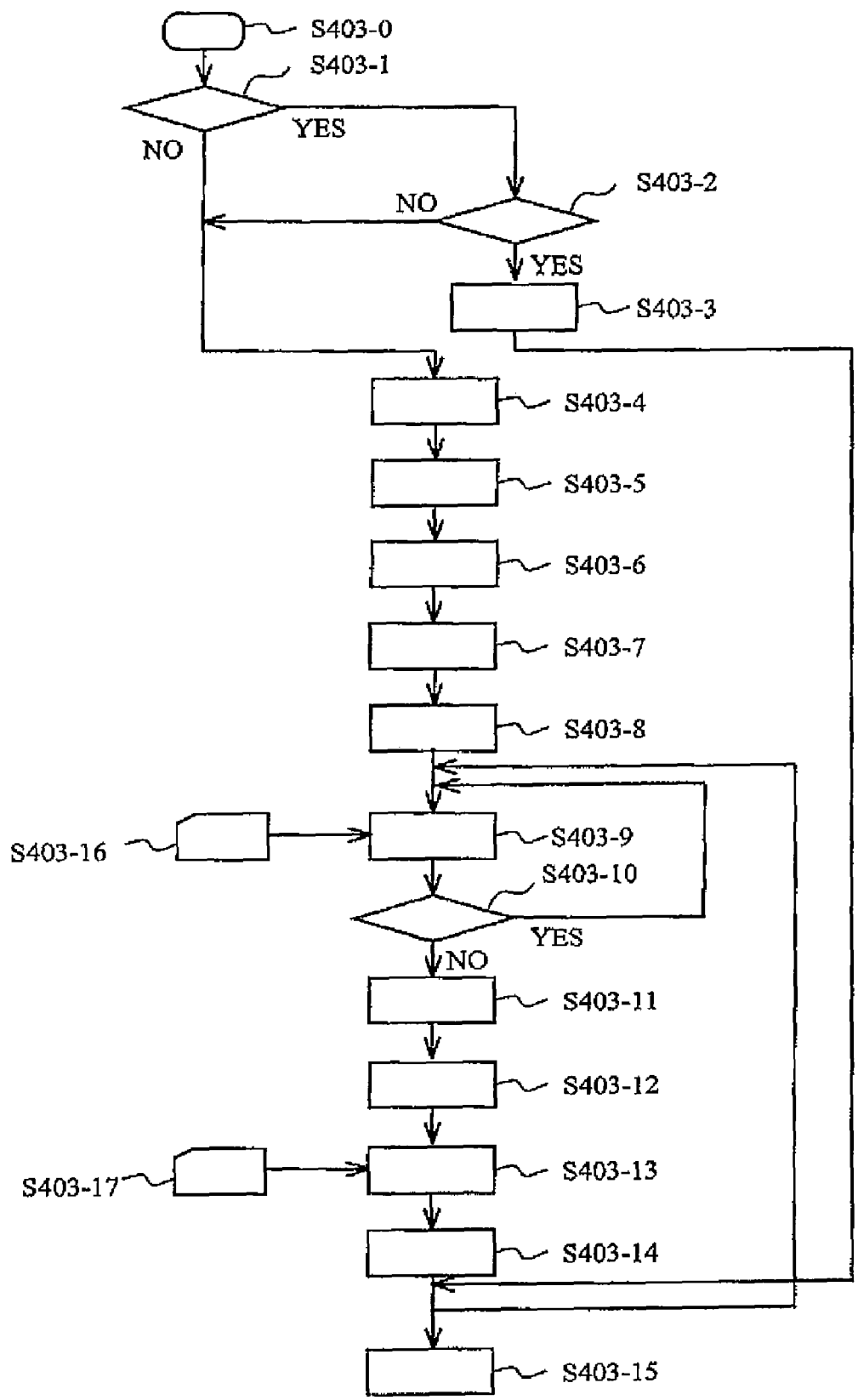
FIG. 35 is a flowchart showing the operating procedure of the eleventh embodiment.

FIG. 35 shows an operating procedure of the eleventh embodiment. The portions which are different from the operating procedure shown in FIG. 33 will mainly be described below.

In S403-1, in consideration of the warm start of the optical communication light source unit, it is determined whether or not the value stored in the forty-ninth means 409 is used.

When the value is used, it is further determined in S403-2 whether or not the latest drive current or optical output power j4, RF amplitude k4, and device temperature 14, which are determined by the forty-eighth means 408, are stored in the forty-ninth means 409.

When the latest drive current or optical output power j4, RF amplitude k4, and device temperature 14, which are determined by the forty-eighth means 408, are stored in the forty-ninth means 409, these values are read and outputted to the forty-second means 402, forty-third means 403, and forty-fourth means 404, respectively, in S403-3.

Then, in S403-15, the forty-second means 402, forty-third means 403, and forty-fourth means 404 set the values inputted from the forty-ninth means 409 at the target values respectively.

On the other hand, when the value stored in the forty-ninth means 409 is not used, or when the latest drive current or optical output power j4, RF amplitude k4, and device temperature 14, which are determined by the forty-eighth means 408, are not stored in the forty-ninth means 409, the procedures S403-4 to S403-13 are similar to the procedures S402-1 to S402-10 in the tenth embodiment.

Then, in S403-14, the latest drive current or optical output power j4, the latest RF amplitude k4, and the latest device temperature 14, which are determined in S403-13 are stored in the forty-ninth means 409. The next S403-15 is similar to the procedure S402-11 in the tenth embodiment.

The warm start of the optical communication light source unit having the configuration of the tenth embodiment is considered in the eleventh embodiment. However, the effect of the invention is not changed, even if the warm start is performed to the optical communication light source unit having the configuration of the ninth embodiment.

Twelfth Embodiment

Figure 36:
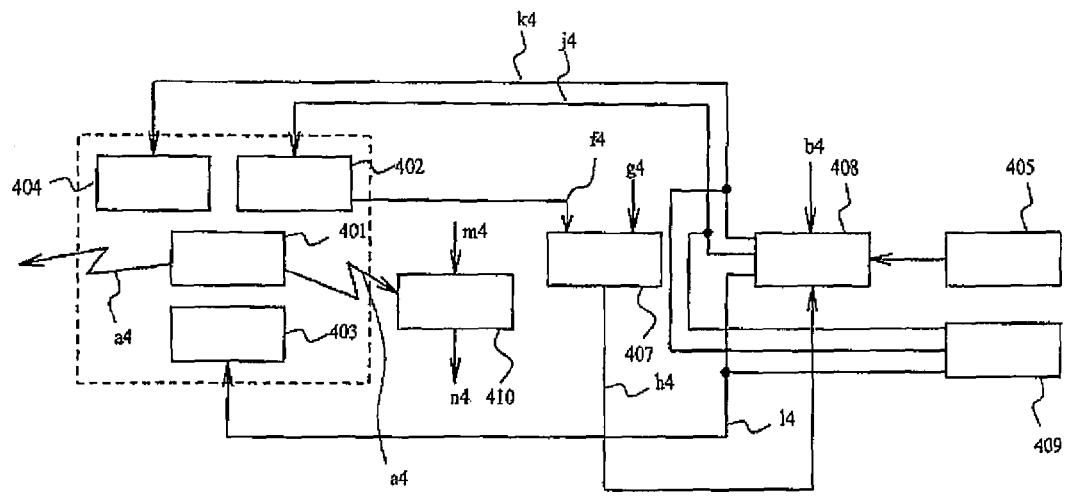
FIG. 36 is a block diagram showing a twelfth embodiment of a direct modulation type communication light source unit according to the invention.

FIG. 36 shows a configuration of a twelfth embodiment corresponding to thirty-sixth aspect of the invention. The configuration shown in FIG. 36 differs from the configuration of the eleventh embodiment shown in FIG. 34 in that the fiftieth means 410, which monitors both or one of the optical output wavelength and optical output power of the light a4 from the forty-first means 401, makes the comparison determination whether or not the optical output wavelength and optical output power are located in the separately specified optical output wavelength range and optical output power range respectively, and outputs the comparison determination result, is added. The case in which the comparison determination is made to both the optical output wavelength and the optical output power will be described in the twelfth embodiment.

Figure 37:
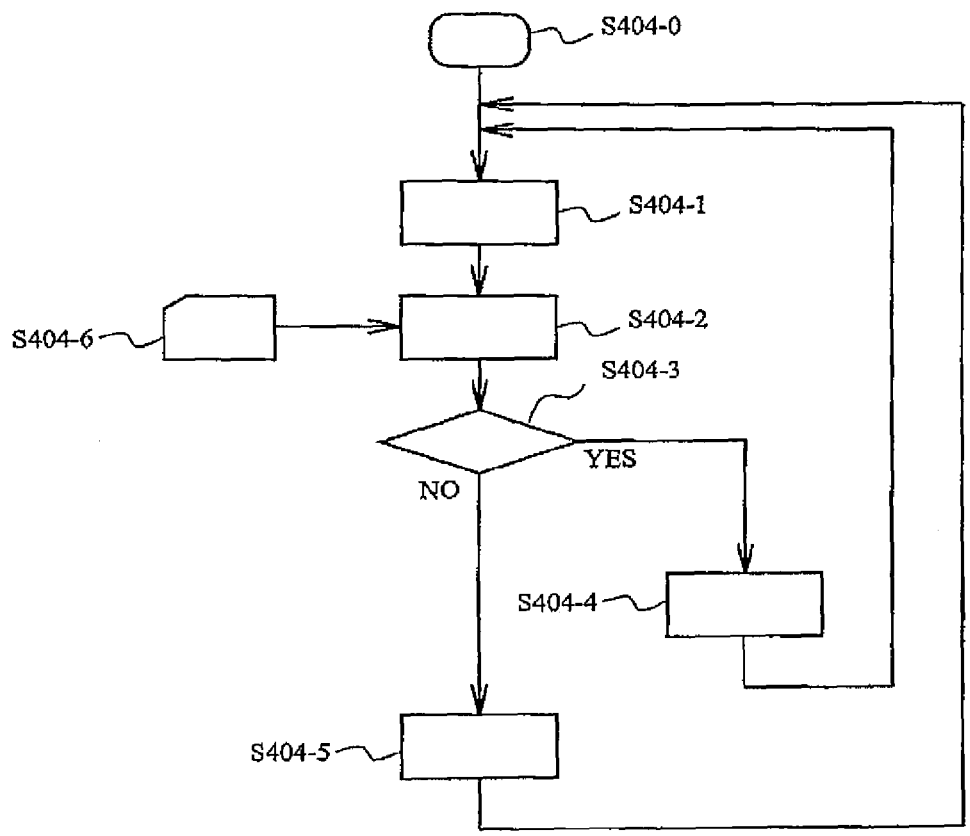
FIG. 37 is a flowchart showing the operating procedure of the twelfth embodiment.

FIG. 37 shows an operating procedure of the twelfth embodiment.

While the drive current or optical output power, the RF amplitude, and the device temperature are set, adjusted, and controlled such that the optical output wavelength and optical output power become the specified optical output wavelength and optical output power b4 by the procedures similar to the operating procedures S403-1 to S403-15 in the eleventh embodiment, the optical output wavelength and optical output power are monitored for the light a4 from the forty-first means 401.

In S404-1, the fiftieth means 410 monitors both the optical output wavelength and the optical output power of the light a4 from the forty-first means 401 which is driven by the latest drive current or optical output power j4, the latest device temperature 14, and the latest RF amplitude k4, which are determined by the forty-eighth means 408.

Then, in S404-2, the optical output wavelength and optical output power which are monitored in S404-1 are compared to the separately specified optical output wavelength range and optical output power range m4.

The determination is made in S404-3. When the monitored optical output wavelength and optical output power are located in the specified optical output wavelength range and optical output power range respectively, the comparison determination result n4 is outputted as the status display in S404-4, and the procedure returns to S404-1.

When the monitored optical output wavelength and optical output power are not located in the specified optical output wavelength range and optical output power range respectively, the comparison determination result n4 is outputted as the abnormal warning in S404-5, and the procedure returns to S404-1.

In the above-described operating procedures, for example, S404-1 can be realized as follows. The light a4 from the forty-first means 401 is inputted to the optical band transmission means such as the optical filter which transmits the light having the specified optical output wavelength range. The output is further inputted to the photoelectric conversion means such as the photodiode which converts the optical power of the input light into the photocurrent. The optical output wavelength and optical output power are monitored and compared by monitoring and comparing the photocurrent obtained in the above-described manner. That is, the above-described comparison is performed by comparing the photocurrent range and the photocurrent obtained by the above monitoring. The photocurrent range is determined from the previously known optical wavelength transmission characteristics of the optical band transmission means, the previously known conversion characteristics of the photoelectric conversion means, the specified optical output wavelength range, and optical output power range respectively.

The optical output wavelength and optical output power of the optical communication light source unit having the configuration of the eleventh embodiment are monitored in the twelfth embodiment. However, the effect of the invention is not changed, even if the optical output wavelength and optical output power of the optical communication light source unit having the configuration of the ninth embodiment or tenth embodiment are monitored.

Thus, in the ninth embodiment to the twelfth embodiment, the case where the forty-first means 401 includes one light emitting device, is described for the sake of simplification. However, even in the case where the forty-first means 401 may include the plural light emitting device, the forty-second means 402 may automatically control the drive current or optical output power of each light emitting device such that the drive current or optical output power is maintained at the target value given to each light emitting device, the forty-third means 403 may automatically control the device temperature of each light emitting device such that the device temperature is maintained at the target value given to each light emitting device, and the forty-fourth means 404 may automatically control the RF amplitude of each light emitting device such that the RF amplitude is maintained at the target value given to each light emitting device, at least one value of the optical output wavelength for the drive current and device temperature during the direct modulation satisfying the predetermined extinction ratio and eye mask requirement, at least one value concerning these three, or at least one parameter value for determining the relationship among these three, at least one value of the optical output power for the drive current and device temperature during the direct modulation satisfying the predetermined extinction ratio and eye mask requirement, at least one value concerning these three, or at least one parameter value for determining the relationship among these three, and at least one value of the RF amplitude for the drive current and device temperature during the direct modulation satisfying the predetermined extinction ratio and eye mask requirement, at least one value concerning these three, or at least one parameter value for determining the relationship among these three 405 for each light emitting device constituting the forty-first means 401, are stored in the forty-fifth means the forty-sixth means 406 determines the drive current or optical output power and the device temperature at which both the optical output wavelength and the optical output power of each light emitting device become the separately specified values from the relationship among the drive current, device temperature, and optical output wavelength during the direct modulation satisfying the predetermined extinction ratio and eye mask requirement in each light emitting device, the relationship being determined by at least one value stored in the forty-fifth means 405 for each light emitting device constituting the forty-first means 401, and from the relationship among the drive current, device temperature, and optical output power during the direct modulation satisfying the predetermined extinction ratio and eye mask requirement of each light emitting device, the forty-sixth means 406 also determines the RF amplitude in the determined drive current or optical output power and device temperature from the relationship among the drive current, device temperature, and RF amplitude in the drive current fluctuation during the direct modulation satisfying the predetermined extinction ratio and eye mask requirement of each light emitting device (forty-ninth aspect), and thereby the optical output wavelength and optical output power can be set and the predetermined extinction ratio and eye mask requirement can be achieved for each light emitting device constituting the forty-first means 401, the forty-seventh means 407 monitors the drive current of each light emitting device constituting the forty-first means 401, makes the comparison determination whether or not the drive current is located in the allowable fluctuation range separately specified in each light emitting device, and predicts the relationship among the drive current, device temperature, and optical output power in the drive current fluctuation of the light emitting device with respect to the light emitting device whose drive current is not located in the allowable fluctuation range from the relationship among the drive current, device temperature, and optical output power during the direct modulation satisfying the predetermined extinction ratio and eye mask requirement of the light emitting device, the relationship being determined by at least one value for the light emitting device stored in the forty-fifth means 405, the forty-seventh means 407 also predicts the relationship among the drive current, device temperature, and RF amplitude in the drive current fluctuation of the light emitting device from the relationship among the drive current, device temperature, and RF amplitude during the direct modulation satisfying the predetermined extinction ratio and eye mask requirement of the light emitting device, the relationship being determined at least one value stored in the forty-fifth means 405 for the light emitting device, the forty-eighth means 408 predicts the latest drive current or optical output power and the latest device temperature at which both the optical output wavelength and the optical output power during the direct modulation satisfying the predetermined extinction ratio and eye mask requirement in the drive current fluctuation of the light emitting device become the values separately specified in each light emitting device with respect to the light emitting device whose drive current is not located in the allowable fluctuation range from the relationship among the drive current, device temperature, and optical output wavelength during the direct modulation satisfying the predetermined extinction ratio and eye mask requirement of the light emitting device, the relationship being determined by at least one value for the light emitting device stored in the forty-fifth means, and from the relationship among the drive current, device temperature, and optical output power in the drive current fluctuation during the direct modulation satisfying the predetermined extinction ratio and eye mask requirement of the light emitting device, the relationship being predicted from the forty-seventh means 407, the forty-eighth means 408 also predicts the latest RF amplitude in the latest drive current or optical output power and the latest device temperature from the relationship among the drive current, device temperature, and RF amplitude in the drive current fluctuation during the direct modulation satisfying the predetermined extinction ratio and eye mask requirement for the light emitting device, the relationship being predicted by the forty-seventh means 407 (fiftieth aspect of the invention), and thereby the optical output wavelength and optical output power can be adjusted and controlled and the predetermined extinction ratio and eye mask requirement can be achieved for each light emitting device constituting the forty-first means 401, the latest target values given to the forty-second means, forty-third means, and forty-fourth means in each light emitting device are stored in the forty-ninth means 409 (fifty-first aspect of the invention), and thereby the setting, adjustment, and control including the case where the warm start of the optical output wavelength and optical output power is performed to each light emitting device constituting the forty-first means 401 can be performed, the fiftieth means 410 monitors the optical output generated by each light emitting device constituting the forty-first means 401, makes the comparison determination whether or not both or one of the optical output wavelength and optical output power of the optical output are located in the separately specified optical output wavelength range and optical output power range respectively, and outputs the comparison determination result (fifty-second aspect of the invention), and thereby both or one of the optical output wavelength and optical output power can similarly be monitored for each light emitting device constituting the forty-first means 401. Therefore, the effect of the invention is not changed.

Although the optical output wavelengths separately specified for the plural light emitting devices constituting the forty-first means 401 are usually different from one another, an arbitrary optical output wavelength including all the same wavelength or including partially the same wavelength can obviously be specified to each light emitting device. Although the optical output powers separately specified for the plural light emitting devices constituting the forty-first means 401 are usually similar to one another, an arbitrary optical output power including only the single power or including partially the same power can obviously be specified to each light emitting device.

The case where at least one value of itself (raw value) is stored in the forty-fifth means 405, is described in the ninth embodiment to the twelfth embodiment. However, the effect of the invention is not changed, even if the coding process such as the normalization, the scramble, the bit inversion, and the encryption is previously performed to all the values or at least one value to store the value in the forty-fifth means 405 and then the value is used by performing the decoding process such as the denormalization, the descramble, the bit inversion, and the encryption decoding after the value is read from the forty-fifth means 405.

Similarly, in the eleventh embodiment, the case where the latest drive current or optical output power j4, the latest RF amplitude k4, and the latest device temperature 14 of themselves (raw values) which are determined by the forty-eighth means 408 are stored in the forty-ninth means 409, is described. However, the effect of the invention is not changed, even if the coding process such as the normalization, the scramble, the bit inversion, and the encryption is previously performed to all the values or at least one value to store the value in the forty-ninth means 409 and then the value is used by performing the decoding process such as the denormalization, the descramble, the bit inversion, and the encryption decoding after the value is read from the forty-ninth means 409.

In the tenth embodiment and the eleventh embodiment, the drive current is monitored in the procedures S402-6 and S403-9. However, the effect of the invention is not changed, even if the fluctuation amount from the target value or the average value of the drive current is monitored.

In the ninth embodiment to the twelfth embodiment, the forty-second means automatically controls the optical output power by the feedback control or the like such that the optical output power is maintained at a given target value, namely, the optical output power is directly controlled by the automatic power control circuit (APC). However, the effect of the invention is not changed, even if the optical output power is indirectly controlled using the automatic current control circuit (ACC).

In the twelfth embodiment, the effect of the invention is not changed, even if the comparison determination and the result output thereof are performed for both or one of the optical output wavelength and the optical output power. Furthermore, the effect of the invention is not changed, even if both or one of the status display and the abnormal warning is outputted for the optical output wavelength and the optical output power.

In the ninth embodiment to the twelfth embodiment, the dependence of the optical output power during the direct modulation satisfying the predetermined extinction ratio and eye mask requirement in the drive current fluctuation on the drive current and the device temperature is well expressed by the dependence in which the dependence before the drive current fluctuation is moved in parallel according to the fluctuation amount of the drive current. However, the effect of the invention is not changed, even if the dependence is well expressed by the dependence which is converted according to the fluctuation amount of the drive current such that both or one of the coefficient of the term concerning the drive current of the characteristic surface equation expressing the dependence and the coefficient of the term concerning the device temperature of the equation is converted according to the fluctuation amount of the drive current.

In the ninth embodiment to the twelfth embodiment, the dependence of the RF amplitude during the direct modulation satisfying the predetermined extinction ratio and eye mask requirement in the drive current fluctuation on the drive current and the device temperature is well expressed by the dependence in which the dependence before the drive current fluctuation is moved in parallel according to the fluctuation amount of the drive current. However, the effect of the invention is not changed, even if the dependence is well expressed by the dependence which is converted according to the fluctuation amount of the drive current such that both or one of the coefficient of the term concerning the drive current of the characteristic surface equation expressing the dependence and the coefficient of the term concerning the device temperature of the equation is converted according to the fluctuation amount of the drive current.

Thirteenth Embodiment

Figure 38:
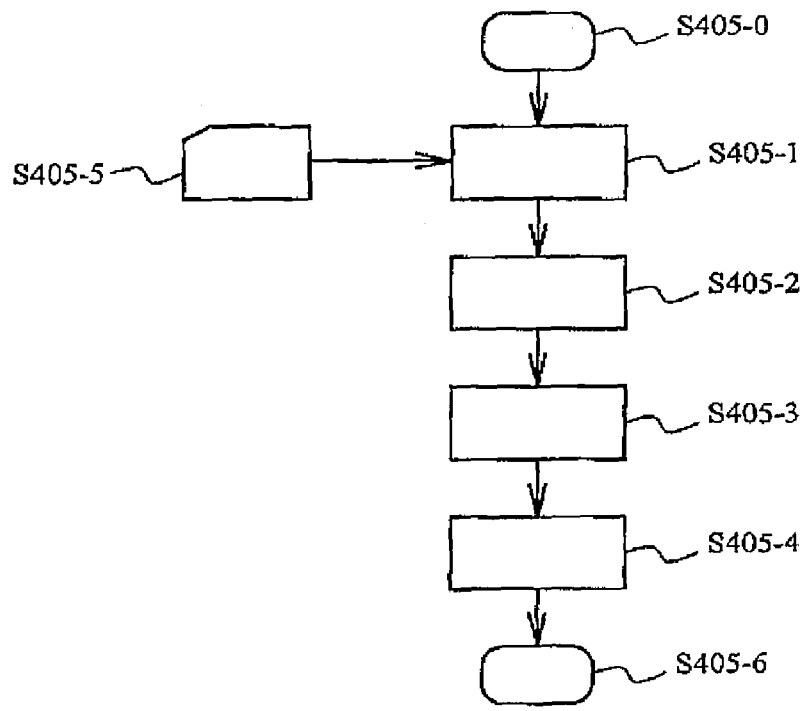
FIG. 38 is a flowchart showing a operating procedure of a thirteenth embodiment according to the invention.

FIG. 38 shows a method of a thirteenth embodiment corresponding to thirty-seventh, thirty-ninth, forty-first, forty-third, forty-fifth and forty-seventh aspects of the invention. The thirteenth embodiment shows the method of selecting the measuring point for determining the dependence of the optical output wavelength during the direct modulation satisfying the predetermined extinction ratio and eye mask requirement of the light emitting device on the drive current and device temperature, the dependence of the optical output power during the direct modulation satisfying the predetermined extinction ratio and eye mask requirement of the light emitting device on the drive current and device temperature, and the dependence of the RF amplitude during the direct modulation satisfying the predetermined extinction ratio and eye mask requirement of the light emitting device on the drive current and device temperature. By way of example, the method can be performed by the selection circuit included in the forty-sixth means 406 of FIG. 30, the forty-eighth means 408 of FIG. 32, the forty-eighth means 408 of FIG. 34, and the forty-eighth means 408 of FIG. 36.

In S405-1, the operating range ($i_1 \leq i \leq i_2$) of the separately specified drive current i and the operating range ($T_1 \leq T \leq T_2$) of the separately specified device temperature T in the light emitting device constituting the forty-first means are inputted.

Figure 27:
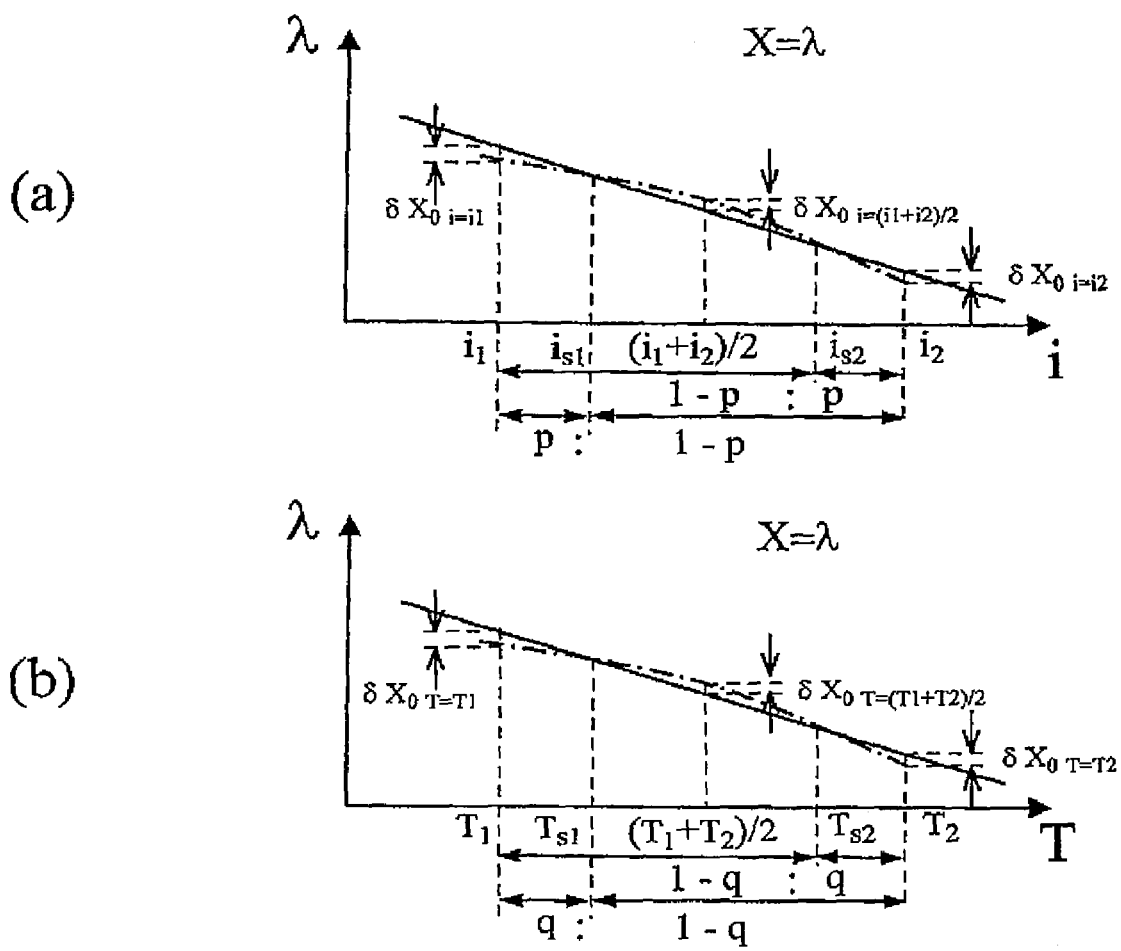
FIG. 27 is an explanatory view of the optical output wavelength approximate error in the light emitting device operating range, FIG. 27(*a*) shows the approximate error for the dependence of the optical output wavelength on the drive current, and FIG. 27(*b*) shows the approximate error for the dependence of the optical output wavelength on the device temperature.
Figure 28:
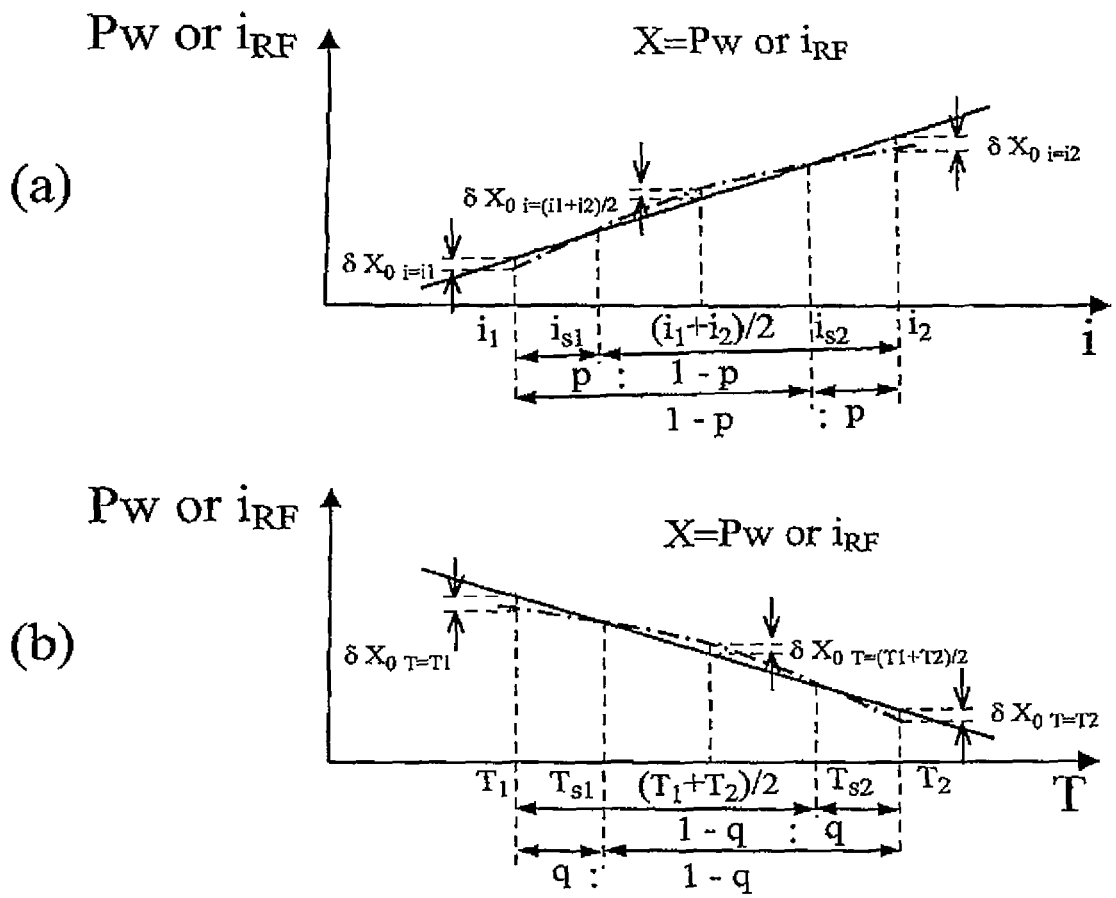
FIG. 28 is an explanatory view of the approximate error of the optical output power or RF amplitude in the light emitting device operating range, FIG. 28(*a*) shows the approximate error for the optical output power or drive current dependence, and FIG. 28(*b*) shows the approximate error for the optical output power or dependence on device temperature.
Figure 29:
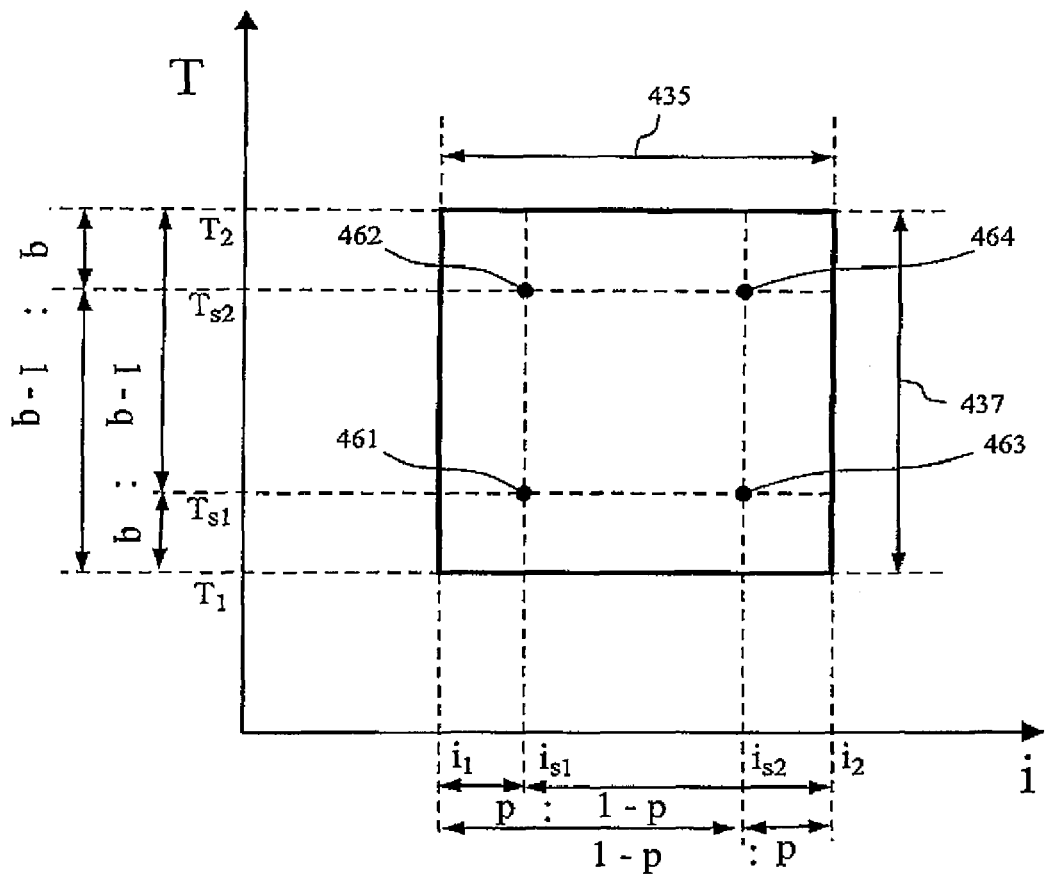
FIG. 29 is an explanatory view showing a relationship between light emitting device operating range and the measuring points of the optical output wavelength characteristics, optical output power characteristics, and RF amplitude characteristics.

In S405-2, as shown in FIG. 27(a), on the two-dimensional plane having the coordinate axes of the device temperature and the optical output wavelength, the drive current operating range ($i_1 \leq i \leq i_2$) of the specified drive current i is internally divided by p:1-p and 1-p:p to determine drive currents $i_{s1}$ and $i_{s2}$ at the internally dividing point using an arbitrary value p (p is a specific coordinate of an internally dividing point in the drive current operating range, and p is a real number satisfying 0<p<1) and thereby the minimum value and the maximum value of the approximate error, namely, $|\delta\lambda_0|_{i=i1\ or\ i2}$ and $|\delta\lambda_0|_{i=(i1+i2)/2}$ of approximate error between the optical output wavelength characteristics expressed by the drive current quadratic function during the direct modulation satisfying the predetermined extinction ratio and eye mask requirement of the light emitting device and the optical output wavelength characteristics approximated by the drive current linear function are determined, the value p is determined such that the approximate errors are equal to each other, and the drive currents $i_{s1}$ and $i_{s2}$ are determined as the drive currents at the measuring points while the internally dividing points are set at the measuring points at that time.

In S405-3, the device temperature which internally divides the device temperature operating range ($T_1 \leq T \leq T_2$) of the device temperature T of the light emitting device by p:1-p and 1-p:p is determined as the determine device temperatures $T_{S1}$ and $T_{S2}$ in the measuring points using the value p determined in procedure S405-2.

Finally, in S405-4, three arbitrary points are selected as the measuring points of the optical output wavelength characteristics, optical output power characteristics, and RF amplitude characteristics during the direct modulation satisfying the predetermined extinction ratio and eye mask requirement from the four measuring points ($i_{s1}, T_{s1}$), ($i_{s2}, T_{s1}$), and ($i_{s2}, T_{s2}$) which are formed by the values determined in the procedures S405-2 and S405-3.

Thus, the estimated errors of the optical output wavelength and optical output power can be decreased in setting and controlling the optical output wavelength, RF amplitude, and optical output power by selecting the measuring points for determining the dependence of the optical output power on the drive current and device temperature during the direct modulation satisfying the predetermined extinction ratio and eye mask requirement for the light emitting device in the direct modulation type optical communication light source unit.

Fourteenth Embodiment

Figure 39:
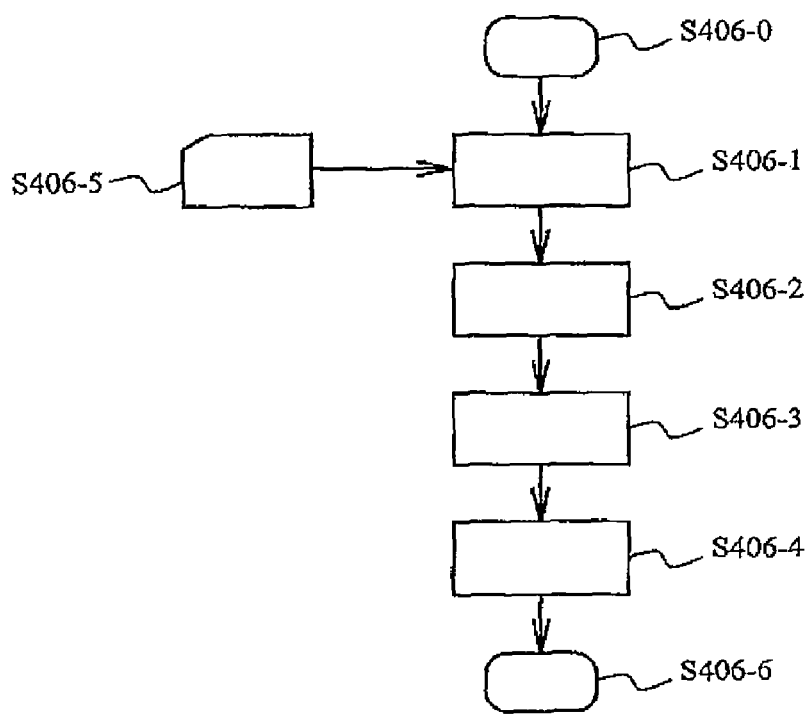
FIG. 39 is a flowchart showing the operating procedure of the fourteenth embodiment according to the invention.

FIG. 39 shows a method of a fourteenth embodiment corresponding to thirty-eighth, fortieth, forty-second, forty-fourth, forty-sixth and forty-eighth aspects of the invention. The fourteenth embodiment shown in FIG. 39 differs from the thirteenth embodiment shown in FIG. 38 in the procedures S406-2 and S406-3, although the procedures S406-1 and S406-4 in the fourteenth embodiment are similar to the proceduresS405-1 and S405-4 in the thirteenth embodiment. The portions different from the thirteenth embodiment of FIG. 38 will mainly be described below.

In S406-2, as shown in FIG. 27(b), on the two-dimensional plane having the coordinate axes of the device temperature and the optical output wavelength, the operating range ($T_1 \leq T \leq T_2$) of the specified device temperature T is internally divided by q:1-q and 1-q:q to determine the device temperatures $T_{S1}$ and $T_{S2}$ at the internally dividing point using an arbitrary value q (q is a specific coordinate of an internally dividing point in the operating range of the device temperature T of the light emitting device, and q is a real number satisfying 0<q<1) and thereby the minimum value and the maximum value of the approximate errors, namely, $|\delta\lambda_0|_{T=T1}$ or $T2$ and $|\delta\lambda_0|_{T=(T1+T2)/2}$ of approximate errors between the optical output wavelength characteristics expressed by the device temperature quadratic function during the direct modulation satisfying the predetermined extinction ratio and eye mask requirement of the light emitting device and the optical output wavelength characteristics approximated by the device temperature linear function are determined, the value q is determined such that the approximate errors are equal to each other, and the device temperatures $T_{s1}$ and $T_{s2}$ are determined as the device temperatures at the measuring points while the internally dividing points are set at the measuring points at that time.

In S406-3, the drive current in which the operating range of the drive current i ($i_1 \leq i \leq i_2$) of the light emitting device is internally divided by q:1-q and 1-q:q is determined as the drive currents $i_{S1}$ and $i_{S2}$ in the measuring points using the value q determined in the procedure S406-2.

Thus, in the thirteenth embodiment, the drive current at the measuring point is determined to decrease the approximate error between the optical output wavelength characteristics expressed by the drive current quadratic function during the direct modulation satisfying the predetermined extinction ratio and eye mask requirement and the optical output wavelength characteristics approximated by the drive current linear function. In the fourteenth embodiment, the device temperature at the measuring point is determined to decrease the approximate error between the optical output wavelength characteristics expressed by the device temperature quadratic function during the direct modulation satisfying the predetermined extinction ratio and eye mask requirement and the optical output wavelength characteristics approximated by the device temperature linear function. However, even if the drive current at the measuring point is determined to decrease the approximate error between the optical output power characteristics expressed by the drive current quadratic function during the direct modulation satisfying the predetermined extinction ratio and eye mask requirement and the optical output power characteristics approximated by the drive current linear function, even if the device temperature at the measuring point is determined to decrease the approximate error between the optical output power characteristics expressed by the device temperature quadratic function during the direct modulation satisfying the predetermined extinction ratio and eye mask requirement and the optical output power characteristics approximated by the device temperature linear function, even if the drive current at the measuring point is determined to decrease the approximate error between the RF amplitude characteristics expressed by the drive current quadratic function during the direct modulation satisfying the predetermined extinction ratio and eye mask requirement and the RF amplitude characteristics approximated by the drive current linear function, or even if the device temperature at the measuring point is determined to decrease the approximate error between the RF amplitude characteristics expressed by the device temperature quadratic function during the direct modulation satisfying the predetermined extinction ratio and eye mask requirement and the RF amplitude characteristics approximated by the device temperature linear function, the effect of the invention is not changed because the same results are obtains in each of the above cases.

In the thirteenth embodiment and the fourteenth embodiment, the case where the optical output wavelength characteristics, optical output power characteristics, and RF amplitude characteristics during the direct modulation satisfying the predetermined extinction ratio and eye mask requirement of the light emitting device are considered up to second-order terms for the drive current and device temperature within the operating range (using the quadratic function of the drive current and device temperature), and the dependence of the optical output wavelength characteristics, optical output power characteristics, and RF amplitude of the light emitting device on the drive current and the device temperature are approximated by the planes (linear functions of the drive current and device temperature) in actually setting and controlling the optical output wavelength, optical output power, and RF amplitude, is described. However, even if the operating ranges of the drive current and device temperature are divided into plural regions and each divided region is approximated by the plane, the drive current and device temperature of the measuring point at which the absolute values of the maximum value and minimum value of the approximate error expressing each characteristic are equal to each other can be selected using the similar procedures. Therefore, the effect of the invention is not changed.

In the thirteenth embodiment and the fourteenth embodiment, the case where the forty-first means includes one light emitting device, is described for the sake of simplification. However, even in the case where the forty-first means 401 may include the plural light emitting device, the forty-second means 402 may automatically control the drive current or optical output power of each light emitting device such that the drive current or optical output power is maintained at the target value given to each light emitting device, the forty-third means 403 may automatically control the device temperature of each light emitting device such that the device temperature is maintained at the target value given to each light emitting device, and the forty-fourth means 404 may automatically control the RF amplitude of each light emitting device such that the RF amplitude is maintained at the target value given to each light emitting device, at least one value of the optical output wavelength for the drive current and device temperature during the direct modulation satisfying the predetermined extinction ratio and eye mask requirement, at least one value concerning these three, or at least one parameter value for determining the relationship among these three, at least one value of the optical output power for the drive current and device temperature during the direct modulation satisfying the predetermined extinction ratio and eye mask requirement, at least one value concerning these three, or at least one parameter value for determining the relationship among these three, and at least one value of the RF amplitude for the drive current and device temperature during the direct modulation satisfying the predetermined extinction ratio and eye mask requirement, at least one value concerning these three, or at least one parameter value for determining the relationship among these three in each light emitting device constituting the forty-first means 401 may be stored in the forty-fifth means 405, the forty-sixth means 406 may determine the drive current or optical output power and the device temperature at which both the optical output wavelength and the optical output power of each light emitting device become the separately specified values from the relationship among the drive current, device temperature, and optical output wavelength during the direct modulation satisfying the predetermined extinction ratio and eye mask requirement, the relationship being determined by at least one value stored in the forty-fifth means 405 for each light emitting device constituting the forty-first means 401, and from the relationship among the drive current, device temperature, and optical output power during the direct modulation satisfying the predetermined extinction ratio and eye mask requirement of each light emitting device, and the forty-sixth means 406 may also determine the RF amplitude in the determined drive current or optical output power and device temperature from the relationship among the drive current, device temperature, and RF amplitude in the drive current fluctuation during the direct modulation satisfying the predetermined extinction ratio and eye mask requirement of each light emitting device, the case where the forty-seventh means 407 may monitor the drive current of each light emitting device constituting the forty-first means 401, makes the comparison determination whether or not the drive current is located in the allowable fluctuation range separately specified in each light emitting device, and may predict the relationship among the drive current, device temperature, and optical output power in the drive current fluctuation of the light emitting device with respect to the light emitting device whose drive current is not located in the allowable fluctuation range from the relationship among the drive current, device temperature, and optical output power during the direct modulation satisfying the predetermined extinction ratio and eye mask requirement of the light emitting device, the relationship being determined at least one value stored in the forty-fifth means 405 for the light emitting device, the forty-seventh means 407 may also predict the relationship among the drive current, device temperature, and RF amplitude in the drive current fluctuation of the light emitting device from the relationship among the drive current, device temperature, and RF amplitude during the direct modulation satisfying the predetermined extinction ratio and eye mask requirement of the light emitting device, the relationship being determined at least one value stored in the forty-fifth means 405 for the light emitting device, the forty-eighth means 408 may predict the latest drive current or optical output power and the latest device temperature at which both the optical output wavelength and the optical output power during the direct modulation satisfying the predetermined extinction ratio and eye mask requirement in the drive current fluctuation of the light emitting device become the values separately specified in each light emitting device with respect to the light emitting device whose drive current is not located in the allowable fluctuation range from the relationship among the drive current, device temperature, and optical output wavelength during the direct modulation satisfying the predetermined extinction ratio and eye mask requirement of the light emitting device, the relationship being determined by at least one value stored in the forty-fifth means 405 for the light emitting device, and from the relationship among the drive current, device temperature, and optical output power in the drive current fluctuation during the direct modulation satisfying the predetermined extinction ratio and eye mask requirement of the light emitting device, the relationship being predicted from the forty-seventh means 407, and the forty-eighth means 408 may also predict the latest RF amplitude in the latest drive current or optical output power and device temperature from the relationship among the drive current, device temperature, and RF amplitude in the drive current fluctuation during the direct modulation satisfying the predetermined extinction ratio and eye mask requirement, the relationship being predicted by the forty-seventh means 407, the case where the latest target values given to the forty-second means, forty-third means, and forty-fourth means in each light emitting device are stored in the forty-ninth means 409, or the case where the fiftieth means 410 may monitor the optical output generated by each light emitting device constituting the forty-first means 401, make the comparison determination whether or not both or one of the optical output wavelength and optical output power of the optical output are located in the separately specified optical output wavelength range and optical output power range respectively, and output the comparison determination result, the measuring points of the optical output wavelength characteristics, optical output power characteristics, and RF amplitude characteristics can similarly be selected in the plural light emitting devices constituting the forty-first means by performing the first to fourth procedures of the thirteenth or fourteenth embodiment (fifty-third and sixty-fourth aspects of the invention) to each light emitting device. Therefore, the effect of the invention is not changed.

In the thirteenth embodiment and the fourteenth embodiment, the measuring point for determining the dependence of the light emitting device optical output wavelength on the drive current and device temperature, the dependence of the light emitting device optical output power on the drive current and device temperature, and the dependence of the light emitting device RF amplitude on the drive current and device temperature is selected to set and control the optical output wavelength and optical output power during the direct modulation satisfying the predetermined extinction ratio and eye mask requirement. However, the effect of the invention is not changed, even if the measuring point for determining the dependence of the light emitting device optical output wavelength during the direct modulation satisfying the predetermined extinction ratio and eye mask requirement on the drive current and device temperature is selected only to monitor the optical output wavelength.

In the thirteenth embodiment and the fourteenth embodiment, the case where at least one value of itself (raw value) is stored in the forty-fifth means 405, is described. However, the effect of the invention is not changed, even in the case where the coding process such as the normalization, the scramble, the bit inversion, and the encryption is previously performed to all the values or at least one value to store the value in the forty-fifth means 405 and then the value is used by performing the decoding process such as the denormalization, the descramble, the bit inversion, and the encryption decoding after the value is read from the forty-fifth means 405.

In the thirteenth embodiment and the fourteenth embodiment, the case where the latest drive current or optical output power j4, the latest RF amplitude k4, and the latest device temperature l4 of themselves (raw values) which are determined by the forty-eighth means 408 are stored in the forty-ninth means 409, is described. However, the effect of the invention is not changed, even if the coding process such as the normalization, the scramble, the bit inversion, and the encryption is previously performed to all the values or at least one value to store the value in the forty-ninth means 409 and then the value is used by performing the decoding process such as the denormalization, the descramble, the bit inversion, and the encryption decoding after the value is read from the forty-ninth means 409.

In the thirteenth embodiment and the fourteenth embodiment, the case where the means automatically controls the optical output power such that the optical output power is maintained at a given target value, namely, the optical output power is directly controlled by the automatic power control circuit (APC), is described. However, the effect of the invention is not changed, even if the optical output power is indirectly controlled using the automatic current control circuit (ACC).

In the thirteenth embodiment and the fourteenth embodiment, the case where the new target value of the RF amplitude of the light emitting device is clearly given, is described. However, the effect of the invention is not changed, even if the automatic bias control circuit (ABC) is autonomously operated to finely adjust the RF amplitude.

The invention claimed is:

1. An optical communication light source unit including:
    eleventh means which comprises a light emitting device and emits light;
    twelfth means for automatically controlling drive current of the light emitting device to maintain the drive current at a given target value;
    thirteenth means for automatically controlling device temperature of the light emitting device to maintain the device temperature at a given target value;
    fourteenth means for storing a first data and a second data, wherein
        the first data is a set of measurement values of drive current and device temperature and measurement values of optical output wavelength corresponding to these, or a function relating the optical output wavelength to measurement values, of drive current and device temperature and
        the second data is a set of measurement values of drive current and device temperature and measurement values of optical output power corresponding to these, or a function relating the optical output power to measurement values, of drive current and device temperature; and
    fifteenth means for specifying optical output wavelength characteristics of the light emitting device from the first data, the specified optical output wavelength characteristics being expressed as a function relating the optical output wavelength to the drive current and the device temperature in a three-dimensional space having coordinate axes of the drive current, device temperature and optical output wavelength,
        for specifying optical output power characteristics of the light emitting device from the second data, the specified optical output power characteristics being expressed as a function relating the optical output power to the drive current and the device temperature in a three-dimensional space having coordinate axes of the drive current, device temperature and optical output power,
        for obtaining an optical output wavelength contour line as an orthogonal projection, to a drive current-device temperature plane, of a line which is obtained based on a separately specified value of the optical output wavelength in the optical output wavelength characteristics expressed in the three-dimensional space having coordinate axes of the drive current, device temperature and optical output wavelength,
        for obtaining an optical output power contour line as an orthogonal projection, to the drive current-device temperature plane, of a line which is obtained based on a separately specified value of the optical output power in the optical output power characteristics expressed in the three-dimensional space having coordinate axes of the drive current, device temperature and optical output power, and
        for determining a value of the drive current and a value of the device temperature of the light emitting device from an intersecting point of the optical output wavelength contour line and the optical output power contour line in the drive current-device temperature plane,
    wherein the fifteenth means is adapted to give the value of the drive current and the value of the device temperature of the light emitting device determined by the fifteenth means as the given target values in the twelfth means and the thirteenth means, respectively.

2. An optical communication light source unit according to claim 1, further comprising sixteenth means for storing the drive current and device temperature of the light emitting device determined by the fifteenth means,
    wherein, during warm start, a value of the drive current stored in the sixteenth means is imparted as a target value in the twelfth means, and a value of the device temperature stored in the sixteenth means is imparted as a target value in the thirteenth means.

3. An optical communication light source unit according to claim 1 or 2, further comprising seventeenth means for monitoring both or one of the optical output wavelength and optical output power of optical output generated by the light emitting device constituting the eleventh means, for making comparison determination whether or not the optical output wavelength and optical output power are located in separately individually specified ranges respectively, and for outputting the comparison determination result.

4. An optical communication light source unit including:
eleventh means which comprises a plurality of light emitting devices and emits a plurality of light beams;
twelfth means for automatically controlling drive current of the each light emitting device to maintain the drive current at a given target value;
thirteenth means for automatically controlling device temperature of the each light emitting device to maintain the device temperature at a given target value;
fourteenth means for storing a first data and a second data, wherein
the first data is a set of measurement values of drive current and device temperature and measurement values of optical output wavelength corresponding to these, or a function relating the optical output wavelength to the measurement values, of drive current and device temperature and
the second data is a set of measurement values of drive current and device temperature and measurement values of optical output power corresponding to these, or a function relating the optical output power to measurement values, of drive current and device temperature; and
fifteenth means for specifying optical output wavelength characteristics of the each light emitting device from the first data, the specified optical output wavelength characteristics being expressed as a function relating the optical output wavelength to the drive current and the device temperature in a three-dimensional space having coordinate axes of the drive current, device temperature and optical output wavelength,
for specifying optical output power characteristics of the each light emitting device from the second data, the specified optical output power characteristics being expressed as a function relating the optical output power to the drive current and the device temperature in a three-dimensional space having coordinate axes of the drive current, device temperature and optical output power,
for obtaining an optical output wavelength contour line as an orthogonal projection, to a drive current-device temperature plane, of a line which is obtained based on a separately specified value of the optical output wavelength in the optical output wavelength characteristics expressed in the three-dimensional space having coordinate axes of the drive current, device temperature and optical output wavelength,
for obtaining an optical output power contour line as an orthogonal projection, to the drive current-device temperature plane, of a line which is obtained based on a separately specified value of the optical output power in the optical output power characteristics expressed in the three-dimensional space having coordinate axes of the drive current, device temperature and optical output power, and
for determining a value of the drive current and a value of the device temperature of the each light emitting device from an intersecting point of the optical output wavelength contour line and the optical output power contour line in the drive current-device temperature plane,
wherein the fifteenth means is adapted to give the value of the drive current and the value of the device temperature of the each light emitting device determined by the fifteenth means as the given target values in the twelfth means and the thirteenth means, respectively.

5. An optical communication light source unit according to claim 4, further comprising sixteenth means for storing the drive current and device temperature of the each light emitting device, determined by the fifteenth means,
wherein, during warm start, a value of the drive current stored in the sixteenth means is imparted as a target value in the twelfth means, and a value of the device temperature stored in the sixteenth means is imparted as a target value in the thirteenth means.

6. An optical communication light source unit according to claim 4 or 5, further comprising seventeenth means for monitoring both or one of the optical output wavelength and optical output power of optical output generated by each light emitting device constituting the eleventh means, for Making comparison determination whether or not the optical output wavelength and optical output power are located in separately individually specified ranges respectively, and for outputting the comparison determination result.

7. An optical communication light source unit control method of controlling an optical communication light source including:
eleventh means which comprises a light emitting device and emits a light beam;
twelfth means for automatically controlling drive current of the light emitting device to maintain the drive current at a given target value;
thirteenth means for automatically controlling device temperature of the light emitting device to maintain the device temperature at a given target value; and
fourteenth means for storing a first data aid a second data, wherein
the first data is a set of measurement values of drive current and device temperature and measurement values of optical output wavelength corresponding to these, or a function relating the optical output wavelength to measurement values, of drive current and device temperature and
the second data is a set of measurement values of drive current and device temperature and measurement values of optical output power corresponding to these, or a function relating the optical output power to measurement values, of drive current and device temperature; and
fifteenth means for specifying optical output wavelength characteristics of the light emitting device from the first data, the specified optical output wavelength characteristics being expressed as a function relating the optical output wavelength to the drive current and the device temperature in a three-dimensional space having coordinate axes of the drive current, device temperature and optical output wavelength,
for specifying optical output power characteristics of the light emitting device from the second data, the specified optical output power characteristics being expressed as a function relating the optical output power to the drive current and the device temperature in a three-dimensional space having coordinate axes of the drive current, device temperature and optical output power,
for obtaining an optical output wavelength contour line as an orthogonal projection, to a drive current-device temperature plane, of a line which is obtained based on a separately specified value of the optical output wavelength in the optical output wavelength characteristics expressed in the three-dimensional space having coordinate axes of the drive current, device temperature and optical output wavelength, for obtaining an optical output power contour line as an orthogonal projection, to the drive current-device temperature plane, of a line which is obtained based on a separately specified value of the optical output power in the optical output power characteristics expressed in the three-dimensional space having coordinate axes of the drive current, device temperature and optical output power, and for determining a value of the drive current and a value of the device temperature of the light emitting device from an intersecting point of the optical output wavelength contour line and the optical output power contour line in the drive current-device temperature plane, wherein the fifteenth means is adapted to give the value of the drive current and the value of the device temperature of the light emitting device determined by the fifteenth means as the given target values in the twelfth means and the thirteenth means, respectively.

8. An optical communication light source unit control method according to claim 7, characterized by further comprising a fourteenth procedure of storing the determined drive current and device temperature of the light emitting device determined by the fifteenth means wherein, during warm start, a value of the drive current stored in the sixteenth means is imparted as a target value in the twelfth means, and a value of the device temperature stored in the sixteenth means is imparted as a target value in the thirteenth means.

9. An optical communication light source unit control method according to claim 7 or 8, further comprising a sixteenth procedure of monitoring both or one of the optical output wavelength and optical output power of optical output generated by the light emitting device constituting the eleventh means, for making comparison determination whether or not the optical output wavelength and optical output power are located in separately individually specified ranges respectively, and for outputting the comparison determination result.

10. An optical communication light source unit control method of controlling an optical communication light source comprising:

eleventh means which comprises a plurality of light emitting devices and emits a plurality of light beams;

twelfth means for automatically controlling drive current of the each light emitting device to maintain the drive current at a given target value;

thirteenth means for automatically controlling device temperature of the each light emitting device to maintain the device temperature at a given target value; and fourteenth means for storing a first data and a second data, wherein the first data is a set of measurement values of drive current and device temperature and measurement values of optical output wavelength corresponding to these, or a function relating the optical output wavelength to measurement values, of drive current and device temperature and the second data is a set of measurement values of drive current and device temperature and measurement values of optical output power corresponding to these, or a function relating the optical output power to measurement values, of drive current and device temperature; and fifteenth means for specifying optical output wavelength characteristics of the each light emitting device from the first data, the specified optical output wavelength characteristics being expressed as a function relating the optical output wavelength to the drive current and the device temperature in a three-dimensional space having coordinate axes of the drive current, device temperature and optical output wavelength, for specifying optical output power characteristics of the each light emitting device from the second data, the specified optical output power characteristics being expressed as a function relating the optical output power to the drive current and the device temperature in a three-dimensional space having coordinate axes of the drive current, device temperature and optical output power, for obtaining an optical output wavelength contour line as an orthogonal projection, to a drive current-device temperature plane, of a line which is obtained based on a separately specified value of the optical output wavelength in the optical output wavelength characteristics expressed in the three-dimensional space having coordinate axes of the drive current, device temperature and optical output wavelength, for obtaining an optical output power contour line as an orthogonal projection, to the drive current-device temperature plane, of a line which is obtained based on a separately specified value of the optical output power in the optical output power characteristics expressed in the three-dimensional space having coordinate axes of the drive current, device temperature and optical output power, and for determining a value of the drive current and a value of the device temperature of the each light emitting device from an intersecting point of the optical output wavelength contour line and the optical output power contour line in the drive current-device temperature plane, wherein the fifteenth means is adapted to give the value of the drive current and the value of the device temperature of the each light emitting device determined by the fifteenth means as the given target values in the twelfth means and the thirteenth means, respectively.

11. An optical communication light source unit control method according to claim 10, further comprising a fourteenth procedure of storing the determined drive current and device temperature of the each light emitting device wherein, during warm start, a value of the drive current stored in the sixteenth means is imparted as a target value in the twelfth means, and a value of the device temperature stored in the sixteenth means is imparted as a target value in the thirteenth means.

12. An optical communication light source unit control method according to claim 10 or 11, further comprising sixteenth procedure of monitoring both or one of the optical output wavelength and optical output power of optical output generated by each light emitting device constituting the eleventh means, for making comparison determination whether or not the optical output wavelength and optical output power are located in separately individually specified ranges respectively, and for outputting the comparison determination result.

13. An optical communication light source unit comprising:

twenty-first means which comprises a light emitting device and emits light;

twenty-second means for automatically controlling drive current of the light emitting device to maintain the drive current at a given target value;

twenty-third means for automatically Controlling device temperature of the light emitting device to maintain the device temperature at a given target value;

twenty-fourth means for storing a first data and a second data, wherein the first data is a set of measurement values of drive current and device temperature and measurement values of optical output wavelength corresponding to these or a function relating the optical output wavelength to measurement values of drive current and device temperature, and the second data is a set of measurement values of drive current and device temperature and measurement values of optical output power corresponding to these or a function relating the optical output power to measurement values of drive current and device temperature;

twenty-fifth means for specifying optical output power characteristics of the light emitting device from the second data, the specified optical output power characteristics being expressed as a function relating the optical output power to the drive current and the device temperature in a three-dimensional space having coordinate axes of the drive current, device temperature and optical output power, for monitoring the drive current, for making comparison determination whether or not the drive current is located in an separately specified allowable fluctuation range, and for predicting the optical output power characteristics at the drive current move when the drive current is not located in the allowable fluctuation range; and twenty-sixth means for specifying optical output wavelength characteristics of the light emitting device from the first data, the specified optical output wavelength characteristics being expressed as a function relating the optical output wavelength to the drive current and the device temperature in a three-dimensional space having coordinate axes of the drive current, device temperature and optical output wavelength, for obtaining an optical output wavelength contour line as an orthogonal projection, to a drive current-device temperature plane, of a line which is obtained based on a separately specified value of the optical output wavelength in the optical output wavelength characteristics expressed in the three-dimensional space having coordinate axes of the drive current, device temperature and optical output wavelength, for obtaining an optical output power contour line as an orthogonal projection, to the drive current-device temperature plane, of a line which is obtained based on a separately specified value of the optical output power in the optical output power characteristics the twenty-fifth means predicting expressed in the three-dimensional space having coordinate axes of the drive current, device temperature and optical output power, and for determining a value of the drive current and a value of the device temperature of the light emitting device from an intersecting point of the optical output wavelength contour line and the optical output power contour line in the drive current-device temperature plane when the drive current is not located in the allowable fluctuation range, wherein the twenty-sixth means to give the latest value of the drive current and the latest value of the device temperature of the light emitting device determined by the twenty-sixth means as the new given target values in the twenty-second means and the twenty-third means, respectively.

14. An optical communication light source unit according to claim 13, further comprising twenty-seventh means storing the latest value of the drive current and the latest value of the device temperature of the light emitting device determined by the twenty-sixth means wherein, during warm start, the latest value of the drive current stored in the twenty-seventh means is imparted as the new target value in the twelfth means, and the latest value of the device temperature stored in the twenty-seventh means is imparted as the new target value in the twenty-third means.

15. An optical communication light source unit according to claim 13 or 14, further comprising twenty-eighth means for monitoring both or one of the optical output wavelength and optical output power of optical output generated by the light emitting device constituting the twenty-first means, for making a comparison determination whether or not the optical output wavelength and optical output power are located in separately individually specified ranges respectively, and for outputting the comparison determination result.

16. An optical communication light source unit comprising:

twenty-first means which comprises a plurality of light emitting devices and emits a plurality of light beams;

twenty-second means for automatically controlling drive current of the each light emitting device to maintain the drive current at a given target value;

twenty-third means for automatically controlling device temperature of the each light emitting device to maintain the device temperature at a given target value;

twenty-fourth means for storing a first data and a second data, wherein the first data is a set of measurement values of drive current and device temperature and measurement values of optical output wavelength corresponding to these or a function relating the optical output wavelength to measurement values of drive current and device temperature, and the second data is a set of measurement values of drive current and device temperature and measurement values of optical output power corresponding to these or a function relating the optical output power to measurement values of drive current and device temperature;

twenty-fifth means specifying optical output power characteristics of the light emitting device from the second data, the specified optical output power characteristics being expressed as a function relating the optical output power to the drive current and the device temperature in a three-dimensional space having coordinate axes of the drive current, device temperature and optical output power, for monitoring the drive current, for making comparison determination whether or not the drive current is located in an separately specified allowable fluctuation range, and for predicting the optical output power characteristics at the drive current move when the drive current is not located in the allowable fluctuation range; and twenty-sixth means specifying optical output wavelength characteristics of the light emitting device from the first data, the specified optical output wavelength characteristics being expressed as a function relating the optical output wavelength to the drive current and the device temperature in a three-dimensional space having coordinate axes of the drive current, device temperature and optical output wavelength, for obtaining an optical output wavelength contour line as an orthogonal projection, to a drive current-device temperature plane, of a line which is obtained based on a separately specified value of the optical output wavelength in the optical output wavelength characteristics expressed in the three-dimensional space having coordinate axes of the drive current, device temperature and optical output wavelength, for obtaining an optical output power contour line as an orthogonal projection, to the drive current-device temperature plane, of a line which is obtained based on a separately specified value of the optical output power in the optical output power characteristics the twenty-fifth means predicting expressed in the three-dimensional space having coordinate axes of the drive current, device temperature and optical output power, and for determining a value of the drive current and a value of the device temperature of the light emitting device from an intersecting point of the optical output wavelength contour line and the optical output power contour line in the drive current-device temperature plane when the drive current is not located in the allowable fluctuation range, wherein the twenty-sixth means to give the latest value of the drive current and the latest value of the device temperature of the light emitting device determined by the twenty-sixth means as the new given target values in the twenty-second means and the twenty-third means, respectively wherein, during warm start, the latest value of the drive current stored in the twenty-seventh means is imparted as the new target value in the twelfth means, and the latest value of the device temperature stored in the twenty-seventh means is imparted as the new target value in the twenty-third means.

17. An optical communication light source unit according to claim 16, further comprising twenty-seventh means storing the latest value of the drive current and the latest value of the device temperature of the each light emitting device, determined by the twenty-sixth means, wherein, during warm start, the latest value of the drive current stored in the twenty-seventh means is imparted as the new target value in the twelfth means, and the latest value of the device temperature stored in the twenty-seventh means is imparted as the new target value in the twenty-third means.

18. An optical communication light source unit according to claim 16 or 17, further comprising twenty-eighth means for monitoring both or one of the optical output wavelength and optical output power of optical output generated by each light emitting device constituting the twenty-first means, for making a comparison determination whether or not the optical output wavelength and optical output power are respectively located in separately individually specified ranges in the each light emitting device, and for outputting the comparison determination result.

19. An optical communication light source unit control method of controlling an optical communication light source comprising:

twenty-first means which comprises a light emitting device and emits light;

twenty-second means for automatically controlling drive current of the light emitting device to maintain the drive current at a given target value;

twenty-third means for automatically controlling device temperature of the light emitting device to maintain the device temperature at a given target value; and twenty-fourth means for storing a first data and a second data, wherein the first data is a set of measurement values of drive current and device temperature and measurement values of optical output wavelength corresponding to these or a function relating the optical output wavelength to measurement values of drive current and device temperature, and the second data is a set of measurement values of drive current and device temperature and measurement values of optical output power corresponding to these or a function relating the optical output power to measurement values of drive current and device temperature;

twenty-fifth means specifying optical output power characteristics of the light emitting device from the second data, the specified optical output power characteristics being expressed as a function relating the optical output power to the drive current and the device temperature in a three-dimensional space having coordinate axes of the drive current, device temperature and optical output power, for monitoring the drive current, for making comparison determination whether or not the drive current is located in an separately specified allowable fluctuation range, and for predicting the optical output power characteristics at the drive current move when the drive current is not located in the allowable fluctuation range; and twenty-sixth means specifying optical output wavelength characteristics of the light emitting device from the first data, the specified optical output wavelength characteristics being expressed as a function relating the optical output wavelength to the drive current and the device temperature in a three-dimensional space having coordinate axes of the drive current, device temperature and optical output wavelength, for obtaining an optical output wavelength contour line as an orthogonal projection, to a drive current-device temperature plane, of a line which is obtained based on a separately specified value of the optical output wavelength in the optical output wavelength characteristics expressed in the three-dimensional space having coordinate axes of the drive current, device temperature and optical output wavelength, for obtaining an optical output power contour line as an orthogonal projection, to the drive current-device temperature plane, of a line which is obtained based on a separately specified value of the optical output power in the optical output power characteristics the twenty-fifth means predicting expressed in the three-dimensional space having coordinate axes of the drive current, device temperature and optical output power, and for determining a value of the drive current and a value of the device temperature of the light emitting device from an intersecting point of the optical output wavelength contour line and the optical output power contour line in the drive current-device temperature plane when the drive current is not located in the allowable fluctuation range, wherein the twenty-sixth means to give the latest value of the drive current and the latest value of the device temperature of the light emitting device determined by the twenty-sixth means as the new given target values in the twenty-second means and the twenty-third means, respectively.

20. An optical communication light source unit control method according to claim 19, further comprising a twenty-fifth procedure of storing the latest value of the determined drive current and the latest value of the device temperature of the light emitting device, determined by the twenty-third procedure, wherein, during warm start, the latest value of the drive current stored in the twenty-seventh means is imparted as the new target value in the twelfth means, and the latest value of the device temperature stored in the twenty-seventh means is imparted as the new target value in the twenty-third means.

21. An optical communication light source unit control method according to claim 19 or 20, further comprising a twenty-seventh procedure of monitoring both or one of the optical output wavelength and optical output power of optical output generated by the light emitting device constituting the twenty-first means, making comparison determination whether or not the optical output wavelength and optical output power are located in separately individually specified optical ranges respectively, and for outputting the comparison determination result.

22. An optical communication light source unit control method of controlling an optical communication light source comprising:

twenty-first means which a plurality of light emitting devices and emits a plurality of light beams;

twenty-second means for automatically controlling drive current of the each light emitting device to maintain the drive current at a given target value;

twenty-third means for automatically controlling device temperature of the each light emitting device to maintain the device temperature at a given target value; and twenty-fourth means for storing a first data and a second data, wherein the first data is a set of measurement values of drive current and device temperature and measurement values of optical output wavelength corresponding to these or a function relating the optical output wavelength to measurement values of drive current and device temperature, and the second data is a set of measurement values of drive current and device temperature and measurement values of optical output power corresponding to these or a function relating the optical output power to measurement values of drive current and device temperature;

twenty-fifth means specifying optical output power characteristics of the light emitting device from the second data, the specified optical output power characteristics being expressed as a function relating the optical output power to, the drive current and the device temperature in a three-dimensional space having coordinate axes of the drive current, device temperature and optical output power, for monitoring the drive current, for making comparison determination whether or not the drive current is located in an separately specified allowable fluctuation range, and for predicting the optical output power characteristics at the drive current move when the drive current is not located in the allowable fluctuation range; and twenty-sixth means specifying optical output wavelength characteristics of the light emitting device from the first data, the specified optical output wavelength characteristics being expressed as a function relating the optical output wavelength to the drive current and the device temperature in a three-dimensional space having coordinate axes of the drive current, device temperature and optical output wavelength, for obtaining an optical output wavelength contour line as an orthogonal projection, to a drive current-device temperature plane, of a line which is obtained based on a separately specified value of the optical output wavelength in the optical output wavelength characteristics expressed in the three-dimensional space having coordinate axes of the drive current, device temperature and optical output wavelength, for obtaining an optical output power contour line as an orthogonal projection, to the drive current-device temperature plane, of a line which is obtained based on a separately specified value of the optical output power in the optical output power characteristics the twenty-fifth means predicting expressed in the three-dimensional space having coordinate axes of the drive current, device temperature and optical output power, and for determining a value of the drive current and a value of the device temperature of the light emitting device from an intersecting point of the optical output wavelength contour line and the optical output power contour line in the drive current-device temperature plane when the drive current is not located in the allowable fluctuation range, wherein the twenty-sixth means to give the latest value of the drive current and the latest value of the device temperature of the light emitting device determined by the twenty-sixth means as the new given target values in the twenty-second means and the twenty-third means, respectively.

23. An optical communication light source unit control method according to claim 22, further comprising a twenty-fifth procedure of storing the latest value of the drive current and the latest value of the device temperature of the each light emitting device, wherein, during warm start, the latest value of the drive current stored in the twenty-seventh means is imparted as the new target value in the twelfth means, and the latest value of the device temperature stored in the twenty-seventh means is imparted as the new target value in the twenty-third means.

24. An optical communication light source unit control method according to claim 22 or 23, further comprising a twenty-seventh procedure of monitoring both or one of the optical output wavelength and optical output power of optical output generated by each light emitting device constituting the twenty-first means, for making a comparison determination whether or not the optical output wavelength and optical output power are respectively located in separately individually specified ranges in the each light emitting device, and for outputting the comparison determination result.

25. An optical communication light source unit comprising:

thirty-first means which is formed by a light emitting device and emits light;

thirty-second means for automatically controlling drive current or optical output power of the light emitting device constituting the thirty-first means to maintain the drive current or optical output power at a given target value;

thirty-third means for automatically controlling device temperature of the light emitting device constituting the thirty-first means to maintain the device temperature at a given target value;

thirty-fourth means for storing a first data and a second data, wherein the first data is a set of measurement values of drive current and device temperature and measurement values of optical output wavelength corresponding to these, or a function relating the optical output wavelength to measurement values, of drive current and device temperature and the second data is a set of measurement values of drive current and device temperature and measurement values of optical output power corresponding to these, or a function relating the optical output power to measurement values, of drive current and device temperature; and thirty-fifth means for setting and controlling the optical output wavelength and optical output power of the light emitting device using at least one value, stored in the thirty-fourth means, for the light emitting device, the optical communication light source unit characterized in that the thirty-fifth means has a selection circuit, the selection circuit including:

an input unit to which an operating range ($i_1 \leq i \leq i_2$) of drive current i and an operating range ($T_1 \leq T \leq T_2$) of device temperature T of the light emitting device constituting the thirty-first means are inputted;

an internally dividing point device temperature determination unit which internally divides the operating range ($T_1 \leq T \leq T_2$) of the device temperature T of the light emitting device by q:1-q and 1-q:q to determine device temperatures $T_{S1}$ and $T_{S2}$ at an internally dividing point using an arbitrary value q (q is a specific coordinate of an internally dividing point in the operating range of the device temperature T, and q is a real number satisfying 0<q<1), and thereby determines approximate errors $|\delta\lambda_0|_{T=T1\ or\ T2}$ and $|\delta\lambda_0|_{T=(T1+T2)/2}$ between the optical output wavelength characteristics for the device temperature of the light emitting device and optical output wavelength characteristics approximated by a device temperature linear function, or approximate errors $|\delta P_0|_{T=T1\ or\ T2}$ and $|\delta P_0|_{T=(T1+T2)/2}$ between optical output power characteristics for the device temperature of the light emitting device and optical output power characteristics approximated by the device temperature linear function, determines the value q such that the approximate errors are equal to each other, and determines the device temperature $T_{S1}$ and $T_{S2}$ to the device temperatures at the measuring points while the internally dividing points are set at the measuring points at that time;

a drive current determination unit which determines the drive currents as drive currents $i_{S1}$ and $i_{S2}$ at the measuring points, the drive currents internally dividing the operating range ($i_1 \leq i \leq i_2$) of the drive current i of the light emitting device by q:1-q and 1-q:q using the determined value q; and a measuring point selection unit which selects three points as the measuring points (drive current and device temperature) of the optical output wavelength characteristics and optical output power characteristics of the light emitting device from four measuring points ($i_{S1}, T_{S1}$), ($i_{S1}, T_{S2}$), ($i_{S2}, T_{S1}$) and ($i_{S2}, T_{S2}$) which are formed by a combination of the determined values, the selected three points being stored in the thirty-fourth means.

26. An optical communication light source unit including:

thirty-first means which is formed by a plurality of light emitting devices and emits light beams;

thirty-second means for automatically controlling drive current or optical output power of each light emitting device constituting the thirty-first means to maintain the drive current or optical output power at a given target value;

thirty-third means for automatically controlling device temperature of each light emitting device constituting the thirty-first means to maintain the device temperature at a given target value;

thirty-fourth means for storing a first data and a second data, wherein the first data is a set of measurement values of drive current and device temperature and measurement values of optical output wavelength corresponding to these, or a function relating the optical output wavelength to measurement values, of drive current and device temperature and the second data is a set of measurement values of drive current and device temperature and measurement values of optical output power corresponding to these, or a function relating the optical output power to measurement values, of drive current and device temperature; and thirty-fifth means for setting and controlling the optical output wavelength and optical output power of each light emitting device using at least one value, stored in the thirty-fourth means, for each light emitting device, the optical communication light source unit characterized in that the thirty-fifth means has a selection circuit, the selection circuit including:

an input unit to which an operating range ($i_1 \leq i \leq i_2$) of drive current i and an operating range ($T_1 \leq T \leq T_2$) of device temperature T of each light emitting device constituting the thirty-first means are inputted;

an internally dividing point device temperature determination unit which internally divides the operating range ($T_1 \leq T \leq T_2$) of the device temperature T of each light emitting device by q:1-q and 1-q:q to determine device temperatures $T_{S1}$ and $T_{S2}$ at an internally dividing point using an arbitrary value q (q is a specific coordinate of an internally dividing point in the operating range of the device temperature T, and q is a real number satisfying 0<q<1), and thereby determines approximate errors $|\delta\lambda_0|_{T=T1\ or\ T2}$ and $|\delta\lambda_0|_{T=(T1+T2)/2}$ between optical output wavelength characteristics for the device temperature of each light emitting device and optical output wavelength characteristics approximated by a device temperature linear function, or approximate errors $|\delta P_0|_{T=T1\ or\ T2}$ and $|\delta P_0|_{T=(T1+T2)/2}$ between optical output power characteristics for the device temperature of each light emitting device and optical output power characteristics approximated by the device temperature linear function, determines the value q such that the approximate errors are equal to each other, and determines the device temperature $T_{S1}$ and $T_{S2}$ to the device temperatures at the measuring points while the internally dividing points of each light emitting device are set at the measuring points at that time;

a drive current determination unit which determines the drive currents as drive currents $i_{S1}$ and $i_{S2}$ at the measuring points in each light emitting device, drive currents internally dividing the operating range ($i_1 \leq i \leq i_2$) of the drive current i of each light emitting device by q:1-q and 1-q:q using the determined value q; and a measuring point selection unit which selects any three points as the measuring points (drive current and device temperature) of the optical output wavelength characteristics and optical output power characteristics of each light emitting device from four measuring points ($i_{S1}, T_{S1}$), ($i_{S1}, T_{S2}$), ($i_{S2}, T_{S1}$), and ($i_{S2}, T_{S2}$) in each light emitting device, the four points being formed by a combination of the determined values, the selected three points being stored in the thirty-fourth means.

27. A measuring point selection method of selecting measuring points (drive current and device temperature) of optical output wavelength characteristics and optical output power characteristics of a light emitting device; the optical output wavelength characteristics and optical output power characteristics being stored in thirty-fourth means, in an optical communication light source unit including:

thirty-first means which is formed by a light emitting device and emits light;

thirty-second means for automatically controlling drive current or optical output power of the light emitting device constituting the thirty-first means to maintain the drive current or optical output power at a given target value;

thirty-third means for automatically controlling device temperature of the light emitting device constituting the thirty-first means to maintain the device temperature at a given target value; and the thirty-fourth means for storing a first data and a second data, wherein the first data is a set of measurement values of drive current and device temperature and measurement values of optical output wavelength corresponding to these, or a function relating the optical output wavelength to measurement values, of drive current and device temperature and the second data is a set of measurement values of drive current and device temperature and measurement values of optical output power corresponding to these, or a function relating the optical output power to measurement values, of drive current and device temperature; and the optical communication light source unit also including functions of setting and controlling the optical output wavelength and optical output power of the light emitting device using at least one value, stored in the thirty-fourth means, for the light emitting device, the measuring point selection method characterized by including:

a thirty-first procedure of inputting an operating range $(i_1 \leq i \leq i_2)$ of drive current i and an operating range $(T_1 \leq T \leq T_2)$ of device temperature T of the light emitting device constituting the thirty-first means;

a thirty-second procedure of internally dividing the operating range $(T_1 \leq T \leq T_2)$ of the device temperature T of the light emitting device by q:1-q and 1-q:q to determine device temperatures $T_{S1}$ and $T_{S2}$ at an internally dividing point using an arbitrary value q (q is a specific coordinate of an internally dividing point in the operating range of device temperature T, and q is a real number satisfying 0<q<1), and thereby determines approximate errors $|\delta\lambda_0|_{T=T1 \text{ or } T2}$ and $|\delta\lambda_0|_{T=(T1+T2)/2}$ between optical output wavelength characteristics for the device temperature of the light emitting device and optical output wavelength characteristics approximated by a device temperature linear function, or approximate errors $|\delta P_0|_{T=T1 \text{ or } T2}$ and $|\delta P_0|_{T=(T1+T2)/2}$ between optical output power characteristics for the device temperature of the light emitting device and optical output power characteristics approximated by the device temperature linear function, determines the value q such that the approximate errors are equal to each other, and determines the device temperature $T_{S1}$ and $T_{S2}$ to the device temperatures at the measuring points while the internally dividing points are set at the measuring points at that time;

a thirty-third procedure of determining the drive currents as drive currents $i_{S1}$ and $i_{S2}$ at the measuring points, the drive currents internally dividing the operating range $(i_1 \leq i \leq i_2)$ of the drive current i of the light emitting device by q:1-q and 1-q:q using the determined value q; and a thirty-four procedure of selecting any three points as the measuring points of the optical output wavelength characteristics and optical output power characteristics from four measuring points $(i_{S1}, T_{S1})$, $(i_{S1}, T_{S2})$, $(i_{S2}, T_{S1})$ and $(i_{S2}, T_{S2})$ which are formed by a combination of the determined values.

28. A measuring point selection method of selecting measuring points (drive current and device temperature) of optical output wavelength characteristics and optical output power characteristics of each light emitting device, the optical output wavelength characteristics and optical output power characteristics being stored in thirty-fourth means, in an optical communication light source unit comprising:

thirty-first means which is formed by a plurality of light emitting devices and emits a plurality of light beams;

thirty-second means for automatically controlling drive current or optical output power of each light emitting device constituting the thirty-first means to maintain the drive current or optical output power at a given target value;

thirty-third means for automatically controlling device temperature of each light emitting device constituting the thirty-first means to maintain the device temperature at a given target value; and the thirty-fourth means for storing a first data and a second data, wherein the first data is a set of measurement values of drive current and device temperature and measurement values of optical output wavelength corresponding to these, or a function relating the optical output wavelength to measurement values, of drive current and device temperature and the second data is a set of measurement values of drive current and device temperature and measurement values of optical output power corresponding to these, or a function relating the optical output power to measurement values, of drive current and device temperature; and the optical communication light source unit also including functions of setting and controlling the optical output wavelength and optical output power of each light emitting device using at least one value, stored in the thirty-fourth means, for each light emitting device, the measuring point selection method characterized by including:

a thirty-first procedure of inputting an operating range $(i_1 \leq i \leq i_2)$ of drive current i and an operating range $(T_1 \leq T \leq T_2)$ of device temperature T of each light emitting device constituting the thirty-first means;

a thirty-second procedure of internally dividing the operating range $(T_1 \leq T \leq T_2)$ of the device temperature T of each light emitting device by q:1-q and 1-q:q to determine device temperatures $T_{S1}$ and $T_{S2}$ at an internally dividing point using an arbitrary value q (q is a specific coordinate of an internally dividing point in the operating range of each light emitting device, and q is a real number satisfying 0<q<1), and thereby determines approximate errors $|\delta\lambda_0|_{T=T1 \text{ or } T2}$ and $|\delta\lambda_0|_{T=(T1+T2)/2}$ between optical output wavelength characteristics for the device temperature of each light emitting device and optical output wavelength characteristics approximated by a device temperature linear function, or approximate errors $|\delta P_0|_{T=T1\,or\,T2}$ and $|\delta P_0|_{T=(T1+T2)/2}$ between optical output power characteristics for the device temperature of each light emitting device and optical output power characteristics approximated by the device temperature linear function, determines the value q such that the approximate errors are equal to each other, and determines the device temperature $T_{S1}$ and $T_{S2}$ to the device temperatures at the measuring points while the internally dividing points are set at the measuring points at that time;

a thirty-third procedure of determining the drive currents as drive currents $i_{S1}$ and $i_{S2}$ at the measuring points, the drive currents internally dividing the operating range ($i_1 \leq i \leq i_2$) of the drive current i of each light emitting device by q:1-q and 1-q:q using the determined value q; and a thirty-four procedure of selecting any three points as the measuring points of the optical output wavelength characteristics and optical output power characteristics from four measuring points $(i_{S1}, T_{S1})$, $(i_{S1}, T_{S2})$, $(i_{S2}, T_{S1})$, and $(i_{S2}, T_{S2})$ in each light emitting device, the four points being formed by a combination of the determined values.

29. A direct modulation type optical communication light source unit comprising:

forty-first means which is formed by a light emitting device and emits light;

forty-second means for automatically controlling drive current or optical output power of the light emitting device constituting the forty-first means to maintain the drive current or optical output power at a given target value;

forty-third means for automatically controlling device temperature of the light emitting device constituting the forty-first means to maintain the device temperature at a given target value;

forty-fourth means for automatically controlling RF amplitude of the light emitting device constituting the forty-first means to maintain the RF amplitude at a given target value;

forty-fifth means for storing a first data and a second data, wherein the first data is a set of measurement values of drive current and device temperature and measurement values of optical output wavelength corresponding to these, or a function relating the optical output wavelength to measurement values, of drive current and device temperature and the second data is a set of measurement values of drive current and device temperature and measurement values of optical output power corresponding to these, or a function relating the optical output power to measurement values, of drive current and device temperature, and storing a third data in the forty-fifth means, wherein the third data is a set of measurement values of drive current and device temperature and measurement values of RF amplitude corresponding to those or a function relating the RF amplitude to measurement values, of drive current and device temperature; and forty-sixth means for determining the drive current and device temperature or the optical output power and device temperature such that both the optical output wavelength and optical output power of the light emitting device become separately specified values from the relationship among the drive current, device temperature, and optical output wavelength of the light emitting device during the direct modulation satisfying a predetermined extinction ratio and eye mask requirement, the relationship being determined by at least one value stored in the forty-fifth means for the light emitting device, and from the relationship among the drive current, device temperature, and optical output power during the direct modulation satisfying the predetermined extinction ratio and eye mask requirement of the light emitting device, the relationship being determined by at least one value stored in the forty-fifth means for the light emitting device, the forty-sixth means also determining the RF amplitude in the determined drive current and device temperature or the determined optical output power and device temperature from relationship among the drive current, device temperature, and RF amplitude in drive current fluctuation during the direct modulation satisfying the predetermined extinction ratio and eye mask requirement, the relationship being determined by at least one value stored in the forty-fifth means for the light emitting device, the direct modulation type optical communication light source unit characterized in that the drive current, device temperature, and RF amplitude or the optical output power, device temperature, and RF amplitude of the light emitting device, which are determined by the forty-sixth means, are given as the target values for the light emitting device in the forty-second means, the forty-third means, and the forty-fourth means respectively.

30. A direct modulation type optical communication light source unit including:

forty-first means which are formed by a light emitting device and emits light;

forty-second means for automatically controlling drive current or optical output power of the light emitting device constituting the forty-first means to maintain the drive current or optical output power at a given target value;

forty-third means for automatically controlling device temperature of the light emitting device constituting the forty-first means to maintain the device temperature at a given target value;

forty-fourth means for automatically controlling RF amplitude of the light emitting device constituting the forty-first means to maintain the RF amplitude at a given target value;

forty-fifth means for storing a first data and a second data, wherein the first data is a set of measurement values of drive current and device temperature and measurement values of optical output wavelength corresponding to these, or a function relating the optical output wavelength to measurement values, of drive current and device temperature and the second data is a set of measurement values of drive current and device temperature and measurement values of optical output power corresponding to these, or a function relating the optical output power to measurement values, of drive current and device temperature, and storing a third data in the forty-fifth means, wherein the third data is a set of measurement values of drive current and device temperature and measurement values of RF amplitude corresponding to those, or a function relating the RF amplitude to measurement values, of drive current and device temperature;

forty-seventh means for monitoring the drive current of the light emitting device constituting the forty-first means, making comparison determination whether or not the drive current is located in a separately specified allowable fluctuation range, and predicting the relationship among the drive current, device temperature, and optical output power in drive current fluctuation of the light emitting device from the relationship among the drive current, device temperature, and optical output power during the direct modulation satisfying a the predetermined extinction ratio and eye mask requirement of the light emitting device, the relationship being determined by at least one value stored in the forty-fifth means for the light emitting device when the drive current is not located in the allowable fluctuation range, the forty-seventh means also predicting the relationship among the drive current, device temperature, and RF amplitude in the drive current fluctuation of the light emitting device from the relationship among the drive current, device temperature, and RF amplitude during the direct modulation satisfying the predetermined extinction ratio and eye mask requirement of the light emitting device, the relationship being determined by at least one value stored in the forty-fifth means for the light emitting device; and forty-eighth means for predicting the latest drive current and latest device temperature or the latest optical output power and latest device temperature such that both the optical output wavelength and optical output power of the light emitting device become separately specified values during the direct modulation satisfying the predetermined extinction ratio and eye mask requirement in the drive current fluctuation of the light emitting device from the relationship among the drive current, device temperature, and optical output wavelength during the direct modulation satisfying the predetermined extinction ratio and eye mask requirement of the light emitting device, the relationship being determined by at least one value stored in the forty-fifth means for the light emitting device, and from the relationship among the drive current, device temperature, and optical output power in the drive current fluctuation during the direct modulation satisfying the predetermined extinction ratio and eye mask requirement of the light emitting device, the relationship being predicted by the forty-seventh means, the forty-eighth means also predicting the latest RF amplitude in the latest drive current and latest device temperature or the latest optical output power and latest device temperature from relationship among the drive current, device temperature, and RF amplitude in the drive current fluctuation during the direct modulation satisfying the predetermined extinction ratio and eye mask requirement of the light emitting device, the relationship being predicted by the forty-seventh means, the direct modulation type optical communication light source unit characterized in that the latest drive current, device temperature, and RF amplitude or the latest optical output power, device temperature, and RF amplitude of the light emitting device, which are being predicted by the forty-eighth means, are given as the target values for the light emitting device in the forty-second means, the forty-third means, and the forty-fourth means respectively.

31. A direct modulation type optical communication light source unit according to claim 29 or 30, further including forty-ninth means in which the latest values of the target values given to the forty-second means, forty-third means, and forty-fourth means respectively are stored, the optical communication light source unit characterized in that, when the value stored in the forty-ninth means is used, the latest values of the target values for the forty-second means, forty-third means, and forty-fourth means are read from the forty-ninth means and given as the target values in the forty-second means, forty-third means, and forty-fourth means respectively.

32. A direct modulation type optical communication light source unit according to claim 29 or 30, characterized by further including fiftieth means for monitoring the optical output generated by the light emitting device constituting the forty-first means, making comparison determination whether or not both or one of the optical output wavelength and optical output power of the optical output are located in separately specified optical output wavelength range and optical output power range respectively, and outputting the comparison determination result.

33. A direct modulation type optical communication light source unit according to claim 29 or 30, characterized by further comprising a selection circuit, the selection circuit including:

an input unit to which an operating range $(i_1 \leq i \leq i_2)$ of separately specified drive current i and an operating range $(T_1 \leq T \leq T_2)$ of separately specified device temperature T of the light emitting device are inputted;

an internally dividing point drive current determination unit which internally divides the operating range $(i_1 \leq i \leq i_2)$ of the drive current i of the light emitting device by p:1-p and 1-p:p to determine drive currents $i_{S1}$ and $i_{S2}$ at an internally dividing point using an arbitrary value p (p is a specific coordinate of an internally dividing point in the operating range of the specified drive current i, and p is a real number satisfying 0<p<1), and thereby determines a minimum value $|\delta\lambda_0|_{i=i1 \text{ or } i2}$ and a maximum value $|\delta\lambda_0|_{i=(i1+i2)/2}$ of an approximate error between optical output wavelength characteristics for the drive current during the direct modulation satisfying a predetermined extinction ratio and eye mask requirement of the light emitting device and optical output wavelength characteristics approximated by a drive current linear function, determines the value p such that the approximate errors are equal to each other, determines a minimum value $|\delta P_0|_{i=i1 \text{ or } i2}$ and a maximum value $|\delta P_0|_{i=(i1+i2)/2}$ of an approximate error between optical output power characteristics for the drive current during the direct modulation satisfying a predetermined extinction ratio and eye mask requirement of the light emitting device and optical output power characteristics approximated by the drive current linear function, and determines the value p such that the approximate errors are equal to each other, or determines a minimum value $|\delta i_{RF0}|_{i=i1 \text{ or } i2}$ and a maximum value $|\delta i_{RF0}|_{i=(i1+i2)/2}$ of an approximate error between RF amplitude characteristics for the drive current during the direct modulation satisfying a predetermined extinction ratio and eye mask requirement of the light emitting device and RF amplitude characteristics approximated by the drive current linear function, determines the value p such that the approximate errors are equal to each other, and determines the drive currents $i_{S1}$ and $i_{S2}$ to the drive currents at the measuring points while the internally dividing points are set at the measuring points at that time;

a device temperature determination unit which determines the device temperatures as device temperatures $T_{S1}$ and $T_{S2}$ at the measuring points, the device temperatures internally dividing the operating range $(T_1 \leq T \leq T_2)$ of the specified device temperature T by p:1-p and 1-p:p using the determined value p; and a measuring point selection unit which selects any three points as the measuring points (drive current and device temperature) of the optical output wavelength characteristics, optical output power characteristics, and RF amplitude characteristics during the direct modulation satisfying a predetermined extinction ratio and eye mask requirement of the light emitting device constituting the forty-first means from four measuring points $(i_{S1},T_{S1})$, $(i_{S1},T_{S2})$, $(i_{S2},T_{S1})$, and $(i_{S2},T_{S2})$ which are formed by a combination of the determined values, the selected three points being stored in the forty-fifth means.

34. A direct modulation type optical communication light source unit according to claim or 30, characterized by further comprising a selection circuit, the selection circuit including:
   an input unit to which an operating range $(i_1 \leq i \leq i_2)$ of separately specified drive current i and an operating range $(T_1 \leq T \leq T_2)$ of separately specified device temperature T of the light emitting device are inputted;
   an internally dividing point device temperature determination unit which internally divides the operating range $(T_1 \leq T \leq T_2)$ of the specified device temperature T of the light emitting device by q:1-q and 1-q:q to determine device temperatures $T_{S1}$ and $T_{S2}$ at an internally dividing point using an arbitrary value q (q is a specific coordinate of an internally dividing point in the operating range of the device temperature T, and q is a real number satisfying 0<q<1), and thereby determines a minimum value $|\delta\lambda_0|_{T=T1 \; or \; T2}$ and a maximum value $|\delta\lambda_0|_{T=(T1+T2)/2}$ of an approximate error between optical output wavelength characteristics for the device temperature during the direct modulation satisfying a predetermined extinction ratio and eye mask requirement of the light emitting device and optical output wavelength characteristics approximated by a device temperature linear function, determines the value q such that the approximate errors are equal to each other, determines a minimum value $|\delta P_0|_{T=T1 \; or \; T2}$, and a maximum value $|\delta P_0|_{T=(T1+T2)/2}$ of an approximate error between optical output power characteristics for the device temperature during the direct modulation satisfying a predetermined extinction ratio and eye mask requirement of the light emitting device and optical output power characteristics approximated by the device temperature linear function, determines the value q such that the approximate errors are equal to each other, or determines a minimum value $|\delta i_{RF0}|_{T=T1 \; or \; T2}$ and a maximum value $|\delta i_{RF0}|_{T=(T1+T2)/2}$ of an approximate error between RF amplitude characteristics for the drive current during the direct modulation satisfying a predetermined extinction ratio and eye mask requirement of the light emitting device and RF amplitude characteristics approximated by the device temperature linear function, determines the value q such that the approximate errors are equal to each other, and determines the device temperature $T_{S1}$ and $T_{S2}$ to the device temperatures at the measuring points while the internally dividing points are set at the measuring points at that time;
   a drive current determination unit which determines the drive currents as drive currents $i_{S1}$ and $i_{S2}$ at the measuring points, the drive currents internally dividing the operating range $(i_1 \leq i \leq i_2)$ of the specified drive current i by q:1-q and 1-q:q using the determined value q; and
   a measuring point selection unit which selects any three points as the measuring points (drive current and device temperature) of the optical output wavelength characteristics, optical output power characteristics, and RF amplitude characteristics during the direct modulation satisfying a predetermined extinction ratio and eye mask requirement of the light emitting device constituting the forty-first means from four measuring points $(i_{S1},T_{S1})$, $(i_{S1},T_{S2})$, $(i_{S2},T_{S1})$, and $(i_{S2},T_{S2})$ which are formed by a combination of the determined values, the selected three points being stored in the forty-fifth means.

35. A method of selecting measuring points (drive current and device temperature) of optical output wavelength characteristics, optical output power characteristics, and RF amplitude characteristics, which are stored in the forty-fifth means, during the direct modulation satisfying a predetermined extinction ratio and eye mask requirement of the light emitting device constituting the forty-first means, in a direct modulation type optical communication light source unit according to claim 29 or 30,
   the method characterized by including:
   a forty-first procedure of inputting an operating range $(i_1 \leq i \leq i_2)$ of separately specified drive current i and an operating range $(T_1 \leq T \leq T_2)$ of separately specified device temperature T of the light emitting device;
   a forty-second procedure of internally dividing the operating range $(i_1 \leq i \leq i_2)$ of the specified drive current i by p:1-p and 1-p:p to determine drive currents $i_{S1}$ and $i_{S2}$ at an internally dividing point using an arbitrary value p (p is a specific coordinate of an internally dividing point in the operating range of the specified drive current i, and p is a real number satisfying 0<p<1), and thereby determines a minimum value $|\delta\lambda_0|_{i=i1 \; or \; i2}$ and a maximum value $|\delta\lambda_0|_{i=(i1+i2)/2}$ of an approximate error between optical output wavelength characteristics for the drive current during the direct modulation satisfying a predetermined extinction ratio and eye mask requirement of the light emitting device and optical output wavelength characteristics approximated by a drive current linear function, determines the value p such that the approximate errors are equal to each other, determines a minimum value $|\delta P_0|_{i=i1 \; or \; i2}$ and a maximum value $|\delta P_0|_{i=(i1+i2)/2}$ of an approximate error between optical output power characteristics for the drive current during the direct modulation satisfying a predetermined extinction ratio and eye mask requirement of the light emitting device and optical output power characteristics approximated by the drive current linear function, determines the value p such that the approximate errors are equal to each other, or determines a minimum value $|\delta i_{RF0}|_{i=i1 \; or \; i2}$ and a maximum value $|\delta i_{RF0}|_{i=(i1+i2)/2}$ of an approximate error between RF amplitude characteristics for the drive current during the direct modulation satisfying a predetermined extinction ratio and eye mask requirement of the light emitting device and RF amplitude characteristics approximated by the drive current linear function, determines the value p such that the approximate errors are equal to each other, and determines the drive currents $i_{S1}$ and $i_{S2}$ to the drive currents at the measuring points while the internally dividing points are set at the measuring points at that time;
   a forty-third procedure of determining the device temperatures as device temperatures $T_{S1}$ and $T_{S2}$ at the measuring points, the device temperatures internally dividing the operating range $(T_1 \leq T \leq T_2)$ of the specified device temperature T by p:1-p and 1-p:p using the determined value p; and
   a forty-fourth procedure of selecting any three points as the measuring points of the optical output wavelength characteristics, optical output power characteristics, and RF amplitude characteristics during the direct modulation satisfying a predetermined extinction ratio and eye mask from four measuring points $(i_{S1},T_{S1})$, $(i_{S1},T_{S2})$, $(i_{S2},T_{S1})$, and $(i_{S2},T_{S2})$ which are formed by a combination of the determined values.

36. A method of selecting measuring points (drive current and device temperature) of optical output wavelength characteristics, optical output power characteristics, and RF amplitude characteristics during the direct modulation satisfying a predetermined extinction ratio and eye mask requirement of the light emitting device constituting the forty-first means, the optical output wavelength characteristics, optical output power characteristics, and RF amplitude characteristics being stored in the forty-fifth means, in a direct modulation type optical communication light source unit according to claim 29 or 30, the method comprising:

a forty-first procedure of inputting an operating range ($i_1 \leq i \leq i_2$) of separately specified drive current i and an operating range ($T_1 \leq T \leq T_2$) of separately specified device temperature T of the light emitting device;

a forty-fifth procedure of internally dividing the operating range ($T_1 \leq T \leq T_2$) of the specified device temperature T by q:1-q and 1-q:q to determine device temperatures $T_{S1}$ and $T_{S2}$ at an internally dividing point using an arbitrary value q (q is a specific coordinate of an internally dividing point in the operating range of device temperature T of the light emitting device, and q is a real number satisfying 0<q<1), and thereby determines a minimum value $|\delta\lambda_0|_{T=T1 \ or \ T2}$ and a maximum value $|\delta\lambda_0|_{T=(T1+T2)/2}$ of an approximate error between optical output wavelength characteristics for the device temperature during the direct modulation satisfying a predetermined extinction ratio and eye mask requirement of the light emitting device and optical output wavelength characteristics approximated by a device temperature linear function, determines the value q such that the approximate errors are equal to each other, determines a minimum value $|\delta P_0|_{T=T1 \ or \ T2}$ and a maximum value $|\delta P_0|_{T=(T1+T2)/2}$ of an approximate error between optical output power characteristics for the device temperature during the direct modulation satisfying a predetermined extinction ratio and eye mask requirement of the light emitting device and optical output power characteristics approximated by the device temperature linear function, determines the value q such that the approximate errors are equal to each other, or determines a minimum value $|\delta i_{RF0}|_{T=T1 \ or \ T2}$ and a maximum value $|\delta i_{RF0}|_{T=(T1+T2)/2}$ of an approximate error between RF amplitude characteristics for the device temperature during the direct modulation satisfying a predetermined extinction ratio and eye mask requirement of the light emitting device and RF amplitude characteristics approximated by the device temperature linear function, determines the value q such that the approximate errors are equal to each other, and determines the device temperature $T_{S1}$ and $T_{S2}$ to the device temperatures at the measuring points while the internally dividing points are set at the measuring points at that time;

a forty-sixth procedure of determining the drive currents as drive currents $i_{S1}$ and $i_{S2}$ at the measuring points, the drive currents internally dividing the operating range ($i_1 \leq i \leq i_2$) of the specified drive current i by q:1-q and 1-q:q using the determined value q; and a forty-fourth procedure of selecting any three points as the measuring points of the optical output wavelength characteristics, optical output power characteristics, and RF amplitude characteristics during the direct modulation satisfying a predetermined extinction ratio and eye mask requirement from four measuring points ($i_{S1},T_{S1}$), ($i_{S1},T_{S2}$), ($i_{S2},T_{S1}$), and ($i_{S2},T_{S2}$) which are formed by a combination of the determined values.

37. A direct modulation type optical communication light source unit according to claim 31, characterized by further comprising a selection circuit, the selection circuit including:

an input unit to which an operating range ($i_1 \leq i \leq i_2$) of separately specified drive current i and an operating range ($T_1 \leq T \leq T_2$) of separately, specified device temperature T of the light emitting device are inputted;

an internally dividing point drive current determination unit which internally divides the operating range ($i_1 \leq i \leq i_2$) of the specified drive current i of the light emitting device by p:1-p and 1-p:p to determine drive currents $i_{S1}$ and $i_{S2}$ at an internally dividing point using an arbitrary value p (p is a specific coordinate of an internally dividing point in the operating range of the drive current i of the light emitting device, and p is a real number satisfying 0<p<1), and thereby determines minimum value $|\delta\lambda_0|_{i=i1 \ or \ i2}$ and a maximum value $|\delta\lambda_0|_{i=(i1+i2)/2}$ of an approximate error between optical output wavelength characteristics for the drive current during the direct modulation satisfying a predetermined extinction ratio and eye mask requirement of the light emitting device and optical output wavelength characteristics approximated by a drive current linear function, determines the value p such that the approximate errors are equal to each other, determines a minimum value $|\delta P_0|_{i=i1 \ or \ i2}$ and a maximum value $|\delta P_0|_{i=i1 \ or \ i2}$ of an approximate error between optical output power characteristics for the drive current during the direct modulation satisfying a predetermined extinction ratio and eye mask requirement of the light emitting device and optical output power characteristics approximated by the drive current linear function, determines the value p such that the approximate errors are equal to each other, or determines a minimum value $|\delta i_{RF0}|_{i=i1 \ or \ i2}$ and a maximum value $|\delta i_{RF0}|_{i=(i1+i2)/2}$ of an approximate error between RF amplitude characteristics for the drive current during the direct modulation satisfying a predetermined extinction ratio and eye mask requirement of the light emitting device and RF amplitude characteristics approximated by the drive current linear function, determines the value p such that the approximate errors are equal to each other, and determines the drive currents $i_{S1}$ and $i_{S2}$ to the drive currents at the measuring points while the internally dividing points are set at the measuring points at that time;

a device temperature determination unit which determines the device temperatures as device temperatures $T_{S1}$ and $T_{S2}$ at the measuring points, the device temperatures internally dividing the operating range ($T_1 \leq T \leq T_2$) of the specified device temperature T of the light emitting device by p:1-p and 1-p:p using the determined value p; and a measuring point selection unit which selects any three points as the measuring points (drive current and device temperature) of the optical output wavelength characteristics, optical output power characteristics, and RF amplitude characteristics during the direct modulation satisfying a predetermined extinction ratio and eye mask requirement of the light emitting device constituting the forty-first means from four measuring points ($i_{S1},T_{S1}$), ($i_{S1},T_{S2}$), ($i_{S2},T_{S1}$), and ($i_{S2},T_{S2}$) which are formed by a combination of the determined values, the selected three points being stored in the forty-fifth means.

38. A direct modulation type optical communication light source unit according to claim 31, characterized by further comprising a selection circuit, the selection circuit including:

an input unit to which an operating range ($i_1 \leq i \leq i_2$) of separately specified drive current i and an operating range ($T_1 \leq T \leq T_2$) of separately specified device temperature T of the light emitting device are inputted;

an internally dividing point device temperature determination unit which internally divides the operating range ($T_1 \leq T \leq T_2$) of the specified device temperature T by q:1-q and 1-q:q to determine device temperatures $T_{S1}$ and $T_{S2}$ at an internally dividing point using an arbitrary value q (q is a specific coordinate of an internally dividing point in the operating range of device temperature T of the light emitting device, and q is a real number satisfying 0<q<1), and thereby determines a minimum value $|\delta\lambda_0|_{T=T1 \ or \ T2}$ and a maximum value $|\delta\lambda_0|_{T=(T1+T2)/2}$ of an approximate error between optical output wavelength characteristics for the device temperature during the direct modulation satisfying a predetermined extinction ratio and eye mask requirement of the light emitting device and optical output wavelength characteristics approximated by a device temperature linear function, determines the value q such that the approximate errors are equal to each other, determines a minimum value $|\delta P_0|_{T=T1 \ or \ T2}$ and a maximum value $|\delta P_0|_{T=(T1+T2)/2}$ of an approximate error between optical output power characteristics for the device temperature during the direct modulation satisfying a predetermined extinction ratio and eye mask requirement of the light emitting device and optical output power characteristics approximated by the device temperature linear function, determines the value q such that the approximate errors are equal to each other, or determines a minimum value $|\delta i_{RF0}|_{T=T1 \ or \ T2}$ and a maximum value $|\delta i_{RF0}|_{T=(T1+T2)/2}$ of an approximate error between RF amplitude characteristics for the device temperature during the direct modulation satisfying a predetermined extinction ratio and eye mask requirement of the light emitting device and RF amplitude characteristics approximated by the device temperature linear function, determines the value q such that the approximate errors are equal to each other, and determines the device temperature $T_{S1}$ and $T_{S2}$ to the device temperatures at the measuring points while the internally dividing points are set at the measuring points at that time;

a drive current determination unit which determines the drive currents as drive currents $i_{S1}$ and $i_{S2}$ at the measuring points, the drive currents internally dividing the operating range ($i_1 \leq i \leq i_2$) of the specified drive current i by q:1-q and 1-q:q using the determined value q; and a measuring point selection unit which selects any three points as the measuring points (drive current and device temperature) of the optical output wavelength characteristics, optical output power characteristics, and RF amplitude characteristics during the direct modulation satisfying a predetermined extinction ratio and eye mask requirement of the light emitting device constituting the forty-first means from four measuring points ($i_{S1},T_{S1}$), ($i_{S1},T_{S2}$), ($i_{S2},T_{S1}$), and ($i_{S2},T_{S2}$) which are formed by a combination of the determined values, the selected three points being stored in the forty-fifth means.

39. A method of selecting measuring points (drive current and device temperature) of optical output wavelength characteristics, optical output power characteristics, and RF amplitude characteristics, which are stored in the forty-fifth means, during the direct modulation satisfying a predetermined extinction ratio and eye mask requirement of the light emitting device constituting the forty-first means, in a direct modulation type optical communication light source unit according to claim 31, the method characterized by including:

a forty-first procedure of inputting an operating range ($i_1 \leq i \leq i_2$) of separately specified drive current i and an operating range ($T_1 \leq T \leq T_2$) of separately specified device temperature T of the light emitting device;

a forty-second procedure of internally dividing the operating range ($i_1 \leq i \leq i_2$) of the specified drive current i of the light emitting device by p:1-p and 1-p:p to determine drive currents $i_{S1}$ and $i_{S2}$ at an internally dividing point using an arbitrary value p (p is a specific coordinate of an internally dividing point in the operating range of the drive current I of the light emitting device, and p is a real number satisfying 0<p<1), and thereby determines a minimum value $|\delta\lambda_0|_{i=i1 \ or \ i2}$ and a maximum value $|\delta\lambda_0|_{i=(i1+i2)/2}$ of an approximate error between optical output wavelength characteristics for the drive current during the direct modulation satisfying a predetermined extinction ratio and eye mask requirement of the light emitting device and optical output wavelength characteristics approximated by a drive current linear function, determines the value p such that the approximate errors are equal to each other, determines a minimum. value $|\delta P_0|_{i=i1 \ or \ i2}$ and a maximum value $|\delta P_0|_{i=(i+i2)/2}$ of an approximate error between optical output power characteristics for the drive current during the direct modulation satisfying a predetermined extinction ratio and eye mask requirement of the light emitting device and optical output power characteristics approximated by the drive current linear function, determines the value p such that the approximate errors are equal to each other, or determines a minimum value $|\delta i_{RF0}|_{i=i1 \ or \ i2}$ and a maximum value $|\delta i_{RF0}|_{i=(i+i2)/2}$ of an approximate error between RF amplitude characteristics for the drive current during the direct modulation satisfying a predetermined extinction ratio and eye mask requirement of the light emitting device and RF amplitude characteristics approximated by the drive current linear function, determines the value p such that the approximate errors are equal to each other, and determines the drive currents $i_{S1}$ and $i_{S2}$ to the drive currents at the measuring points while the internally dividing points are set at the measuring points at that time;

a forty-third procedure of determining the device temperatures as device temperatures $T_{S1}$ and $T_{S2}$ at the measuring points, the device temperatures internally dividing the operating range ($T_1 \leq T \leq T_2$) of the specified device temperature T by p:1-p and 1-p:p using the determined value p; and a forty-fourth procedure of selecting any three points as the measuring points of the optical output wavelength characteristics, optical output power characteristics, and RF amplitude characteristics during the direct modulation satisfying a predetermined extinction ratio and eye mask requirement from four measuring points ($i_{S1},T_{S1}$), ($i_{S1},T_{S2}$), ($i_{S2},T_{S1}$), and ($i_{S2},T_{S2}$) which are formed by a combination of the determined values.

40. A method of selecting measuring points (drive current and device temperature) of optical output wavelength characteristics, optical output power characteristics, and RF amplitude characteristics, which are stored in the forty-fifth means, during the direct modulation satisfying a predetermined extinction ratio and eye mask requirement of the light emitting device constituting the forty-first means, in a direct modulation type optical communication light source unit according to claim 31, the method comprising:

a forty-first procedure of inputting an operating range ($i_1 \leq i \leq i_2$) of separately specified drive current i and an operating range ($T_1 \leq T \leq T_2$) of separately specified device temperature T of the light emitting device;

a forty-fifth procedure of internally dividing the operating range ($T_1 \leq T \leq T_2$) of the specified device temperature T by q:1-q and 1-q:q to determine device temperatures $T_{S1}$ and $T_{S2}$ at an internally dividing point using an arbitrary value q (q is a specific coordinate of an internally dividing point in the operating range of device temperature T of the light emitting device, and q is a real number satisfying 0<q<1), and thereby determines a minimum value $|\delta\lambda_0|_{T=T1 \ or \ T2}$ and a maximum value $|\delta\lambda_0|_{T=(T1+T2)/2}$ of an approximate error between optical output wavelength characteristics for the device temperature during the direct modulation satisfying a predetermined extinction ratio and eye mask requirement of the light emitting device and optical output wavelength characteristics approximated by a device temperature linear function, determines the value q such that the approximate errors are equal to each other, determines a minimum value $|\delta P_0|_{T=T1 \ or \ T2}$ and a maximum value $|\delta P_0|_{T=(T1+T2)/2}$ of an approximate error between optical output power characteristics for the device temperature during the direct modulation satisfying a predetermined extinction ratio and eye mask requirement of the light emitting device and optical output power characteristics approximated by the device temperature linear function, determines the value q such that the approximate errors are equal to each other, or determines a minimum value $|\delta i_{RF0}|_{T=T1 \ or \ T2}$ and a maximum value $|\delta i_{RF0}|_{T=(T1+T2)/2}$ of an approximate error between RF amplitude characteristics for the device temperature during the direct modulation satisfying a predetermined extinction ratio and eye mask requirement of the light emitting device and RF amplitude characteristics approximated by the device temperature linear function, determines the value q such that the approximate errors are equal to each other, and determines determining the device temperature $T_{S1}$ and $T_{S2}$ to the device temperatures at the measuring points while the internally dividing points are set at the measuring points at that time;

a forty-sixth procedure of determining the drive currents as drive currents $i_{S1}$ and $i_{S2}$ at the measuring points, the drive currents internally dividing the operating range ($i_1 \leq i \leq i_2$) of the specified drive current i by q:1-q and 1-q:q using the determined value q; and a forty-fourth procedure of selecting any three points as the measuring points of the optical output wavelength characteristics, optical output power characteristics, and RF amplitude characteristics during the direct modulation satisfying a predetermined extinction ratio and eye mask requirement from four measuring points ($i_{S1},T_{S1}$), ($i_{S1},T_{S2}$), ($i_{S2},T_{S1}$), and ($i_{S2},T_{S2}$) which are formed by a combination of the determined values.

41. A direct modulation type optical communication light source unit according to claim 32, characterized by further comprising a selection circuit, the selection circuit including:

an input unit to which an operating range ($i_1 \leq i \leq i_2$) of separately specified drive current i and an operating range ($T_1 \leq T \leq T_2$) of separately specified device temperature T of the light emitting device are inputted;

an internally dividing point drive current determination unit which internally divides the operating range ($i_1 \leq i \leq i_2$) of the drive current i by p:1-p and 1-p:p to determine drive currents $i_{S1}$ and $i_{S2}$ at an internally dividing point using an arbitrary value p (p is a specific coordinate of an internally dividing point in the operating range of the specified drive current i, and p is a real number satisfying 0<p<1), and thereby determines a minimum value $|\delta\lambda_0|_{i=i1 \ or \ i2}$ and a maximum value $|\delta\lambda_0|_{i=(i1+i2)/2}$ of an approximate error between optical output wavelength characteristics for the drive current during the direct modulation satisfying a predetermined extinction ratio and eye mask requirement of the light emitting device and optical output wavelength characteristics approximated by a drive current linear function, determines the value p such that the approximate errors are equal to each other, determines a minimum value $|\delta P_0|_{i=i1 \ or \ i2}$ and a maximum value $|\delta P_0|_{i=(i1+i2)/2}$ of an approximate error between optical output power characteristics for the drive current during the direct modulation satisfying a predetermined extinction ratio and eye mask requirement of the light emitting device and optical output power characteristics approximated by the drive current linear function, determines the value p such that the approximate errors are equal to each other, or determines a minimum value $|\delta i_{RF0}|_{i=i1 \ or \ i2}$ and a maximum value $|\delta i_{RF0}|_{i=(i1+i2)/2}$ of an approximate error between RF amplitude characteristics for the drive current during the direct modulation satisfying a predetermined extinction ratio and eye mask requirement of the light emitting device and RF amplitude characteristics approximated by the drive current linear function, determines the value p such that the approximate errors are equal to each other, and determines the drive currents $i_{S1}$ and $i_{S2}$ to the drive currents at the measuring points while the internally dividing points are set at the measuring points at that time;

a device temperature determination unit which determines the device temperatures as device temperatures $T_{S1}$ and $T_{S2}$ at the measuring points, the device temperatures internally dividing the operating range ($T_1 \leq T \leq T_2$) of the specified device temperature T by p:1-p and 1-p:p using the determined value p; and a measuring point selection unit which selects any three points as the measuring points (drive current and device temperature) of the optical output wavelength characteristics, optical output power characteristics, and RF amplitude characteristics during the direct modulation satisfying a predetermined extinction ratio and eye mask requirement of the light emitting device constituting the forty-first means from four measuring points ($i_{S1},T_{S1}$), ($i_{S1},T_{S2}$), ($i_{S2},T_{S1}$), and ($i_{S2},T_{S2}$) which are formed by a combination of the determined values, the selected three points being stored in the forty-fifth means.

42. A direct modulation type optical communication light source unit according to claim 32, characterized by further comprising a selection circuit, the selection circuit including:

an input unit to which an operating range ($i_1 \leq i \leq i_2$) of separately specified drive current i and an operating range ($T_1 \leq T \leq T_2$) of separately specified device temperature T of the light emitting device are inputted;

an internally dividing point device temperature determination unit which internally divides the operating range ($T_1 \leq T \leq T_2$) of the specified device temperature T of the light emitting device by q:1-q and 1-q:q to determine device temperatures $T_{S1}$ and $T_{s2}$ at an internally dividing point using an arbitrary value q (q is a specific coordinate of an internally dividing point in the operating range of device temperature T of the light emitting device, and q is a real number satisfying 0<q<1), and thereby determines a minimum value $|\delta\lambda_0|_{T=T1 \ or \ T2}$ and a maximum value $|\delta\lambda_0|_{T=(T1+T2)/2}$ of an approximate error between optical output wavelength characteristics for the device temperature during the direct modulation satisfying a predetermined extinction ratio and eye mask requirement of the light emitting device and optical output wavelength characteristics approximated by a device temperature linear function, determines the value q such that the approximate errors are equal to each other, determines a minimum value $|\delta P_0|_{T=T1 \ or \ T2}$ and a maximum value $|\delta P_0|_{T=(T1+T2)/2}$ of an approximate error between optical output power characteristics for the device temperature during the direct modulation satisfying a predetermined extinction ratio and eye mask requirement of the light emitting device and optical output power characteristics approximated by the device temperature linear function, determines the value q such that the approximate errors are equal to each other, or determines a minimum value $|\delta i_{RF0}|_{T=T1 \ or \ T2}$ and a maximum value $|\delta i_{RF0}|_{T=(T1+T2)/2}$ of an approximate error between RF amplitude characteristics for the device temperature during the direct modulation satisfying a predetermined extinction ratio and eye mask requirement of the light emitting device and RF amplitude characteristics approximated by the device temperature linear function, determines the value q such that the approximate errors are equal to each other, and determines the device temperature $T_{S1}$ and $T_{S2}$ to the device temperatures at the measuring points while the internally dividing points are set at the measuring points at that time;
a drive current determination unit which determines the drive currents as drive currents $i_{S1}$ and $i_{S2}$ at the measuring points, the drive currents internally dividing the operating range ($i_1 \leq i \leq i_2$) of the specified drive current i by q:1-q and 1-q:q using the determined value q; and
a measuring point selection unit which selects any three points as the measuring points (drive current and device temperature) of the optical output wavelength characteristics, optical output power characteristics, and RF amplitude characteristics during the direct modulation satisfying a predetermined extinction ratio and eye mask requirement of the light emitting device constituting the forty-first means from four measuring points ($i_{S1}, T_{S1}$), ($i_{S1}, T_{S2}$), ($i_{S2}, T_{S1}$), and ($i_{S2}, T_{S2}$) which are formed by a combination of the determined values, the selected three points being stored in the forty-fifth means.

43. A method of selecting measuring points (drive current and device temperature) of optical output wavelength characteristics, optical output power characteristics, and RF amplitude characteristics, which are stored in the forty-fifth means, during the direct modulation satisfying a predetermined extinction ratio and eye mask requirement of the light emitting device constituting the forty-first means, in a direct modulation type optical communication light source unit according to claim 32,
the method characterized by including:
a forty-first procedure of inputting an operating range ($i_1 \leq i \leq i_2$) of separately specified drive current i and an operating range ($T_1 \leq T \leq T_2$) of separately specified device temperature T of the light emitting device;
a forty-second procedure of internally dividing the operating range ($i_1 \leq i \leq i_2$) of the specified drive current i by p:1-p and 1-p:p to determine drive currents $i_{S1}$ and $i_{S2}$ at an internally dividing point using an arbitrary value p (p is a specific coordinate of an internally dividing point in the operating range of the drive current i of the light emitting device, and p is a real number satisfying 0<p<1), and thereby determines a minimum value $|\delta\lambda_0|_{i=i1 \ or \ i2}$ and a maximum value $|\delta\lambda_0|_{i=(i1+i2)/2}$ of an approximate error between optical output wavelength characteristics for the drive current during the direct modulation satisfying a predetermined extinction ratio and eye mask requirement of the light emitting device and optical output wavelength characteristics approximated by a drive current linear function, determines the value p such that the approximate errors are equal to each other, determines a minimum value $|\delta P_0|_{i=i1 \ or \ i2}$ and a maximum value $|\delta P_0|_{i=(i1+i2)/2}$ of an approximate error between optical output power characteristics for the drive current during the direct modulation satisfying a predetermined extinction ratio and eye, mask requirement of the light emitting device and optical output power characteristics approximated by the drive current linear function, determines the value p such that the approximate errors are equal to each other, or determines a minimum value $|\delta i_{RF0}|_{i=i1 \ or \ i2}$ and a maximum value $|\delta i_{RF0}|_{i=(i1+i2)/2}$ of an approximate error between RF amplitude characteristics for the drive current during the direct modulation satisfying a predetermined extinction ratio and eye mask requirement of the light emitting device and RF amplitude characteristics approximated by the drive current linear function, determines the value p such that the approximate errors are equal to each other, and determines the drive currents $i_{S1}$ and $i_{S2}$ to the drive currents at the measuring points while the internally dividing points are set at the measuring points at that time;
a forty-third procedure of determining the device temperatures as device temperatures $T_{S1}$ and $T_{S2}$ at the measuring points, the device temperatures internally dividing the operating range ($T_1 \leq T \leq T_2$) of the specified device temperature T by p:1-p and 1-p:p using the determined value p; and
a forty-fourth procedure of selecting any three points as the measuring points of the optical output wavelength characteristics, optical output power characteristics, and RF amplitude characteristics during the direct modulation satisfying a predetermined extinction ratio and eye mask requirement from four measuring points ($i_{S1}, T_{S1}$), ($i_{S1}, T_{S2}$), ($i_{S2}, T_{S1}$), and ($i_{S2}, T_{S2}$) which are formed by a combination of the determined values.

44. A method of selecting measuring points (drive current and device temperature) of optical output wavelength characteristics, optical output power characteristics, and RF amplitude characteristics, which are stored in the forty-fifth means, during the direct modulation satisfying a predetermined extinction ratio and eye mask requirement of the light emitting device constituting the forty-first means, in a direct modulation type optical communication light source unit according to claim 32,
the method comprising:
a forty-first procedure of inputting an operating range ($i_1 \leq i \leq i_2$) of separately specified drive current i and an operating range ($T_1 \leq T \leq T_2$) of separately specified device temperature T of the light emitting device;
a forty-fifth procedure of internally dividing the operating range ($T_1 \leq T \leq T_2$) of the specified device temperature T by q:1-q and 1-q:q to determine device temperatures $T_{S1}$ and $T_{S2}$ at an internally dividing point using an arbitrary value q (q is a specific coordinate of an internally dividing point in the operating range of device temperature T of the light emitting device, and q is a real number satisfying 0<q<1), and thereby determines a minimum value $|E\lambda_0|_{T=T1\ or\ T2}$ and a maximum value $|\delta\lambda_0|_{T=(T1+T2)/2}$ of an approximate error between optical output wavelength characteristics for the device temperature during the direct modulation satisfying a predetermined extinction ratio and eye mask requirement of the light emitting device and optical output wavelength characteristics approximated by a device temperature linear function, determines the value q such that the approximate errors are equal to each other, determines a minimum value $|\delta P_0|_{T=T1\ or\ T2}$ and a maximum value $|\delta P_0|_{T=(T1+T2)/2}$ of an approximate error between optical output power characteristics for the device temperature during the direct modulation satisfying a predetermined extinction ratio and eye mask requirement of the light emitting device and optical output power characteristics approximated by the device temperature linear function, determines the value q such that the approximate errors are equal to each other, or determines a minimum value $|\delta i_{RF0}|_{T=T1\ or\ T2}$ and a maximum value $|\delta i_{RF0}|_{T=(T1+T2)/2}$ of an approximate error between RF amplitude characteristics for the device temperature during the direct modulation satisfying a predetermined extinction ratio and eye mask requirement of the light emitting device and RF amplitude characteristics approximated by the device temperature linear function, determines the value q such that the approximate errors are equal to each other, and determines the device temperature $T_{S1}$ and $T_{S2}$ to the device temperatures at the measuring points while the internally dividing points are set at the measuring points at that time;

a forty-sixth procedure of determining the drive currents as drive currents $i_{S1}$ and $i_{S2}$ at the measuring points, the drive currents internally dividing the operating range ($i_1 \leq i \leq i_2$) of the specified drive current i by q:1-q and 1-q:q using the determined value q; and a forty-fourth procedure of selecting any three points as the measuring points of the optical output wavelength characteristics, optical output power characteristics, and RF amplitude characteristics during the direct modulation satisfying a predetermined extinction ratio and eye mask requirement of the light emitting device constituting the forty-first means from four measuring points $(i_{S1},T_{S1})$, $(i_{S1},T_{S2})$, $(i_{S2},T_{S1})$, and $(i_{S2},T_{S2})$ which are formed by a combination of the determined values.

45. A direct modulation type optical communication light source unit comprising:

forty-first means which is formed by a plurality of light emitting devices and emits a plurality of light beams;

forty-second means for automatically controlling drive current or optical output power of each light emitting device constituting the forty-first means to maintain the drive current or optical output power at a target value given to each light emitting device;

forty-third means for automatically controlling device temperature of each light emitting device constituting the forty-first means to maintain the device temperature at a target value given to each light emitting device;

forty-fourth means for automatically controlling RF amplitude of each light emitting device constituting the forty-first means to maintain the RF amplitude at a target value given to each light emitting device;

forty-fifth means for storing a first data and a second data, wherein the first data is a set of measurement values of drive current and device temperature and measurement values of optical output wavelength corresponding to these, or a function relating the optical output wavelength to measurement values, of drive current and device temperature and the second data is a set of measurement values of drive current and device temperature and measurement values of optical output power corresponding to these, or a function relating the optical output power to measurement values, of drive current and device temperature, and storing a third data in the forty-fifth means, wherein the third data is a set of measurement values of drive current and device temperature and measurement values of RF amplitude corresponding to those, or a function relating the RF amplitude to measurement values, of drive current and device temperature; and forty-sixth means for determining the drive current and device temperature or the optical output power and device temperature such that both the optical output wavelength and optical output power of each light emitting device become separately specified values from the relationship among the drive current, device temperature, and optical output wavelength of each light emitting device during the direct modulation satisfying a predetermined extinction ratio and eye mask requirement, the relationship being determined by at least one value stored in the forty-fifth means for each light emitting device, and from the relationship among the drive current, device temperature, and optical output power during the direct modulation satisfying the predetermined extinction ratio and eye mask requirement of each light emitting device, the relationship being determined by at least one value stored in the forty-fifth means for each light emitting device, the forty-sixth means also determining the RF amplitude in the determined drive current and device temperature or the determined optical output power and device temperature from relationship among the drive current, device temperature, and RF amplitude in drive current fluctuation during the direct modulation satisfying the predetermined extinction ratio and eye mask requirement, the relationship being determined by at least one value stored in the forty-fifth means for each light emitting device, the direct modulation type optical communication light source unit characterized in that the drive current, device temperature, and RF amplitude or the optical output power, device temperature, and RF amplitude of each light emitting device, which are determined by the forty-sixth means, are given as the target values for each light emitting device in the forty-second means, the forty-third means, and the forty-fourth means respectively.

46. A direct modulation type optical communication light source unit comprising:

forty-first means which are formed by a plurality of light emitting devices and emits a plurality of light beams;

forty-second means for automatically controlling drive current or optical output power of each light emitting device constituting the forty-first means to maintain the drive current or optical output power at a target value given to each light emitting device;

forty-third means for automatically controlling device temperature of each light emitting device constituting the forty-first means to maintain the device temperature at a target value given to each light emitting device;

forty-fourth means for automatically controlling RF amplitude of each light emitting device constituting the forty-first means to maintain the RF amplitude at a target value given to each light emitting device;

forty-fifth means for storing a first data and a second data, wherein the first data is a set of measurement values of drive current and device temperature and measurement values of optical output wavelength corresponding to these, or a function relating the optical output wavelength to measurement values, of drive current and device temperature and the second data is a set of measurement values of drive current and device temperature and measurement values of optical output power corresponding to these, or a function relating the optical output power to measurement values, of drive current and device temperature, and storing a third data in the forty-fifth means, wherein the third data is a set of measurement values of drive current and device temperature and measurement values of RF amplitude corresponding to those, or a function relating the RF amplitude to measurement values, of drive current and device temperature;

forty-seventh means for monitoring the drive current of each light emitting device constituting the forty-first means, making comparison determination whether or not the drive current is located in a separately specified allowable fluctuation range, and predicting the relationship among the drive current, device temperature, and optical output power in drive current fluctuation of each light emitting device from the relationship among the drive current, device temperature, and optical output power during the direct modulation satisfying a predetermined extinction ratio and eye mask requirement of each light emitting device, the relationship being determined by at least one value stored in the forty-fifth means for each light emitting device, for the light emitting device of which the drive current is not located in the allowable fluctuation range, the forty-seventh means also predicting the relationship among the drive current, device temperature, and RF amplitude in the drive current fluctuation of each light emitting device from the relationship among the drive current, device temperature, and RF amplitude during the direct modulation satisfying the predetermined extinction ratio and eye mask requirement of each light emitting device, the relationship being determined by at least one value stored in the forty-fifth means for each light emitting device; and forty-eighth means for predicting the latest drive current and latest device temperature or the latest optical output power and latest device temperature such that both the optical output wavelength and optical output power of each light emitting device become separately specified values during the direct modulation satisfying the predetermined extinction ratio and eye mask requirement in the drive current fluctuation of the light emitting device from the relationship among the drive current, device temperature, and optical output wavelength during the direct modulation satisfying the predetermined extinction ratio and eye mask requirement of each light emitting device during the direct modulation satisfying the predetermined extinction ratio and eye mask requirement, the relationship being determined by at least one value stored in the forty-fifth means for each light emitting device, and from the relationship among the drive current, device temperature, and optical output power in the drive current fluctuation during the direct modulation satisfying the predetermined extinction ratio and eye mask requirement of each light emitting device, the relationship being predicted by the forty-seventh means, the forty-eighth means also predicting the latest RF amplitude in the latest drive current and latest device temperature or the latest optical output power and latest device temperature from relationship among the drive current, device temperature, and RF amplitude in the drive current fluctuation during the direct modulation satisfying the predetermined extinction ratio and eye mask requirement of each light emitting device, the relationship being predicted by the forty-seventh means, when the light emitting device is not located in the allowable fluctuation value the direct modulation type optical communication light source unit characterized in that the latest drive current, device temperature, and RF amplitude or the latest optical output power, device temperature, and RF amplitude of each light emitting device, which are predicted by the forty-eighth means, are given as the target values for each light emitting device i in the forty-second means, the forty-third means, and the forty-fourth means respectively, when the light emitting device is not located in the allowable fluctuation value.

47. A direct modulation type optical communication light source unit according to claim 45 or 46, further comprising forty-ninth means in which the latest values of the target values given to the forty-second means, forty-third means, and forty-fourth means respectively are stored in each light emitting device, the optical communication light source unit characterized in that, when the value stored in the forty-ninth means is used, the latest values of the target values for the forty-second means, forty-third means, and forty-fourth means are read in each light emitting device from the forty-ninth means and given as the target values for each light emitting device in the forty-second means, forty-third means, and forty-fourth means respectively.

48. A direct modulation type optical communication light source unit according to claim 45 or 46, further comprising fiftieth means for monitoring the optical output generated by each light emitting device constituting the forty-first means, making comparison determination whether or not both or one of the optical output wavelength and optical output power of the optical output are located in an optical output wavelength range and an optical output power range which are separately specified for each light emitting device, and outputting the comparison determination result.

49. A direct modulation type optical communication light source unit according to claim 45 or 46, characterized by further comprising a selection circuit, the selection circuit including:

an input unit to which an operating range $(i_1 \leq i \leq i_2)$ of separately specified drive current i and an operating range $(T_1 \leq T \leq T_2)$ of separately specified device temperature T of each light emitting device are inputted;

an internally dividing point drive current determination unit which internally divides the operating range $(i_1 \leq i \leq i_2)$ of the specified drive current i of each light emitting device by p:1-p and 1-p:p to determine drive currents $i_{S1}$ and $i_{S2}$ at an internally dividing point of each light emitting device using an arbitrary value p (p is a specific coordinate of an internally dividing point in the operating range of the drive current i of the light emitting device, and p is a real number satisfying 0<p<1), and thereby determines a minimum value $|\delta\lambda_0|_{i=i1 \ or \ i2}$ and a maximum value $|\delta\lambda_0|_{i=(i1+i2)/2}$ of an approximate error between optical output wavelength characteristics for the drive current during the direct modulation satisfying a predetermined extinction ratio and eye mask requirement of each light emitting device and optical output wavelength characteristics approximated by a drive current linear function, determines the value p such that the approximate errors are equal to each other, determines a minimum value $|\delta P_0|_{i=i1 \text{ or } i2}$ and a maximum value $|\delta P_0|_{i=(i1+i2)/2}$ of an approximate error between optical output power characteristics for the drive current during the direct modulation satisfying a predetermined extinction ratio and eye mask requirement of each light emitting device and optical output power characteristics approximated by the drive current linear function, determines the value p such that the approximate errors are equal to each other, or determines a minimum value $|\delta i_{RF0}|_{i=i1 \text{ or } i2}$ and a maximum value $|\delta i_{RF0}|_{i=(i1+i2)/2}$ of an approximate error between RF amplitude characteristics for the drive current during the direct modulation satisfying a predetermined extinction ratio and eye mask requirement of each light emitting device and RF amplitude characteristics approximated by the drive current linear function, determines the value p such that the approximate errors are equal to each other, and determines the drive currents $i_{S1}$ and $i_{S2}$ to the drive currents at the measuring points of each light emitting device while the internally dividing points of each light emitting device are set at the measuring points at that time;

a device temperature determination unit which determines the device temperatures as device temperatures $T_{S1}$ and $T_{S2}$ at the measuring points of each light emitting device, the device temperatures internally dividing the operating range ($T_1 \leq T \leq T_2$) of the specified device temperature T of each light emitting device by p:1-p and 1-p:p using the determined value p; and a measuring point selection unit which selects any three points as the measuring points (drive current and device temperature) of the optical output wavelength characteristics, optical output power characteristics, and RF amplitude characteristics during the direct modulation satisfying a predetermined extinction ratio and eye mask requirement of each light emitting device constituting the forty-first means from four measuring points ($i_{S1}$, $T_{S1}$), ($i_{S1}$,$T_{S2}$), ($I_{S2}$,$T_{S1}$), and ($i_{S2}$,$T_{S2}$) in each light emitting device which are formed by a combination of the determined values, the selected three points being stored in the forty-fifth means.

50. A direct modulation type optical communication light source unit according to claim 45 or 46, further comprising a selection circuit, the selection circuit comprising:

an input unit to which an operating range ($i_1 \leq i \leq i_2$) of separately specified drive current i and an operating range ($T_1 \leq T \leq T_2$) of separately specified device temperature T of each light emitting device are inputted;

an internally dividing point device temperature determination unit which internally divides the operating range ($T_1 \leq T \leq T_2$) of the specified device temperature T of each light emitting device by q:1-q and 1-q:q to determine device temperatures $T_{S1}$ and $T_{S2}$ at an internally dividing point of each light emitting device using an arbitrary value q (q is a specific coordinate of an internally dividing point in the operating range of device temperature T of the light emitting device, and q is a real number satisfying 0<q<1), and thereby determines a minimum value $|\delta \lambda_0|_{T=T1 \text{ or } T2}$ and a maximum value $|\delta \lambda_0|_{T=(T1+T2)/2}$ of an approximate error between optical output wavelength characteristics for the device temperature during the direct modulation satisfying a predetermined extinction ratio and eye mask requirement of each light emitting device and optical output wavelength characteristics approximated by a device temperature linear function, the determines the value q such that the approximate errors are equal to each other, and determines a minimum value $|\delta P_0|_{T=T1 \text{ or } T2}$ and a maximum value $|\lambda P_0|_{T=(T1+T2)/2}$ of an approximate error between optical output power characteristics for the device temperature during the direct modulation satisfying a predetermined extinction ratio and eye mask requirement of each light emitting device and optical output power characteristics approximated by the device temperature linear function, determines the value q such that the approximate errors are equal to each other, or determines a minimum value $|\delta i_{RF0}|_{T=T1 \text{ or } T2}$ and a maximum value $|\delta i_{RF0}|_{T=(T1+T2)/2}$ of an approximate error between RF amplitude characteristics for the device temperature during the direct modulation satisfying a predetermined extinction ratio and eye mask requirement of each light emitting device and RF amplitude characteristics approximated by the device temperature linear function, determines the value q such that the approximate errors are equal to each other, and determines the device temperatures $T_{S1}$ and $T_{S2}$ to the device temperatures at the measuring points while the internally dividing points of each light emitting device are set at the measuring points at that time;

a drive current determination unit which determines the drive currents as drive currents $i_{S1}$ and $i_{S2}$ at the measuring points, the drive currents internally dividing the operating range ($i_1 \leq i \leq i_2$) of the specified drive current i of each light emitting device by q:1-q and 1-q:q using the determined value q; and a measuring point selection unit which selects any three points as the measuring points (drive current and device temperature) of the optical output wavelength characteristics, optical output power characteristics, and RF amplitude characteristics during the direct modulation satisfying a predetermined extinction ratio and eye mask requirement of each light emitting device constituting the forty-first means from four measuring points ($i_{S1}$, $T_{S1}$), ($i_{S1}$,$T_{S2}$), ($i_{S2}$,$T_{S1}$), and ($i_{S2}$,$T_{S2}$) in each light emitting device which are formed by a combination of the determined values, the selected three points being stored in the forty-fifth means.

51. A direct modulation type optical communication light source unit according to claim 47, characterized by further comprising a selection circuit, the selection circuit including:

an input unit to which an operating range ($i_1 \leq i \leq i_2$) of separately specified drive current i and an operating range ($T_1 \leq T \leq T_2$) of separately specified device temperature T of each light emitting device are inputted;

an internally dividing point drive current determination unit which internally divides the operating range ($i_1 \leq i \leq i_2$) of the specified drive current i of each light emitting device by p:1-p and 1-p:p to determine drive currents $i_{S1}$ and $i_{S2}$ at an internally dividing point using an arbitrary value p (p is a specific coordinate of an internally dividing point in the operating range of the drive current i of each light emitting device, and p is a real number satisfying 0<p<1), and thereby determines a minimum value $|\delta \lambda_0|_{i=i1 \text{ or } i2}$ and a maximum value $|\delta \lambda_0|_{(i1+i2)/2}$ of an approximate error between optical output wavelength characteristics for the drive current during the direct modulation satisfying a predetermined extinction ratio and eye mask requirement of each light emitting device and optical output wavelength characteristics approximated by a drive current linear function, determines the value p such that the approximate errors are equal to each other, determines a minimum value $|\delta P_0|_{i=i1 \text{ or } i2}$ and a maximum value $|\delta P_0|_{i=(i1+i2)/2}$ of an approximate error between optical output power characteristics for the drive current during the direct modulation satisfying a predetermined extinction ratio and eye mask requirement of each light emitting device and optical output power characteristics approximated by the drive current linear function, determines the value p such that the approximate errors are equal to each other, or determines a minimum value $|\delta i_{RF0}|_{i=i1 \text{ or } i2}$ and a maximum value $|\delta i_{RF0}|_{i=(i1+i2)/2}$ of an approximate error between RF amplitude characteristics for the drive current during the direct modulation satisfying a predetermined extinction ratio and eye mask requirement of each light emitting device and RF amplitude characteristics approximated by the drive current linear function, determines the value p such that the approximate errors are equal to each other, and determines the drive currents $i_{S1}$ and $i_{S2}$ to the drive currents at the measuring points while the internally dividing points of each light emitting device are set at the measuring points at that time;

a device temperature determination unit which determines the device temperatures as device temperatures $T_{S1}$ and $T_{S2}$ at the measuring points, the device temperatures internally dividing the operating range $(T_1 \leq T \leq T_2)$ of the specified device temperature T of each light emitting device by p:1-p and 1-p:p using the determined value p; and a measuring point selection unit which selects any three points as the measuring points (drive current and device temperature) of the optical output wavelength characteristics, optical output power characteristics, and RF amplitude characteristics during the direct modulation satisfying a predetermined extinction ratio and eye mask requirement of each light emitting device constituting the forty-first means from four measuring points $(i_{S1}, T_{S1}), (i_{S1}, T_{S2}), (i_{S2}, T_{S1})$, and $(i_{S2}, T_{S2})$ in each light emitting device which are formed by a combination of the determined values, the selected three points being stored in the forty-fifth means.

52. A direct modulation type optical communication light source unit according to claim 51, further comprising a selection circuit, the selection circuit comprising:

an input unit to which an operating range $(i_1 \leq i \leq i_2)$ of separately specified drive current i and an operating range $(T_1 \leq T \leq T_2)$ of separately specified device temperature T of each light emitting device are inputted;

an internally dividing point device temperature determination unit which internally divides the operating range $(T_1 \leq T \leq T_2)$ of the specified device temperature T of each light emitting device by q:1-q and 1-q:q to determine device temperatures $T_{S1}$ and $T_{S2}$ at an internally dividing point using an arbitrary value q (q is a specific coordinate of an internally dividing point in the operating range of device temperature T of each light emitting device, and q is a real number satisfying 0q<1), and thereby determines a minimum value $|\delta\lambda_0|_{T=T1 \text{ or } T2}$ and a maximum value $|\delta\lambda_0|_{T=(T1+T2)/2}$ of an approximate error between optical output wavelength characteristics for the device temperature during the direct modulation satisfying a predetermined extinction ratio and eye mask requirement of each light emitting device and optical output wavelength characteristics approximated by a device temperature linear function, determines the value q such that the approximate errors are equal to each other, determines a minimum value $|\delta P_0|_{T=T1 \text{ or } T2}$ and a maximum value $|\delta P_0|_{T=(T1+T2)/2}$ of an approximate error between optical output power characteristics for the device temperature during the direct modulation satisfying a predetermined extinction ratio and eye mask of each light emitting device and optical output power characteristics approximated by the device temperature linear function, determines the value q such that the approximate errors are equal to each other, or determines a minimum value $|\delta i_{RF0}|_{T=T1 \text{ or } T2}$ and a maximum value $|\delta i_{RF0}|_{T=(T1+T2)/2}$ of an approximate error between RF amplitude characteristics for the drive current during the direct modulation satisfying a predetermined extinction ratio and eye mask requirement of each light emitting device and RF amplitude characteristics approximated by the device temperature linear function, determines the value q such that the approximate errors are equal to each other, and determines the device temperatures $T_{S1}$ and $T_{S2}$ to the device temperatures at the measuring points while the internally dividing points of each light emitting device are set at the measuring points at that time;

a drive current determination unit which determines the drive currents as drive currents $i_{S1}$ and $i_{S2}$ at the measuring points, the drive currents internally dividing the operating range $(i_1 \leq i \leq i_2)$ of the specified drive current i of each light emitting device by q:1-q and 1-q:q using the determined value q; and a measuring point selection unit which selects any three points as the measuring points (drive current and device temperature) of the optical output wavelength characteristics, optical output power characteristics, and RF amplitude characteristics during the direct modulation satisfying a predetermined extinction ratio and eye mask requirement of each light emitting device constituting the forty-first means from four measuring points $(i_{S1}, T_{S1}), (i_{S1}, T_{S2}), (i_{S2}, T_{S1})$, and $(i_{S2}, T_{S2})$ in each light emitting device which are formed by a combination of the determined values, the selected three points being stored in the forty-fifth means.

53. A direct modulation type optical communication light source unit according to claim 48, characterized by further comprising a selection circuit, the selection circuit including:

an input unit to which an operating range $(i_1 \leq i \leq i_2)$ of separately specified drive current i and an operating range $(T_1 \leq T \leq T_2)$ of separately specified device temperature T of each light emitting device are inputted;

an internally dividing point drive current determination unit which internally divides the operating range $(i_1 \leq i \leq i_2)$ of the specified drive current i of each light emitting device by p:1-p and 1-p:p to determine drive currents $i_{S1}$ and $i_{S2}$ at an internally dividing point using an arbitrary value p (p is a specific coordinate of an internally dividing point in the operating range of the drive current i of each light emitting device, and p is a real number satisfying 0<p<1), and thereby determines a minimum value $|\delta\lambda_0|_{i=i1 \text{ or } i2}$ and a maximum value $|\delta\lambda_0|_{i=(i1+i2)/2}$ of an approximate error between optical output wavelength characteristics for the drive current during the direct modulation satisfying a predetermined extinction ratio and eye mask requirement of each light emitting device and optical output wavelength characteristics approximated by a drive current linear function, determines the value p such that the approximate errors are equal to each other, determines a minimum value $|\delta P_0|_{i=i1 \text{ or } i2}$ and a maximum value $|\delta P_0|_{i=(i1+i2)/2}$ of an approximate error between optical output power characteristics for the drive current during the direct modulation satisfying a predetermined extinction ratio and eye mask requirement of each light emitting device and optical output power characteristics approximated by the drive current linear function, determines the value p such that the approximate errors are equal to each other, or determines a minimum value $|\delta i_{RF0}|_{i=i1\ or\ i2}$ and a maximum value $|\delta i_{RF0}|_{i=(i1+i2)/2}$ of an approximate error between RF amplitude characteristics for the drive current during the direct modulation satisfying a predetermined extinction ratio and eye mask requirement of each light emitting device and RF amplitude characteristics approximated by the drive current linear function, determines the value p such that the approximate errors are equal to each other, and determines the drive currents $i_{S1}$, and $i_{S2}$ to the drive currents at the measuring points while the internally dividing points of each light emitting device are set at the measuring points at that time;

a device temperature determination Unit which determines the device temperatures as device temperatures $T_{S1}$ and $T_{S2}$ at the measuring points of each light emitting device, the device temperatures internally dividing the operating range ($T_1 \leq T \leq T_2$) of the specified device temperature T of each light emitting device by p:1-p and 1-p:p using the determined value p; and a measuring point selection unit which selects any three points as the measuring points (drive current and device temperature) of the optical output wavelength characteristics, optical output power characteristics, and RF amplitude characteristics during the direct modulation satisfying a predetermined extinction ratio and eye mask requirement of each light emitting device constituting the forty-first means from four measuring points ($i_{S1}$, $T_{S1}$), ($i_{S1}, T_{S2}$), ($i_{S2}, T_{S1}$), and ($i_{S2}, T_{S2}$) in each light emitting device which are formed by a combination of the determined values, the selected three points being stored in the forty-fifth means.

54. A direct modulation type optical communication light source unit according to claim 48, further comprising a selection circuit, the selection circuit comprising:

an input unit to which an operating range ($i_1 \leq i \leq i_2$) of separately specified drive current i and an operating range ($T_1 \leq T \leq T_2$) of separately specified device temperature T of each light emitting device are inputted;

an internally dividing point device temperature determination unit which internally divides the operating range ($T_1 \leq T \leq T_2$) of the specified device temperature T of each light emitting device by q:1-q and 1-q:q to determine device temperatures $T_{S1}$ and $T_{S2}$ at an internally dividing point using an arbitrary value q (q is a specific coordinate of an internally dividing point in the operating range of device temperature T of each light emitting device, and q is a real number satisfying 0<q<1), and thereby determines a minimum value $|\delta\lambda_0|_{T=T1\ or\ T2}$ and a maximum value $|\delta\lambda_0|_{T=(T1+T2)/2}$ of an approximate error between optical output wavelength characteristics for the device temperature during the direct modulation satisfying a predetermined extinction ratio and eye mask requirement of each light emitting device and optical output wavelength characteristics approximated by a device temperature linear function, determines the value q such that the approximate errors are equal to each other, determines a minimum value $|\delta P_0|_{T=T1\ or\ T2}$ and a maximum value $|\delta P_0|_{T=(T1+T2)/2}$ of an approximate error between optical output power characteristics for the device temperature during the direct modulation satisfying a predetermined extinction ratio and eye mask requirement of each light emitting device and optical output power characteristics approximated by the device temperature linear function, determines the value q such that the approximate errors are equal to each other, or determines a minimum value $|\delta i_{RF0}|_{i=i1\ or\ i2}$ and a maximum value $|\delta i_{RF0}|_{i=(i1+i2)/2}$ of an approximate error between RF amplitude characteristics for the device temperature during the direct modulation satisfying a predetermined extinction ratio and eye mask requirement of each light emitting device and RF amplitude characteristics approximated by the device temperature linear function, determines the value q such that the approximate errors are equal to each other, and determines the device temperature $T_{S1}$ and $T_{S2}$ to the device temperatures at the measuring points while the internally dividing points of each light emitting device are set at the measuring points at that time;

a drive current determination unit which determines the drive currents as drive currents $i_{S1}$ and $i_{S2}$ at the measuring points, the drive currents internally dividing the operating range ($i_1 \leq i \leq i_2$) of the specified drive current i of each light emitting device by q:1-q and 1-q:q using the determined value q; and a measuring point selection unit which selects any three points as the measuring points (drive current and device temperature) of the optical output wavelength characteristics, optical output power characteristics, and RF amplitude characteristics during the direct modulation satisfying a predetermined extinction ratio and eye mask requirement of each light emitting device constituting the forty-first means from four measuring points ($i_{S1}$, $T_{S1}$), ($i_{S1}, T_{S2}$), ($i_{S2}, T_{S1}$), and ($i_{S2}, T_{S2}$) in each light emitting device which are formed by a combination of the determined values, the selected three points being stored in the forty-fifth means.

55. A method of selecting measuring points (drive current and device temperature) of optical output wavelength characteristics, optical output power characteristics, and RF amplitude characteristics, which are stored in the forty-fifth means, during the direct modulation satisfying a predetermined extinction ratio and eye mask requirement of each light emitting device constituting the forty-first means, in a direct modulation type optical communication light source unit according to claim 45 or 46, the method characterized by including:

a forty-first procedure of inputting an operating range ($i_1 \leq i \leq i_2$) of separately specified drive current i and an operating range ($T_1 \leq T \leq T_2$) of separately specified device temperature T of each light emitting device;

a forty-second procedure of internally dividing the operating range ($i_1 \leq i \leq i_2$) of the drive current i of each light emitting device by p:1-p and 1-p:p to determine drive currents $i_{S1}$ and $i_{S2}$ at an internally dividing point of each light emitting device using an arbitrary value p (p is a specific coordinate of an internally dividing point in the operating range of the drive current i of each light emitting device, and p is a real number satisfying 0<q<1), and thereby determines a minimum value $|\delta\lambda_0|_{i=i1\ or\ i2}$ and a maximum value $|\delta\lambda_0|_{i=(i1+i2)/2}$ of an approximate error between optical output wavelength characteristics for the drive current during the direct modulation satisfying a predetermined extinction ratio and eye mask requirement of each light emitting device and optical output wavelength characteristics approximated by a drive current linear function, determines the value p such that the approximate errors are equal to each other, determines a minimum value $|\delta P_0|_{i=i1\ or\ i2}$ and a maximum value $|\delta P_0|_{i=(i1+i2)/2}$ of an approximate error between optical output power characteristics for the drive current during the direct modulation satisfying a predetermined extinction ratio and eye mask requirement of each light emitting device and optical output power characteristics approximated by the drive current linear function, determines the value p such that the approximate errors are equal to each other, or determines a minimum value $|\delta i_{RF0}|_{i=i1\ or\ i2}$ and a maximum value $|\delta i_{RF0}|_{i=(i1+i2)/2}$ of an approximate error between RF amplitude characteristics for the drive current during the direct modulation satisfying a predetermined extinction ratio and eye mask requirement of each light emitting device and RF amplitude characteristics approximated by the device temperature linear function, determines the value p such that the approximate errors are equal to each other, and determines the drive currents $i_{S1}$ and $i_{S2}$ to the drive currents at the measuring points while the internally dividing points of each light emitting device in each light emitting device are set at the measuring points at that time;

a forty-third procedure of determining the device temperatures as device temperatures $T_{S1}$ and $T_{S2}$ at the measuring points in each light emitting device, the device temperatures internally dividing the operating range $(T_1 \leq T \leq T_2)$ of the specified device temperature T of each light emitting device by p:1-p and 1-p:p using the determined value p; and a forty-fourth procedure of selecting three points as the measuring points of the optical output wavelength characteristics, optical output power characteristics, and RF amplitude characteristics during the direct modulation satisfying a predetermined extinction ratio and eye mask requirement of from four measuring points $((i_{S1},T_{S1})$, $(i_{S1},T_{S2})$, $(i_{S2},T_{S1})$, and $(i_{S2},T_{S2})$ in each light emitting device which are formed by a combination of the determined values.

56. A method of selecting measuring points (drive current and device temperature) of optical output wavelength characteristics, optical output power characteristics, and RF amplitude characteristics, which are stored in the forty-fifth means, during the direct modulation satisfying a predetermined extinction ratio and eye mask requirement of each light emitting device constituting the forty-first means, in a direct modulation type optical communication light source unit according to claim 45 or 46, the method further comprising:

a forty-first procedure of inputting an operating range $(i_1 \leq i \leq i_2)$ of separately specified drive current i and an operating range $(T_1 \leq T \leq T_2)$ of separately specified device temperature T of each light emitting device;

a forty-fifth procedure of internally dividing the operating range $(T_1 \leq T \leq T_2)$) of the specified device temperature T of each light emitting device by q:1-q and 1-q:q to determine device temperatures $T_{S1}$ and $T_{S2}$ at an internally dividing point using an arbitrary value q (q is a specific coordinate of an internally dividing point in the operating range of device temperature T of the light emitting device, and q is a real number satisfying 0<q<1), and thereby determines a minimum value $|\delta\lambda_0|_{T=T1\ or\ T2}$ and a maximum value $|\delta\lambda_0|_{T=(T1+T2)/2}$ of an approximate error between optical output wavelength characteristics for the device temperature during the direct modulation satisfying a predetermined extinction ratio and eye mask requirement of each light emitting device and optical output wavelength characteristics approximated by a device temperature linear function, determines the value q such that the approximate errors are equal to each other, determines a minimum value $|\delta P_0|_{T=T1\ or\ T2}$ and a maximum value $|\delta P_0|_{T=(T1+T2)/2}$ of an approximate error between optical output power characteristics for the device temperature during the direct modulation satisfying a predetermined extinction ratio and eye mask requirement of each light emitting device and optical output power characteristics approximated by the device temperature linear function, determines the value q such that the approximate errors are equal to each other, or determines a minimum value $|\delta i_{RF0}|_{T=T1\ or\ T2}$ and a maximum value $|\delta i_{RF0}|_{T=(T1+T2)/2}$ of an approximate error between RF amplitude characteristics for the device temperature during the direct modulation satisfying a predetermined extinction ratio and eye mask requirement of each light emitting device and RF amplitude characteristics approximated by the device temperature linear function, determines the value q such that the approximate errors are equal to each other, and determines the device temperature $T_{S1}$ and $T_{S2}$ to the device temperatures at the measuring points while the internally dividing points of each light emitting device are set at the measuring points at that time;

a forty-sixth procedure of determining the drive currents as drive currents $i_{S1}$ and $i_{S2}$ at the measuring points in each light emitting device, the drive currents internally dividing the operating range $(i_1 \leq i \leq i_2)$ of the specified drive current i of each light emitting device by q:1-q and 1-q:q using the determined value q; and a forty-fourth procedure of selecting three points as the measuring points (drive current and device temperature) of the optical output wavelength characteristics, optical output power characteristics, and RF amplitude characteristics during the direct modulation satisfying a predetermined extinction ratio and eye mask requirement of each light emitting device constituting the forty-first means from four measuring points $(i_{S1},T_{S1})$, $(i_{S1},T_{S2})$, $(i_{S2},T_{S1})$, and $(i_{S2},T_{S2})$ of each light emitting device which are formed by a combination of the determined values.

57. A method of selecting measuring points (drive current and device temperature) of optical output wavelength characteristics, optical output power characteristics, and RF amplitude characteristics, which are stored in the forty-fifth means, during the direct modulation satisfying a predetermined extinction ratio and eye mask requirement of each light emitting device constituting the forty-first means, in a direct modulation type optical communication light source unit according to claim 47, the method characterized by including:

a forty-first procedure of inputting an operating range $(i_1 \leq i \leq i_2)$ of separately specified drive current i and an operating range $(T_1 \leq T \leq T_2)$ of separately specified device temperature T of each light emitting device;

a forty-second procedure of internally dividing the operating range $(i_1 \leq i \leq i_2)$ of the specified drive current i of each light emitting device by p:1-p and 1-p:p to determine drive currents $i_{S1}$ and $i_{S2}$ at an internally dividing point of each light emitting device using an arbitrary value p (p is a specific coordinate of an internally dividing point in the operating range of the drive current i of each light emitting device, and p is a real number satisfying 0<p<1), and thereby determines a minimum value $|\delta\lambda_0|_{i=i1\ or\ i2}$ and a maximum value $|\delta\lambda_0|_{i=(i1+i2)/2}$ of an approximate error between optical output wavelength characteristics for the drive current during the direct modulation satisfying a predetermined extinction ratio and eye mask requirement of each light emitting device and optical output wavelength characteristics approximated by a drive current linear function, determines the value p such that the approximate errors are equal to each other, determines a minimum value $|\delta P_0|_{i=i1\ or\ i2}$ and a maximum value $|\delta P_0|_{i=i1+i2)/2}$ of an approximate error between optical output power characteristics for the drive current during the direct modulation satisfying a predetermined extinction ratio and eye mask requirement of each light emitting device and optical output power characteristics approximated by the drive current linear function, determines the value p such that the approximate errors are equal to each other, or determines a minimum value $|\delta i_{RF0}|_{i=i1 \ or \ i2}$ and a maximum value $|\delta i_{RF0}|_{i=(i1+i2)/2}$ of an approximate error between RF amplitude characteristics for the drive current during the direct modulation satisfying a predetermined extinction ratio and eye mask requirement of each light emitting device and RF amplitude characteristics approximated by the drive current linear function, determines the value p such that the approximate errors are equal to each other, and determines the drive currents $i_{S1}$ and $i_{S2}$ to the drive currents at the measuring points while the internally dividing points of each light emitting device are set at the measuring points at that time;

a forty-third procedure of determining the device temperatures as device temperatures $T_{S1}$ and $T_{S2}$ at the measuring points in each light emitting device, the device temperatures internally dividing the operating range $(T_1 \leq T \leq T_2)$ of the specified device temperature T of each light emitting device by p:1-p and 1-p:p using the determined value p; and a forty-fourth procedure of selecting three points as the measuring points of the optical output wavelength characteristics, optical output power characteristics, and RF amplitude characteristics during the direct modulation satisfying a predetermined extinction ratio and eye mask requirement from four measuring points $(i_{S1}, T_{S1})$, $(i_{S1}, T_{S2})$, $(i_{S2}, T_{S1})$, and $(i_{S2}, T_{S2})$ in each light emitting device which are formed by a combination of the determined values.

58. A method of selecting measuring points (drive current and device temperature) of optical output wavelength characteristics, optical output power characteristics, and RF amplitude characteristics, which are stored in the forty-fifth means, during the direct modulation satisfying a predetermined extinction ratio and eye mask requirement of each light emitting device constituting the forty-first means, in a direct modulation type optical communication light source unit according to claim 47, the method further comprising:

a forty-first procedure of inputting an operating range $(i_1 \leq i \leq i_2)$ of separately specified drive current i and an operating range $(T_1 \leq T \leq T_2)$ of separately specified device temperature T of each light emitting device;

a forty-fifth procedure of internally dividing the operating range $((T_1 \leq T \leq T_2)$ of the specified device temperature T of each light emitting device by q:1-q and 1-q:q to determine device temperatures $T_{S1}$ and $T_{S2}$ at an internally dividing point using an arbitrary value q (q is a specific coordinate of an internally dividing point in the operating range of device temperature T of each light emitting device, and q is a real number satisfy 0<q<1), and thereby determines a minimum value $|\delta\lambda_0|_{T=T1 \ or \ T2}$ and a maximum value $|\delta\lambda_0|_{T=T1+T2)/2}$ of an approximate error between optical output wavelength characteristics for the device temperature during the direct modulation satisfying a predetermined extinction ratio and eye mask requirement of each light emitting device and optical output wavelength characteristics approximated by a device temperature linear function, determines the value q such that the approximate errors are equal to each other, determines a minimum value $|\delta P_0|_{T=T1 \ or \ T2}$ and a maximum value $|\delta P_0|_{T=(T1+T2)/2}$ of an approximate error between optical output at an internally dividing point using an arbitrary value p (p is a specific coordinate of an internally dividing point in the operating range of the drive current i of each light emitting device, and p is a real number satisfying 0<p<1), and thereby determines a minimum value $|\delta\lambda_0|_{i=i1 \ or \ i2}$ and a maximum value $|\delta_0|_{i=(i1+i2)/2}$ of an approximate error between optical output wavelength characteristics for the drive current during the direct modulation satisfying a predetermined extinction ratio and eye mask requirement of each light emitting device and optical output wavelength characteristics approximated by a drive current linear function, determines the value p such that the approximate errors are equal to each other, determines a minimum value $|\delta P_0|_{i=i1 \ or \ i2}$ and a maximum value $|\delta P_0|_{i=(i1+i2)/2}$ of an approximate error between optical output power characteristics for the drive current during the direct modulation satisfying a predetermined extinction ratio and eye mask requirement of each light emitting device and optical output power characteristics approximated by the drive current linear function, determines the value p such that the approximate errors are equal to each other, or determines a minimum value $|\delta i_{RF0}|_{i=i1 \ or \ i2}$ and a maximum value $|\delta i_{RF0}|_{i=(i1+i2)/2}$ of an approximate error between RF amplitude characteristics for the drive current during the direct modulation satisfying a predetermined extinction ratio and eye mask requirement of each light emitting device and RF amplitude characteristics approximated by the drive current linear function, determines the value p such that the approximate errors are equal to each other, and determines the drive currents $i_{S1}$ and $i_{S2}$ to the drive currents at the measuring points while the internally dividing points of each light emitting device are set at the measuring points at that time;

a forty-third procedure of determining the device temperatures as device temperatures $T_{S1}$ and $T_{S2}$ at the measuring points in each light emitting device, the device temperatures internally dividing the operating range $(T_1 \leq T \leq T_2)$ of the specified device temperature T of each light emitting device by p:1-p and 1-p:p using the determined value p; and a forty-fourth procedure of selecting three points as the measuring points of the optical output wavelength characteristics, optical output power characteristics, and RF amplitude characteristics during the direct modulation satisfying a predetermined extinction ratio and eye mask requirement from four measuring points $(i_{S1}, T_{S1})$, $(i_{S1}, T_{S2})$, $(i_{S2}, T_{S1})$, and $(i_{S2}, T_{S2})$ in each light emitting device which are formed by a combination of the determined values.

59. A method of selecting measuring points (drive current and device temperature) of optical output wavelength characteristics, optical output power characteristics, and RF amplitude characteristics, which are stored in the forty-fifth means, during the direct modulation satisfying a predetermined extinction ratio and eye mask requirement of each light emitting device constituting the forty-first means, in a direct modulation type optical communication light source unit according to claim 48, the method characterized by including:

a forty-first procedure of inputting an operating range $(i_1 \leq i \leq i_2)$ of separately specified drive current i and an operating range $(T_1 \leq T \leq T_2)$ of separately specified device temperature T of each light emitting device;

a forty-second procedure of internally dividing the operating range $(i_1 \leq i \leq i_2)$ of the specified drive current i of each light emitting device by p:1-p and 1-p:p to determine drive currents $i_{S1}$ and $i_{S2}$ light emitting device constituting the forty-first means, in a direct modulation type optical communication light source unit according to claim 48, the method further comprising:

a forty-first procedure of inputting an operating range ($i_1 \leq i \leq i_2$) of separately specified drive current i and an operating range ($T_1 \leq T \leq T_2$) of separately specified device temperature T of each light emitting device;

a forty-fifth procedure of internally dividing the operating range ($T_1 \leq T \leq T_2$) of the device temperature T of each light emitting device by q:1-q and 1-q:q to determine device temperatures $T_{S1}$ and $T_{S2}$ at an internally dividing point using an arbitrary value q (q is a specific coordinate of an internally dividing point in the operating range of device temperature T of each light emitting device, and q is a real number satisfying 0<q<1), and thereby determines a minimum value $|\delta\lambda_0|_{T=T1 \text{ or } T2}$ and a maximum value $|\delta\lambda_0|_{T=(T1+T2)/2}$ of an approximate error between optical output wavelength characteristics for the device temperature during the direct modulation satisfying a predetermined extinction ratio and eye mask requirement of each light emitting device and optical output wavelength characteristics approximated by a device temperature linear function, determines the value q such that the approximate errors are equal to each other, determines a minimum value $|\delta P_0|_{T=T1 \text{ or } T2}$ and a maximum value $|\delta P_0|_{T=(T1+T2)/2}$ of an approximate error between optical output power characteristics for the device temperature during the direct modulation satisfying a predetermined extinction ratio and eye mask requirement of each light emitting device and optical output power characteristics approximated by the device temperature linear function, determines the value q such that the approximate errors are equal to each other, or determines a minimum value $|\delta i_{RF0}|_{T=T1 \text{ or } T2}$ and a maximum value $|\delta i_{RF0}|_{T=(T1+T2)/2}$ of an approximate error between RF amplitude characteristics for the drive current during the direct modulation satisfying a predetermined extinction ratio and eye mask requirement of each light emitting device and RF amplitude characteristics approximated by the device temperature linear function, determines the value q such that the approximate errors are equal to each other, and determines the device temperature $T_{S1}$ and $T_{S2}$ to the device temperatures at the measuring points while the internally dividing points of each light emitting device are set at the measuring points at that time;

a forty-sixth procedure of determining the drive currents as drive currents $i_{S1}$ and $i_{S2}$ at the measuring points in each light emitting device, the drive currents internally dividing the operating range ($i_1 \leq i \leq i_2$) of the specified drive current i of each light emitting device by q:1-q and 1-q:q using the determined value q; and a forty-fourth procedure of selecting three points as the measuring points of the optical output wavelength characteristics, optical output power characteristics, and RF amplitude characteristics during the direct modulation satisfying a predetermined extinction ratio and eye mask requirement from four measuring points ($i_{S1},T_{S1}$), ($i_{S1},T_{S2}$), ($i_{S2},T_{S1}$), and ($i_{S2},T_{S2}$) in each light emitting device which are formed by a combination of the determined values.

60. A method of selecting measuring points (drive current and device temperature) of optical output wavelength characteristics, optical output power characteristics, and RF amplitude characteristics, which are stored in the forty-fifth means, during the direct modulation satisfying a predetermined extinction ratio and eye mask requirement of each power characteristics for the device temperature during the direct modulation satisfying a predetermined extinction ratio and eye mask requirement of each light emitting device and optical output power characteristics approximated by the device temperature linear function, determines the value q such that the approximate errors are equal to each other, or determines a minimum value $|\delta i_{RF0}|_{T=T1 \text{ or } T2}$ and a maximum value $|\delta i_{RF0}|_{T=(T1+T2)/2}$ of an approximate error between RF amplitude characteristics for the device temperature during the direct modulation satisfying a predetermined extinction ratio and eye mask requirement of each light emitting device and RF amplitude characteristics approximated by the device temperature linear function, determines the value q such that the approximate errors are equal to each other, and determines the device temperature $T_{S1}$ and $T_{S2}$ to the device temperatures at the measuring points while the internally dividing points of each light emitting device are set at the measuring points at that time;

a forty-sixth procedure of determining the drive currents as drive currents $i_{S1}$ and $i_{S2}$ at the measuring points in each light emitting device, the drive currents internally dividing the operating range ($i_1 \leq i \leq i_2$) of the specified drive current i of each light emitting device by q:1-q and 1-q:q using the determined value q; and a forty-fourth procedure of selecting three points as the measuring points of the optical output wavelength characteristics, optical output power characteristics, and RF amplitude characteristics during the direct modulation satisfying a predetermined extinction ratio and eye mask requirement from four measuring points ($i_{S1},T_{S1}$), ($i_{S1},T_{S2}$), ($i_{S2},T_{S1}$), and ($i_{S2},T_{S2}$) in each light emitting device which are formed by a combination of the determined values.

* * * * *